(12) United States Patent
Hatakeyama

(10) Patent No.: US 9,164,392 B2
(45) Date of Patent: Oct. 20, 2015

(54) DEVELOPER AND PATTERNING PROCESS

(71) Applicant: SHIN-ETSU CHEMICAL CO., LTD., Tokyo (JP)

(72) Inventor: Jun Hatakeyama, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 14/193,193

(22) Filed: Feb. 28, 2014

(65) Prior Publication Data

US 2014/0315131 A1   Oct. 23, 2014

(30) Foreign Application Priority Data

Apr. 10, 2013   (JP) ................. 2013-081848

(51) Int. Cl.
*G03F 7/32* (2006.01)
(52) U.S. Cl.
CPC ........................... *G03F 7/322* (2013.01)
(58) Field of Classification Search
CPC .................................. G03F 7/32; G03F 7/322
USPC ................. 430/331, 296, 325, 942, 945
See application file for complete search history.

(56) References Cited

U.S. PATENT DOCUMENTS

| | | | |
|---|---|---|---|
| 6,403,289 B1 * | 6/2002 | Tanaka et al. | 430/329 |
| 6,448,420 B1 | 9/2002 | Kinsho et al. | |
| 6,746,817 B2 | 6/2004 | Takeda et al. | |
| 7,482,108 B2 | 1/2009 | Matsumaru et al. | |
| 7,537,880 B2 | 5/2009 | Harada et al. | |
| 7,598,016 B2 | 10/2009 | Kobayashi et al. | |
| 2007/0003883 A1 * | 1/2007 | Sato | 430/434 |
| 2008/0090172 A1 | 4/2008 | Hatakeyama et al. | |

FOREIGN PATENT DOCUMENTS

| | | |
|---|---|---|
| EP | 0 473 547 A1 | 3/1992 |
| JP | 4-230645 A | 8/1992 |
| JP | 2005-84365 A | 3/2005 |
| JP | 2006-45311 A | 2/2006 |
| JP | 2006-169302 A | 6/2006 |
| JP | 3865048 B2 | 1/2007 |
| JP | 2008-111103 A | 5/2008 |
| JP | 2008-122932 A | 5/2008 |
| JP | 2008-239918 A | 10/2008 |
| JP | 4771974 B2 | 9/2011 |
| JP | 4900603 B2 | 3/2012 |

* cited by examiner

*Primary Examiner* — Christopher Young
(74) *Attorney, Agent, or Firm* — Westerman, Hattori, Daniels & Adrian, LLP

(57) ABSTRACT

An aqueous solution containing 0.1-20 wt % of a benzyltrialkylammonium hydroxide is a useful developer for photosensitive resist materials. When an exposed resist film is developed in the developer, any swell of the resist film during development is suppressed. A resist pattern with minimal edge roughness can be formed while preventing pattern collapse or bridge defect formation.

10 Claims, No Drawings

DEVELOPER AND PATTERNING PROCESS

CROSS-REFERENCE TO RELATED APPLICATION

This non-provisional application claims priority under 35 U.S.C. §119(a) on Patent Application No. 2013-081848 filed in Japan on Apr. 10, 2013, the entire contents of which are hereby incorporated by reference.

TECHNICAL FIELD

This invention relates to a developer in the form of an aqueous solution containing a benzyltrialkylammonium hydroxide and a patterning process using the same.

BACKGROUND ART

To meet the demand for higher integration density and operating speed of LSIs, the effort to reduce the pattern rule is in rapid progress. The wide-spreading flash memory market and the demand for increased storage capacities drive forward the miniaturization technology. As the advanced miniaturization technology, manufacturing of microelectronic devices at the 65-nm node by the ArF lithography has been implemented in a mass scale. Manufacturing of 45-nm node devices by the next generation ArF immersion lithography is approaching to the verge of high-volume application. The candidates for the next generation 32-nm node include ultra-high NA lens immersion lithography using a liquid having a higher refractive index than water in combination with a high refractive index lens and a high refractive index resist film, extreme ultraviolet (EUV) lithography of 13.5 nm wavelength, and double patterning version of the ArF lithography, on which active research efforts have been made.

With respect to high-energy radiation of very short wavelength such as electron beam (EB) or x-ray, hydrocarbons and similar light elements used in resist materials have little absorption. Then polyhydroxystyrene base resist materials are under consideration. Resist materials for EB lithography are practically used in the mask image writing application. Recently, the mask manufacturing technology becomes of greater interest. Reduction projection exposure systems or steppers have been used since the time when the exposure light was g-line. While their demagnification factor was 1/5, a factor of 1/4 is now used as a result of chip size enlargement and projection lens diameter increase. It becomes of concern that a dimensional error of a mask has an impact on the dimensional variation of a pattern on wafer. It is pointed out that as the pattern feature is reduced, the value of a dimensional variation on the wafer becomes greater than the value of a dimensional error of the mask. This is evaluated by a mask error enhancement factor (MEEF) which is a dimensional variation on wafer divided by a dimensional error of mask. Patterns on the order of 45 nm often show an MEEF in excess of 4. In a situation including a demagnification factor of 1/4 and a MEEF of 4, the mask manufacture needs an accuracy substantially equivalent to that for equi-magnification masks.

The exposure system for mask manufacturing made a transition from the laser beam exposure system to the EB exposure system to increase the accuracy of line width. Since a further size reduction becomes possible by increasing the accelerating voltage of the electron gun in the EB exposure system, the accelerating voltage increased from 10 keV to 30 keV and reached 50 keV in the current mainstream system. A voltage of 100 keV is now under investigation.

As the accelerating voltage increases, a lowering of sensitivity of resist film becomes of concern. As the accelerating voltage increases, the influence of forward scattering in a resist film becomes so reduced that the contrast of electron image writing energy is improved to ameliorate resolution and dimensional control whereas electrons can pass straightforward through the resist film so that the resist film becomes less sensitive. Since the mask exposure tool is designed for exposure by direct continuous writing, a lowering of sensitivity of resist film leads to an undesirably reduced throughput. Due to a need for higher sensitivity, chemically amplified resist compositions are contemplated.

Thinning of resist film is in progress to facilitate reduction of pattern feature in the EB lithography for mask manufacturing and to prevent the pattern from collapsing due to a higher aspect ratio during development. In the case of photolithography, a thinning of resist film greatly contributes to resolution improvement. This is because introduction of chemical mechanical polishing (CMP) or the like has driven forward device planarization. In the case of mask manufacture, substrates are flat, and the thickness of processable substrates (e.g., Cr, MoSi or $SiO_2$) is predetermined by a percent light shield or phase shift control. The dry etch resistance of resist film must be improved before the film can be reduced in thickness.

It is generally believed that there is a correlation between the carbon density and the dry etch resistance of resist film. For EB writing which is not affected by absorption, resist materials based on novolac resins having better etch resistance have been developed. Indene copolymers described in Patent Document 1 and acenaphthylene copolymers described in Patent Document 2 are expected to have improved etch resistance due to a high carbon density and a robust main chain structure based on cycloolefin structure.

Also, with respect to the soft x-ray (EUV) lithography at wavelength 5-20 nm, the reduced absorption of carbon atoms was reported. Increasing the carbon density is effective not only for improving dry etch resistance, but also for increasing the transmittance in the soft x-ray wavelength region.

As the feature size is reduced, image blurs due to acid diffusion become a problem. To insure resolution for fine patterns with a size of 45 nm et seq., not only an improvement in dissolution contrast is requisite, but control of acid diffusion is also important, as known from previous reports. Since chemically amplified resist compositions are designed such that sensitivity and contrast are enhanced by acid diffusion, an attempt to minimize acid diffusion by reducing the temperature and/or time of post-exposure baking (PEB) fails, resulting in drastic reductions of sensitivity and contrast. Since the distance of acid diffusion is closely related to the type of acid labile group, it would be desirable to have an acid labile group which permits deprotection reaction to proceed at a very short distance of acid diffusion.

A tradeoff among sensitivity, edge roughness and resolution is reported. Increasing sensitivity leads to reductions of edge roughness and resolution. Controlling acid diffusion improves resolution at the sacrifice of edge roughness and sensitivity. Addition of an acid generator capable of generating a bulky acid is effective for suppressing acid diffusion, but leads to reductions of edge roughness and sensitivity as pointed out above. It is then proposed to copolymerize a polymer with an acid generator in the form of an onium salt having polymerizable olefin. Patent Documents 3 to 5 disclose sulfonium salts having polymerizable olefin capable of generating a sulfonic acid and similar iodonium salts. A photoresist using a base polymer having a polymerizable acid generator copolymerized therein exhibits reduced edge roughness due to controlled acid diffusion and uniform dispersion of acid generator within the polymer, succeeding in improving both resolution and edge roughness at the same time.

One serious problem in the EUV lithography is pattern collapse. It is believed in the art that pattern collapse is caused by swell in the developer. For the purpose of reducing swell in tetramethylammonium hydroxide (TMAH) aqueous solution, it is contemplated to use tetrabutylammonium hydroxide (TBAH) aqueous solution as the developer. Since this developer is still insufficient in forming patterns with a feature size of 16 nm or less, there is a need to have a developer capable of preventing swell.

CITATION LIST

Patent Document 1: JP 3865048
Patent Document 2: JP-A 2006-169302
Patent Document 3: JP-A H04-230645
Patent Document 4: JP-A 2005-084365
Patent Document 5: JP-A 2006-045311
Patent Document 6: JP 4771974
Patent Document 7: JP 4900603

DISCLOSURE OF INVENTION

An object of the present invention is to provide a developer which is used in developing an exposed resist coating to form a resist pattern with minimal edge roughness while preventing pattern collapse or formation of bridge defects between pattern features after development; and a pattern forming process using the developer.

The inventor has found that an aqueous solution of a benzyltrialkylammonium hydroxide is effective for the development of a chemically amplified positive resist composition comprising a polymer adapted to accelerate alkaline dissolution under the action of acid as a base resin.

In one aspect, the invention provides a developer for photosensitive resist materials comprising an aqueous solution containing 0.1 to 20% by weight of a substituted or unsubstituted benzyltrialkylammonium hydroxide.

In a preferred embodiment, the benzyltrialkylammonium hydroxide has the general formula (1):

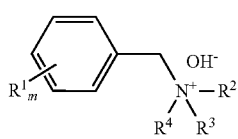

(1)

wherein $R^1$ is hydrogen, hydroxyl, a straight, branched or cyclic $C_1$-$C_6$ alkyl, alkoxy, acyl, acyloxy or alkoxycarbonyl group, a $C_2$-$C_8$ alkenyl or alkynyl group, phenyl or halogen, $R^2$ to $R^4$ are each independently a straight or branched $C_1$-$C_6$ alkyl group, and m is an integer of 1 to 5. Typically, the benzyltrialkylammonium hydroxide is benzyltrimethylammonium hydroxide, benzyltriethylammonium hydroxide, benzyltripropylammonium hydroxide, or benzyltributylammonium hydroxide.

Also preferably, the developer further comprises 0.0001 to 5% by weight of an acetylene alcohol having the general formula (AA-1):

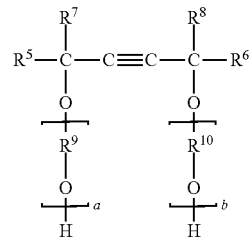

(AA-1)

wherein $R^5$ to $R^8$ are each independently $C_1$-$C_{20}$ alkyl, $R^9$ and $R^{10}$ are each independently $C_1$-$C_{10}$ alkylene, a and b are such integers that the sum a+b is 0 to 60.

In another aspect, the invention provides a pattern forming process comprising the steps of providing a chemically amplified positive resist composition adapted to increase an alkali dissolution rate under the action of acid, and developing the resist composition in an aqueous solution containing a substituted or unsubstituted benzyltrialkylammonium hydroxide according to the invention.

In a preferred embodiment, the chemically amplified positive resist composition comprises a polymer comprising recurring units having an acid labile group and recurring units having a hydroxyl and/or lactone ring adhesive group as a base resin.

More preferably, the polymer has a weight average molecular weight of 1,000 to 500,000, and the recurring units having an acid labile group are recurring units of at least one type selected from recurring units (a1) and (a2) having a carboxyl and/or phenolic hydroxyl group substituted with an acid labile group, as represented by the general formula (2).

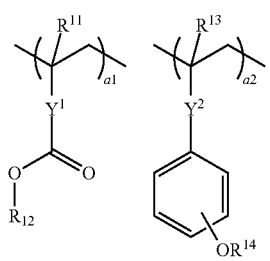

(2)

Herein $R^{11}$ and $R^{13}$ are each independently hydrogen or methyl, $R^{12}$ and $R^{14}$ each are an acid labile group, $Y^1$ is a single bond, a divalent $C_1$-$C_{12}$ linking group having at least one of ester, lactone ring, phenylene and naphthylene, a phenylene group or a naphthylene group, $Y^2$ is a single bond, ester group or amide group, subscripts a1 and a2 are numbers in the range: $0 \leq a1 \leq 0.9$, $0 \leq a2 \leq 0.9$, and $0 < a1+a2 < 1.0$.

More preferably, the polymer further comprises recurring units of at least one type selected from sulfonium salt units (b1) to (b3), as represented by the general formula (3).

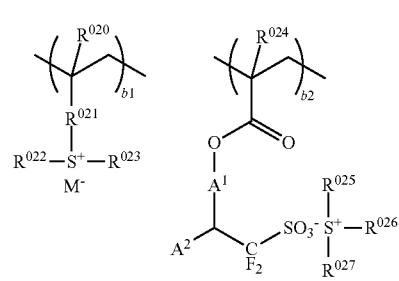

(3)

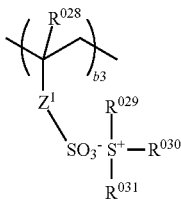

Herein $R^{020}$, $R^{024}$, and $R^{028}$ each are hydrogen or methyl, $R^{021}$ is a single bond, phenylene, —O—$R^{033}$—, or —C(=O)—Y—$R^{033}$—, Y is oxygen or NH, $R^{033}$ is a straight, branched or cyclic $C_1$-$C_6$ alkylene group, alkenylene group or phenylene group, which may contain a carbonyl (—CO—), ester (—COO—), ether (—O—), or hydroxyl moiety, $R^{022}$, $R^{023}$, $R^{025}$, $R^{026}$, $R^{027}$, $R^{029}$, $R^{030}$, and $R^{031}$ are each independently a straight, branched or cyclic $C_1$-$C_{12}$ alkyl group which may contain a carbonyl, ester or ether moiety, a $C_6$-$C_{12}$ aryl group, a $C_7$-$C_{20}$ aralkyl group, or a thiophenyl group, $A^1$ is a single bond, -$A^0$-C(=O)—O—, -$A^0$-O— or -$A^0$-O—C(=O)—, $A^0$ is a straight, branched or cyclic $C_1$-$C_{12}$ alkylene group which may contain a carbonyl, ester or ether moiety, $A^2$ is hydrogen, $CF_3$ or carbonyl, $Z^1$ is a single bond, methylene, ethylene, phenylene, fluorinated phenylene, —O—$R^{032}$—, or —C(=O)—$Z^2$—$R^{032}$—, $Z^2$ is oxygen or NH, $R^{032}$ is a straight, branched or cyclic $C_1$-$C_6$ alkylene, phenylene, fluorinated phenylene, trifluoromethyl-substituted phenylene or alkenylene group, which may contain a carbonyl, ester, ether or hydroxyl moiety, M⁻ is a non-nucleophilic counter ion, subscripts b1, b2 and b3 are numbers in the range: 0≤b1≤0.3, 0≤b2≤0.3, 0≤b3≤0.3, and 0<b1+b2+b3≤0.3.

Typically, the resist composition further comprises at least one of an organic solvent, basic compound, dissolution regulator, and surfactant.

Specifically, the pattern forming process is defined as comprising the steps of applying the resist composition onto a substrate to form a coating, baking, exposing the coating to high-energy radiation, and developing the exposed coating in the developer of the invention. Typically, the high-energy radiation is KrF excimer laser of wavelength 248 nm, ArF excimer laser of wavelength 193 nm, EB, or soft x-ray of wavelength 3 to 15 nm.

Advantageous Effects of Invention

When an exposed resist film is developed in the developer of the invention, any swell of the resist film during development is suppressed. Thus a resist pattern with minimal edge roughness can be formed while preventing pattern collapse or bridge defect formation.

DESCRIPTION OF EMBODIMENTS

The singular forms "a," "an" and "the" include plural referents unless the context clearly dictates otherwise. "Optional" or "optionally" means that the subsequently described event or circumstances may or may not occur, and that description includes instances where the event or circumstance occurs and instances where it does not. The terminology "$C_x$-$C_y$," as applied to a particular unit, such as, for example, a chemical substituent group, means having a carbon atom content of from "x" carbon atoms to "y" carbon atoms per such unit.

The abbreviations have the following meaning.
EB: electron beam
EUV: extreme ultraviolet
PAG: photoacid generator
PEB: post-exposure bake
LWR: line width roughness
Mw: weight average molecular weight
Mn: number average molecular weight
Mw/Mn: dispersity or average molecular weight distribution
GPC: gel permeation chromatography The inventor has found that when an aqueous solution containing 0.1 to 20% by weight of a benzyltrialkylammonium hydroxide is applied as the developer to a positive resist composition comprising a base polymer adapted to accelerate alkaline dissolution under the action of acid, pattern collapse or bridge defect formation during development is suppressed.

Specifically, in one aspect of the invention, an aqueous solution containing 0.1 to 20% by weight of a benzyltrialkylammonium hydroxide having the general formula (1) is applied as the developer to a chemically amplified positive resist composition comprising a polymer adapted to accelerate alkaline dissolution under the action of acid as base resin.

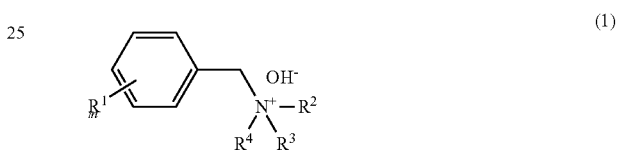

(1)

Herein $R^1$ is hydrogen, hydroxyl, a straight, branched or cyclic $C_1$-$C_6$ alkyl, alkoxy, acyl, acyloxy or alkoxycarbonyl group, a $C_2$-$C_8$ alkenyl or alkynyl group, phenyl or halogen, $R^2$ to $R^4$ are each independently a straight or branched $C_1$-$C_6$ alkyl group, and m is an integer of 1 to 5.

Illustrative, non-limiting examples of the benzyltrialkylammonium hydroxide having formula (1) are given below.

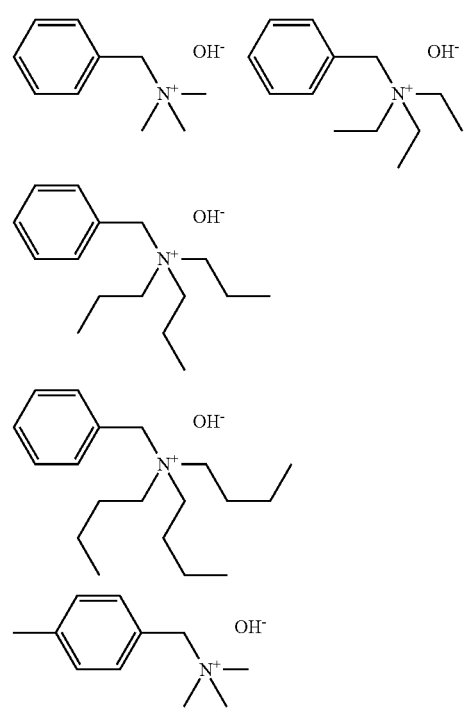

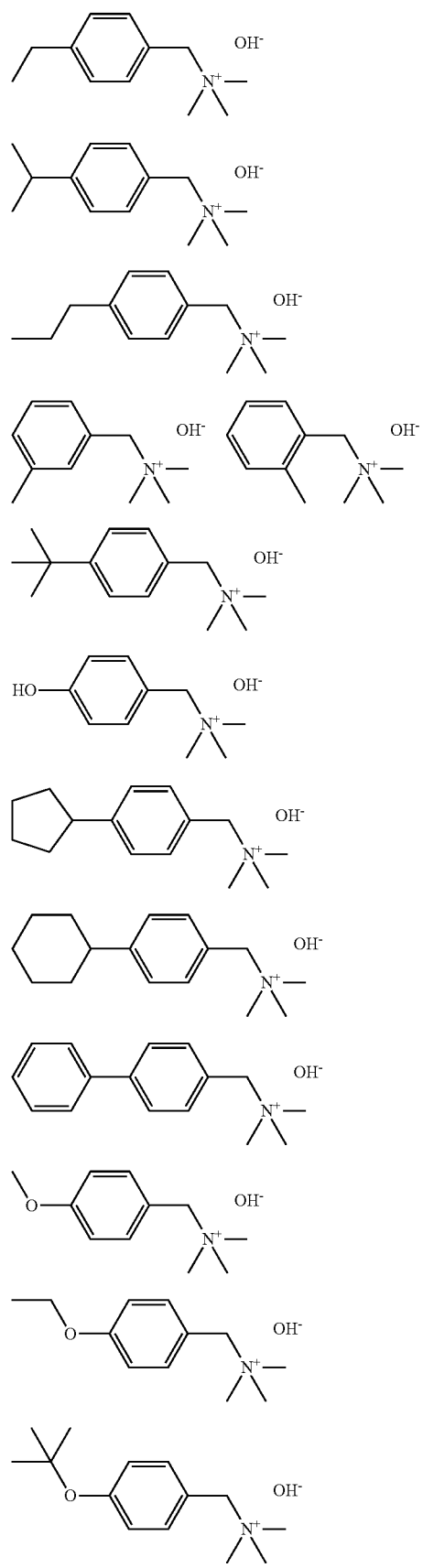
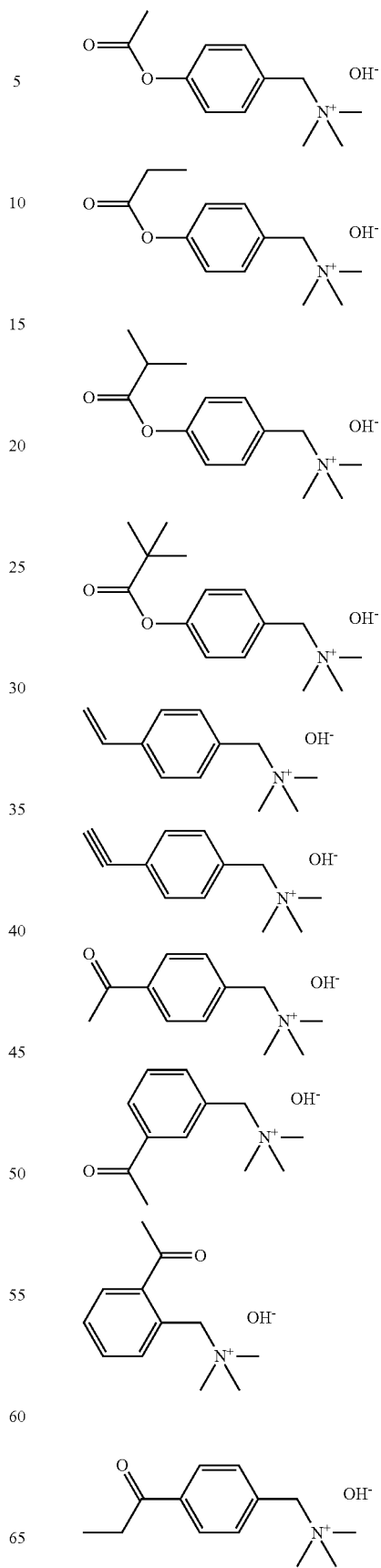

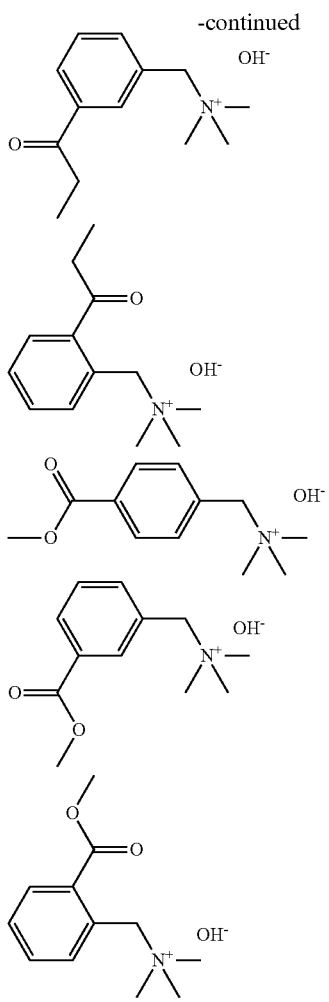

Of these, benzyltrimethylammonium hydroxide, benzyltriethylammonium hydroxide, benzyltripropylammonium hydroxide, and benzyltributylammonium hydroxide are most preferred.

In general, tetramethylammonium hydroxide (TMAH) is used as the aqueous alkaline developer. While potassium hydroxide was used as the developer in the past, the alkali metal was found to have adverse impact on device operation. Since then, quaternary ammonium hydroxy salts have been used. Besides the TMAH, suitable quaternary ammonium salts include tetraethylammonium hydroxide (TEAH), tetrapropylammonium hydroxide (TPAH), tetrabutylammonium hydroxide (TBAH), tetrapentylammonium hydroxide, tributylmethylammonium hydroxide, trimethylhydroxyethylammonium hydroxide (also known as "choline"), tetraethanolammonium hydroxide, and methyltriethanolammonium hydroxide.

While TMAH aqueous solutions are most often used as the developer, they suffer from pattern collapse due to swell when applied to polymethacrylate-based resist materials adapted to generate carboxylic acid after deprotection. For this reason, tetrabutylammonium hydroxide (TBAH) having a longer alkyl chain is under study. As the alkyl chain length increases, the molecular weight increases. As a result, the extent of penetration of the developer into a resist film is reduced, for thereby minimizing swell of the resist film and mitigating pattern collapse. However, if it is desired to form fine line patterns with a size of 20 nm or less, the pattern collapse problem cannot be fully overcome even when the TBAH developer is used.

When an aqueous solution of a benzyltrialkylammonium hydroxide is used as the developer, the swell of a resist film in the developer is mitigated as compared with the use of tetraalkylammonium hydroxides. Thus pattern collapse and bridge defects are suppressed. The concentration of benzyltrialkylammonium hydroxide in the aqueous solution is 0.1 to 20% by weight, preferably 0.1 to 10%, more preferably 0.5 to 8%, and even more preferably 1.0 to 6% by weight.

In addition to the benzyltrialkylammonium hydroxide, the aqueous solution may further contain 0.0001 to 5% by weight of an acetylene alcohol having the general formula (AA-1):

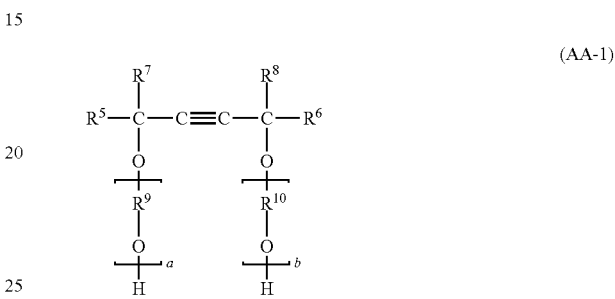

wherein $R^5$ to $R^8$ are each independently $C_1$-$C_{20}$ alkyl, $R^9$ and $R^{10}$ are each independently $C_1$-$C_{10}$ alkylene, a and b are such integers that the sum a+b ranges from 0 to 60.

The acetylene alcohol is commercially available, for example, as Surfynol 104 series and 400 series from Nissin Chemical Co., Ltd.

The concentration of acetylene alcohol in the aqueous solution is 0.0001 to 5% by weight, preferably 0.001 to 3% by weight, and more preferably 0.01 to 1% by weight. The acetylene alcohol has both functions of defoaming and surface activation. If micro-bubbles are present in the developer, those portions of the resist surface in contact with micro-bubbles are not developed, resulting in development defects. A defoamer is necessary to eliminate micro-bubbles. Since water has a high surface tension, the resist surface is hardly wetted. The surface tension must be reduced in order that the resist surface be readily wetted. Addition of a surfactant is effective in this sense. The addition of a common surfactant is effective for reducing surface tension, but facilitates foaming. It is an acetylene alcohol that is effective for reducing surface tension and suppressing foaming.

Resist Material

The photoresist material used in the pattern forming process of the invention is a chemically amplified positive resist composition, typically comprising a polymer comprising recurring units having an acid labile group as a base resin. In a preferred embodiment, the polymer comprises recurring units (a1) and/or (a2) having a carboxyl and/or phenolic hydroxyl group whose hydrogen atom is substituted by an acid labile group, as represented by the general formula (2).

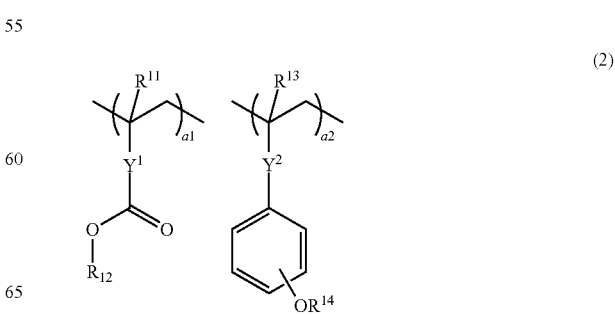

Herein $R^{11}$ and $R^{13}$ are each independently hydrogen or methyl, $R^{12}$ and $R^{14}$ each are an acid labile group, $Y^1$ is a single bond, a divalent $C_1$-$C_{12}$ linking group having at least one of ester, lactone ring, phenylene and naphthylene, a phenylene group or a naphthylene group, $Y^2$ is a single bond, ester group or amide group, a1 and a2 are numbers in the range: $0 \le a1 \le 0.9$, $0 \le a2 \le 0.9$, and $0 < a1+a2 < 1.0$.

Of the recurring units in the polymer, those recurring units having an acid labile group, represented by recurring units (a1) in formula (2) are units having a carboxyl group whose hydrogen atom is substituted by an acid labile group, specifically the hydrogen atom of hydroxyl of (meth)acrylate is substituted by an acid labile group. Examples of the monomer from which recurring units (a1) are derived are shown below.

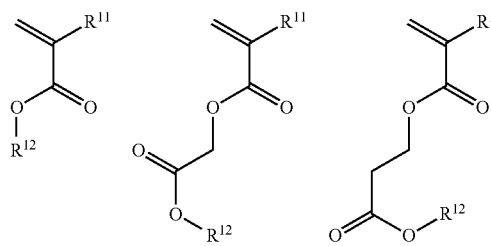

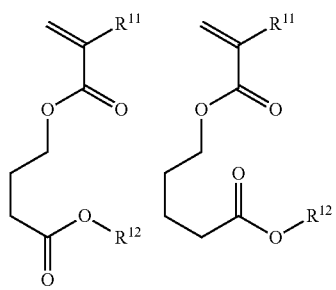

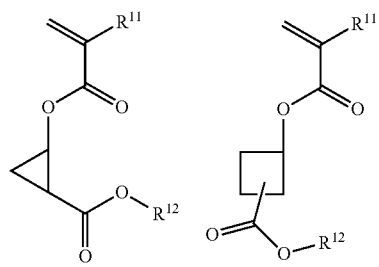

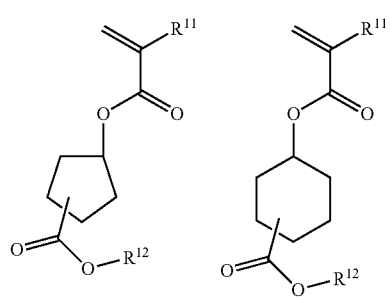

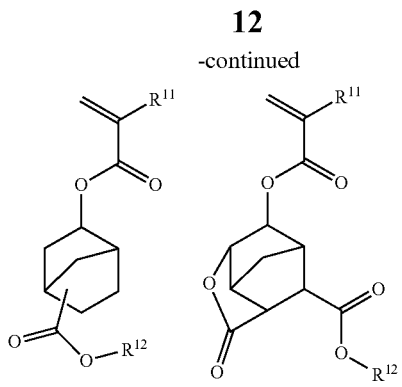

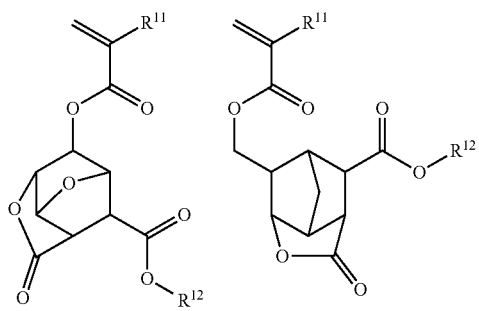

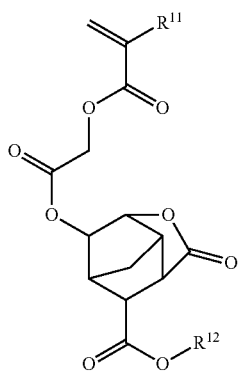

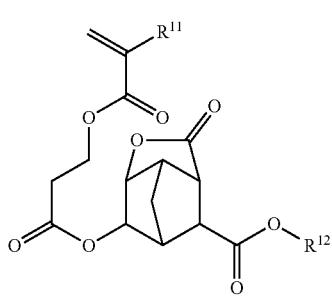

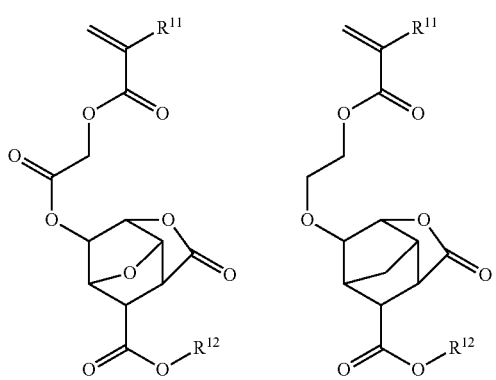

-continued

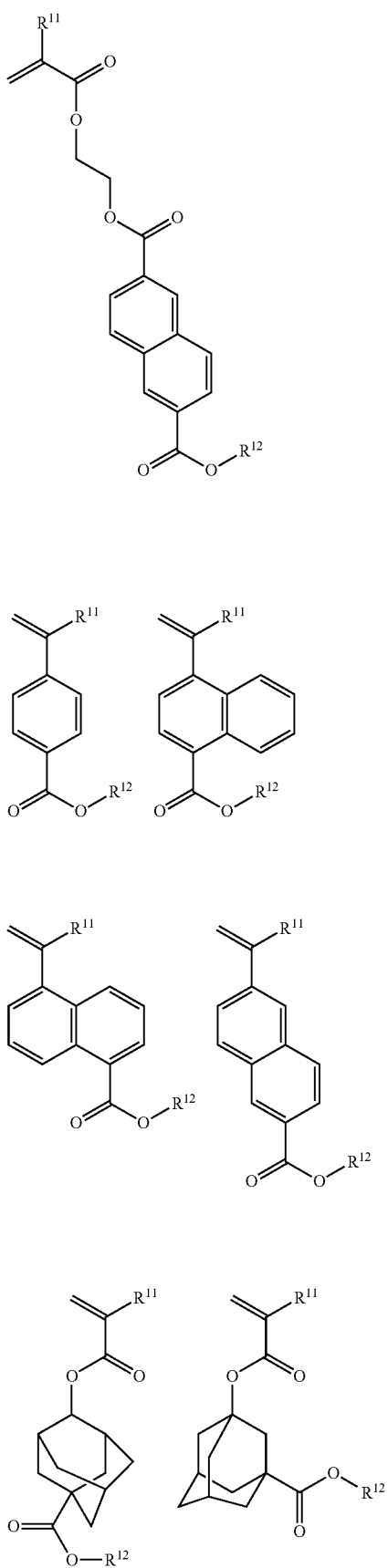

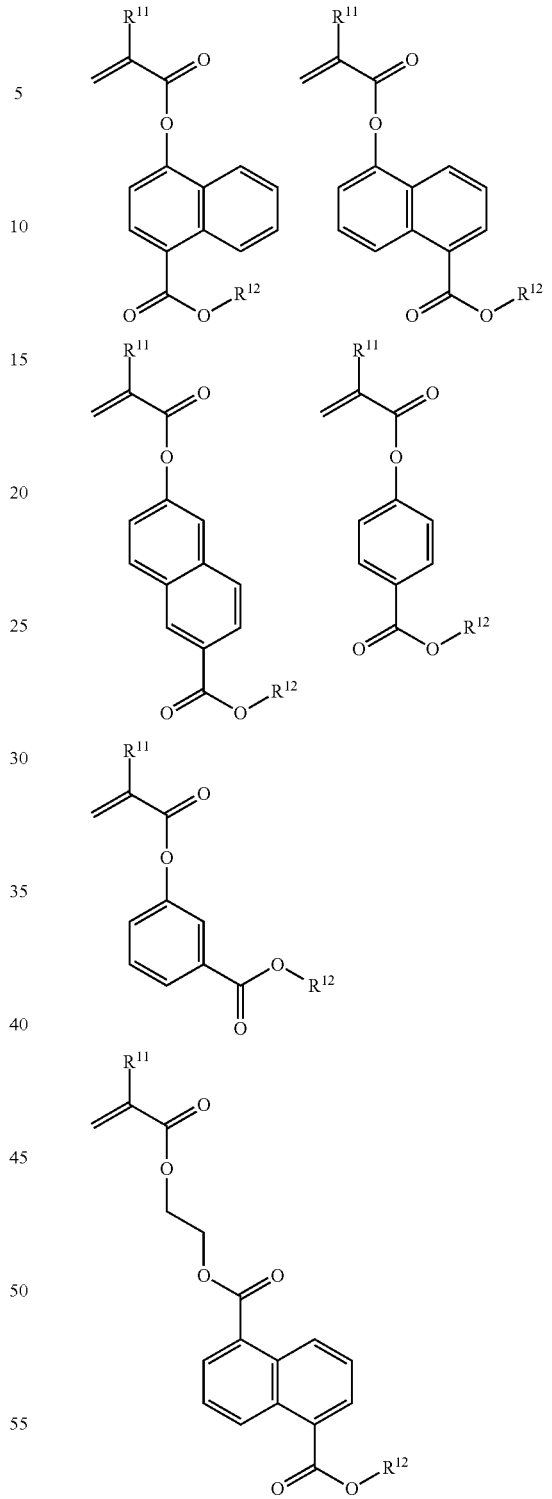

Herein $R^{11}$ is hydrogen or methyl, and $R^{12}$ is an acid labile group.

Those recurring units having an acid labile group, represented by recurring units (a2) in formula (2) are units having a phenolic hydroxyl group whose hydrogen atom is substituted by an acid labile group, preferably the hydrogen atom of hydroxyl of hydroxystyrene or hydroxyphenyl (meth)acrylate is substituted by an acid labile group. Examples of the monomer from which recurring units (a2) are derived are shown below.

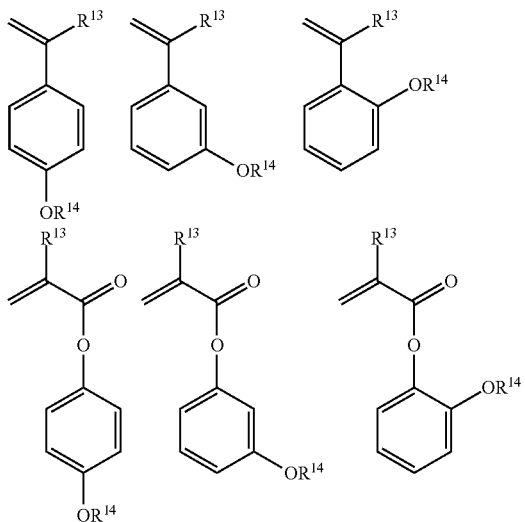

Herein $R^{13}$ is hydrogen or methyl, and $R^{14}$ is an acid labile group.

The acid labile groups represented by $R^{12}$ and $R^{14}$ in formula (2) may be selected from a variety of such groups. The acid labile groups may be the same or different and preferably include groups of the following formulae (A-1) to (A-3).

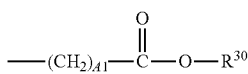 (A-1)

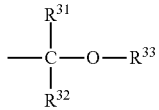 (A-2)

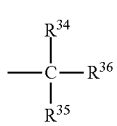 (A-3)

In formula (A-1), $R^{30}$ is a tertiary alkyl group of 4 to 20 carbon atoms, preferably 4 to 15 carbon atoms, a trialkylsilyl group in which each alkyl moiety has 1 to 6 carbon atoms, an oxoalkyl group of 4 to 20 carbon atoms, or a group of formula (A-3). Exemplary tertiary alkyl groups are tert-butyl, tert-amyl, 1,1-diethylpropyl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, and 2-methyl-2-adamantyl. Exemplary trialkylsilyl groups are trimethylsilyl, triethylsilyl, and dimethyl-tert-butylsilyl. Exemplary oxoalkyl groups are 3-oxocyclohexyl, 4-methyl-2-oxooxan-4-yl, and 5-methyl-2-oxooxolan-5-yl. Letter A1 is an integer of 0 to 6.

In formula (A-2), $R^{31}$ and $R^{32}$ each are hydrogen or a straight, branched or cyclic alkyl group of 1 to 18 carbon atoms, preferably 1 to 10 carbon atoms. Exemplary alkyl groups include methyl, ethyl, propyl, isopropyl, n-butyl, sec-butyl, tert-butyl, cyclopentyl, cyclohexyl, 2-ethylhexyl, and n-octyl. $R^{33}$ is a monovalent hydrocarbon group of 1 to 18 carbon atoms, preferably 1 to 10 carbon atoms, which may contain a heteroatom such as oxygen, examples of which include straight, branched or cyclic alkyl groups and substituted forms of such alkyl groups in which some hydrogen atoms are replaced by hydroxyl, alkoxy, oxo, amino, alkylamino or the like. Illustrative examples of the substituted alkyl groups are shown below.

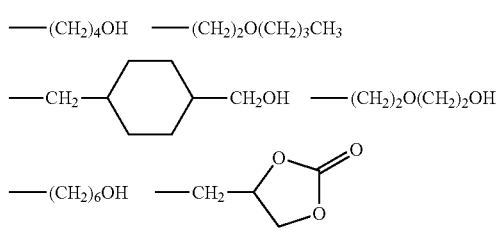

A pair of $R^{31}$ and $R^{32}$, $R^{31}$ and $R^{33}$, or $R^{32}$ and $R^{33}$ may bond together to form a ring with the carbon and oxygen atoms to which they are attached. Each of $R^{31}$, $R^{32}$ and $R^{33}$ is a straight or branched alkylene group of 1 to 18 carbon atoms, preferably 1 to 10 carbon atoms when they form a ring, while the ring preferably has 3 to 10 carbon atoms, more preferably 4 to 10 carbon atoms.

Examples of the acid labile groups of formula (A-1) include tert-butoxycarbonyl, tert-butoxycarbonylmethyl, tert-amyloxycarbonyl, tert-amyloxycarbonylmethyl, 1,1-diethylpropyloxycarbonyl, 1,1-diethylpropyloxycarbonylmethyl, 1-ethyl cyclopentyloxycarbonyl, 1-ethylcyclopentyloxycarbonylmethyl, 1-ethyl-2-cyclopentenyloxycarbonyl, 1-ethyl-2-cyclopentenyloxycarbonylmethyl, 1-ethoxyethoxycarbonylmethyl, 2-tetrahydropyranyloxycarbonylmethyl, and 2-tetrahydrofuranyloxycarbonylmethyl groups.

Also included are substituent groups having the formulae (A-1)-1 to (A-1)-10.

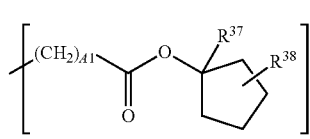 (A-1)-1

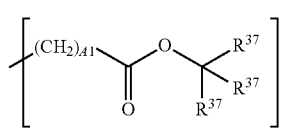 (A-1)-2

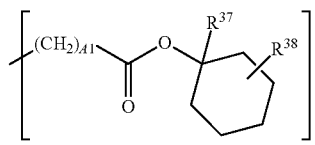 (A-1)-3

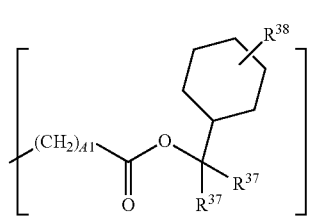 (A-1)-4

-continued

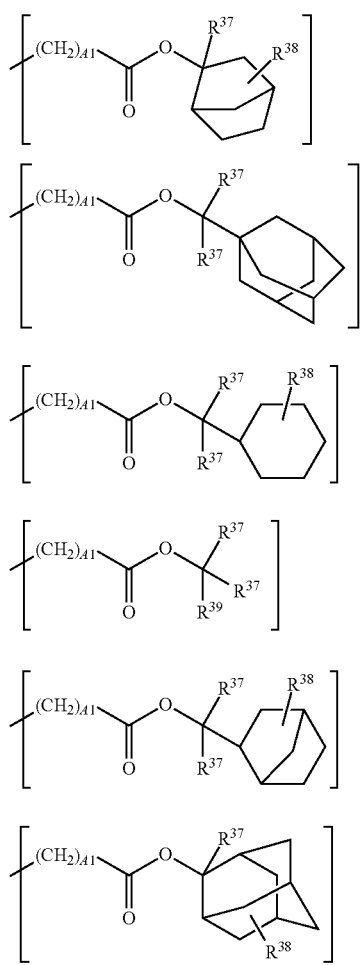

(A-1)-5
(A-1)-6
(A-1)-7
(A-1)-8
(A-1)-9
(A-1)-10

Herein $R^{37}$ is each independently a straight, branched or cyclic $C_1$-$C_{10}$ alkyl group or $C_6$-$C_{20}$ aryl group. $R^{38}$ is hydrogen or a straight, branched or cyclic $C_1$-$C_{10}$ alkyl group. $R^{39}$ is each independently a straight, branched or cyclic $C_2$-$C_{10}$ alkyl group or $C_6$-$C_{20}$ aryl group. A1 is an integer of 0 to 6.

Of the acid labile groups of formula (A-2), the straight and branched ones are exemplified by the following groups having formulae (A-2)-1 to (A-2)-69.

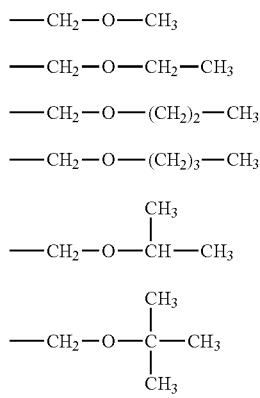

(A-2)-1
(A-2)-2
(A-2)-3
(A-2)-4
(A-2)-5
(A-2)-6

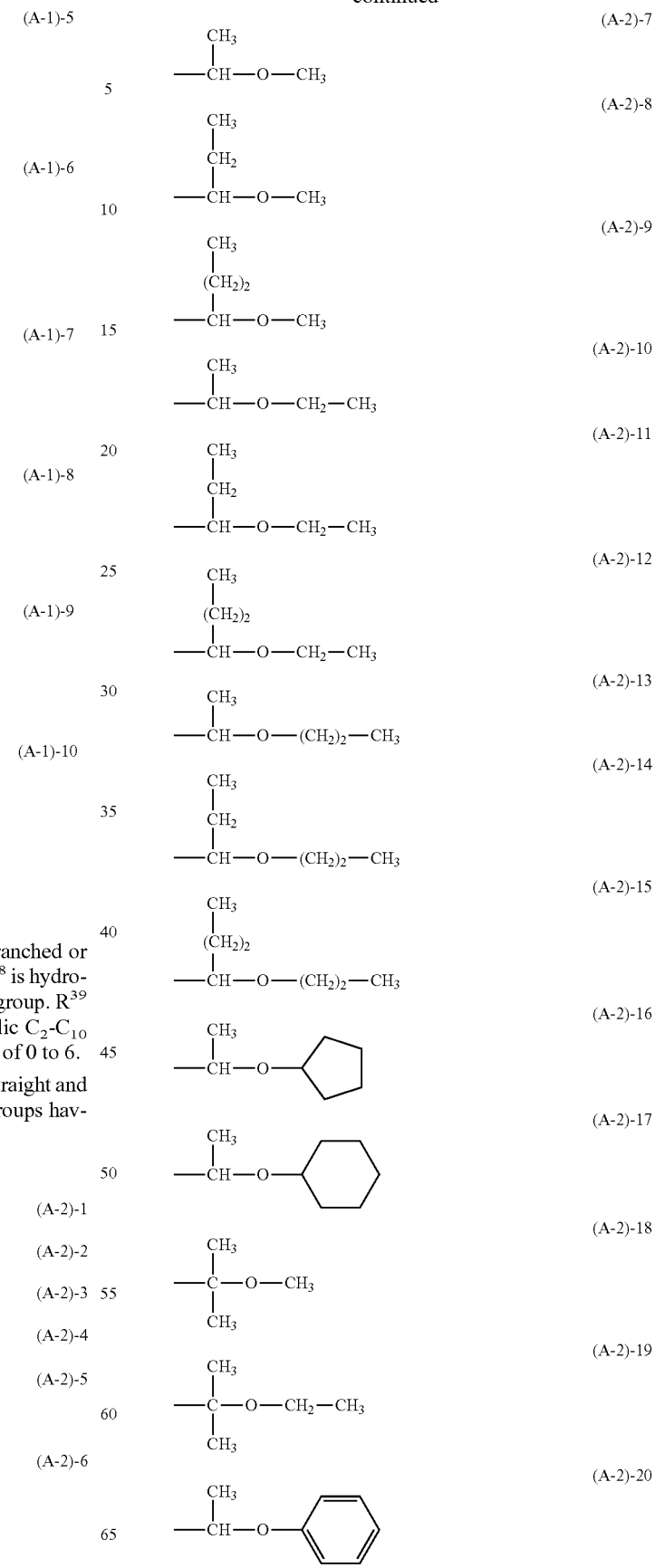

(A-2)-7
(A-2)-8
(A-2)-9
(A-2)-10
(A-2)-11
(A-2)-12
(A-2)-13
(A-2)-14
(A-2)-15
(A-2)-16
(A-2)-17
(A-2)-18
(A-2)-19
(A-2)-20

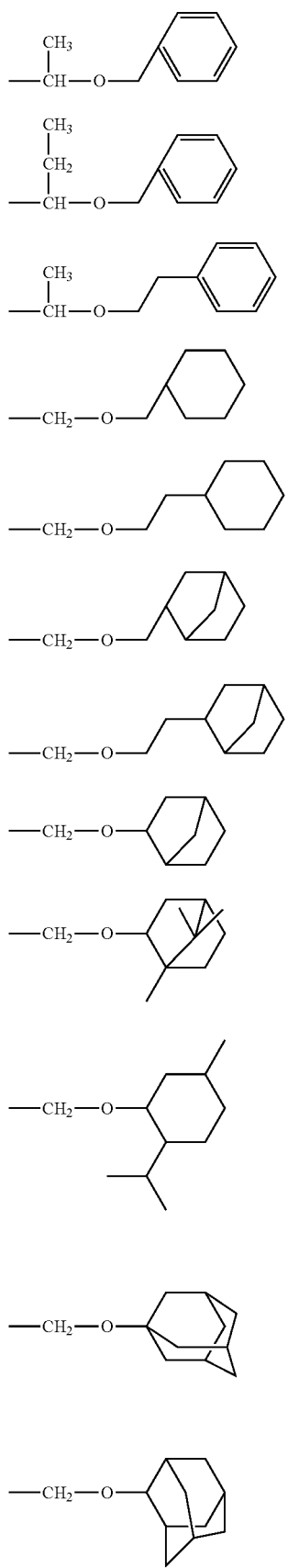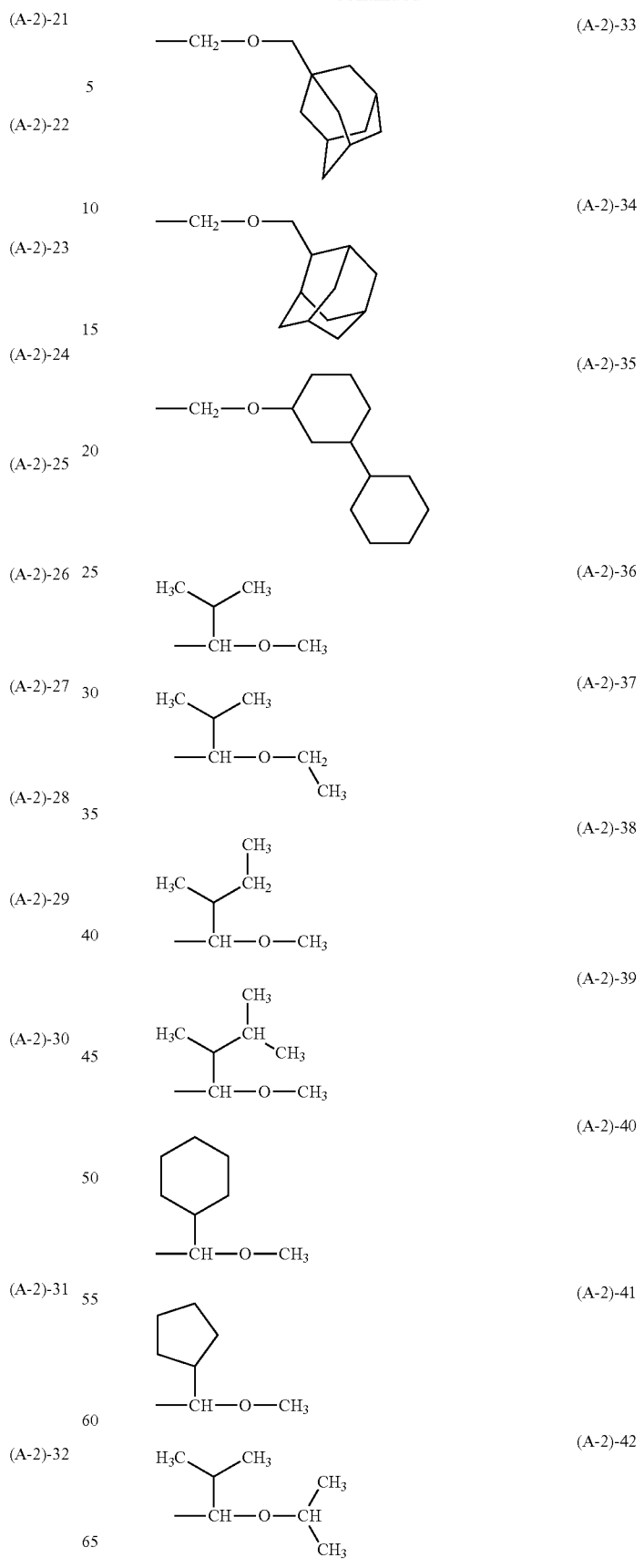

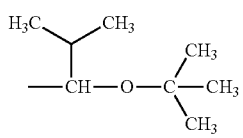
(A-2)-43
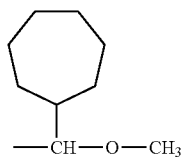
(A-2)-44
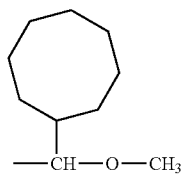
(A-2)-45
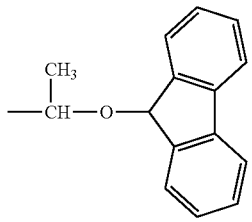
(A-2)-46
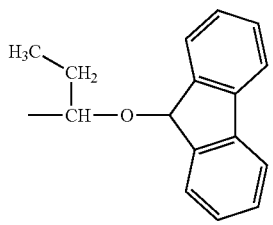
(A-2)-47
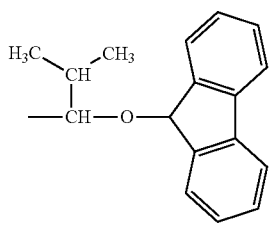
(A-2)-48
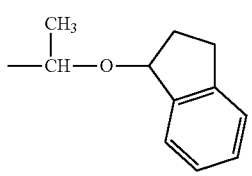
(A-2)-49
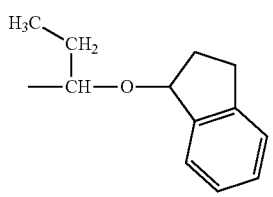
(A-2)-50
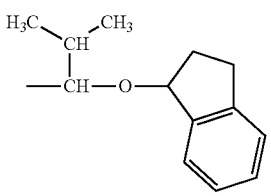
(A-2)-51
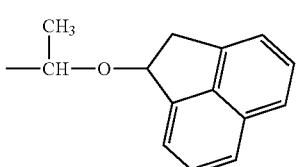
(A-2)-52
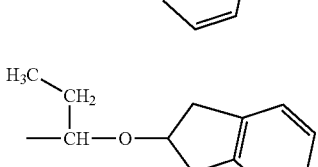
(A-2)-53
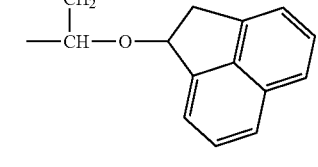
(A-2)-54
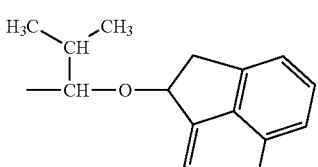
(A-2)-55
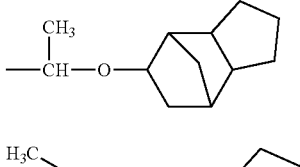
(A-2)-56
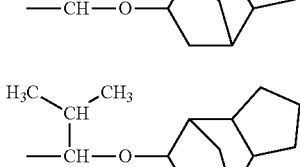
(A-2)-57
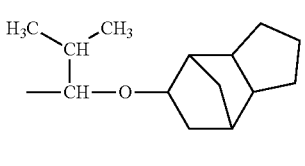
(A-2)-58
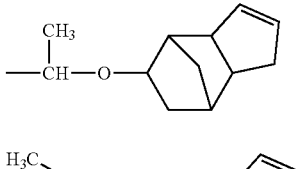
(A-2)-59
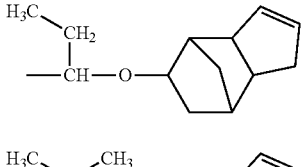
(A-2)-60

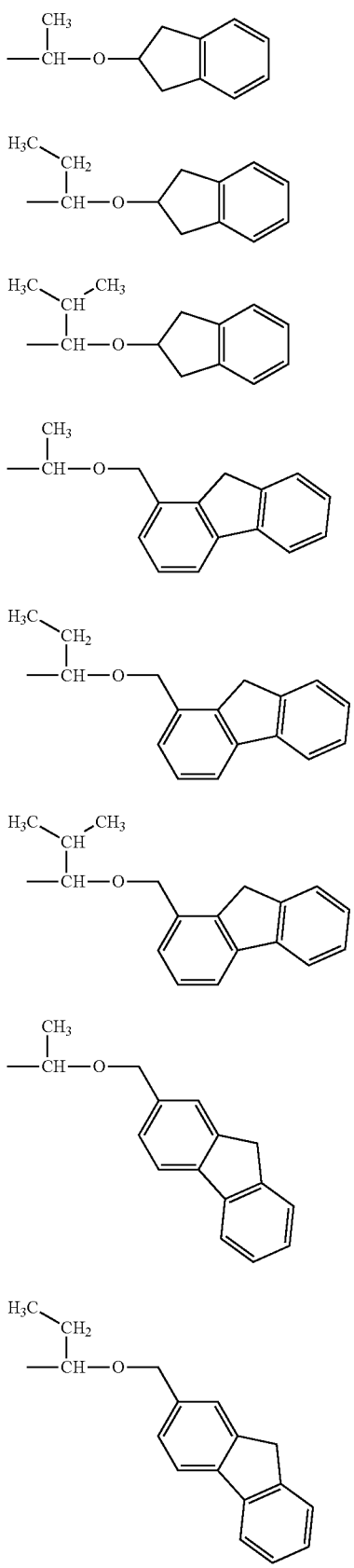

(A-2)-61

(A-2)-62

(A-2)-63

(A-2)-64

(A-2)-65

(A-2)-66

(A-2)-67

(A-2)-68

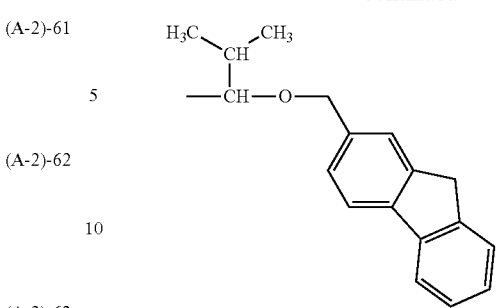

(A-2)-69

Of the acid labile groups of formula (A-2), the cyclic ones are, for example, tetrahydrofuran-2-yl, 2-methyltetrahydrofuran-2-yl, tetrahydropyran-2-yl, and 2-methyltetrahydropyran-2-yl.

Other examples of acid labile groups include those of the following formula (A-2a) or (A-2b) while the polymer may be crosslinked within the molecule or between molecules with these acid labile groups.

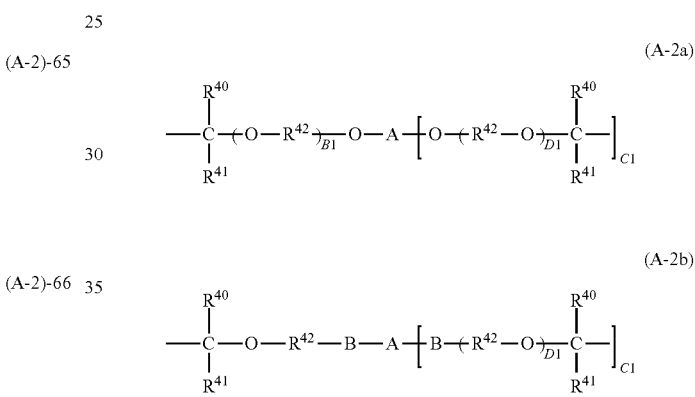

Herein $R^{40}$ and $R^{41}$ each are hydrogen or a straight, branched or cyclic $C_1$-$C_8$ alkyl group, or $R^{40}$ and $R^{41}$, taken together, may form a ring with the carbon atom to which they are attached, and $R^{40}$ and $R^{41}$ are straight or branched $C_1$-$C_8$ alkylene groups when they form a ring. $R^{42}$ is a straight, branched or cyclic $C_1$-$C_{10}$ alkylene group. Each of B1 and D1 is 0 or an integer of 1 to 10, preferably 0 or an integer of 1 to 5, and C1 is an integer of 1 to 7. "A" is a (C1+1)-valent aliphatic or alicyclic saturated hydrocarbon group, aromatic hydrocarbon group or heterocyclic group having 1 to 50 carbon atoms, which may be separated by a heteroatom or in which some hydrogen atoms attached to carbon atoms may be substituted by hydroxyl, carboxyl, carbonyl groups or fluorine atoms. "B" is —CO—O—, —NHCO—O— or —NH-CONH—.

Preferably, "A" is selected from divalent to tetravalent, straight, branched or cyclic $C_1$-$C_{20}$ alkylene, alkyltriyl and alkyltetrayl groups, and $C_6$-$C_{30}$ arylene groups, which may contain a heteroatom or in which some hydrogen atoms attached to carbon atoms may be substituted by hydroxyl, carboxyl, acyl groups or halogen atoms. The subscript C1 is preferably an integer of 1 to 3.

The crosslinking acetal groups of formulae (A-2a) and (A-2b) are exemplified by the following formulae (A-2)-70 through (A-2)-77.

 (A-2)-70

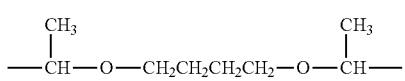 (A-2)-72

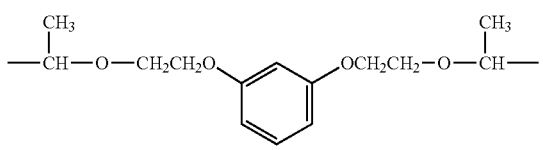 (A-2)-74

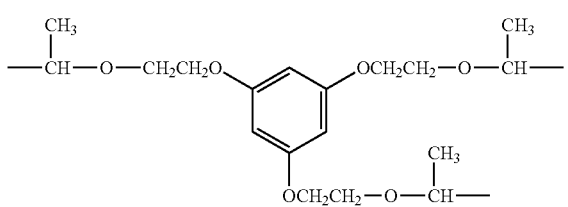 (A-2)-76

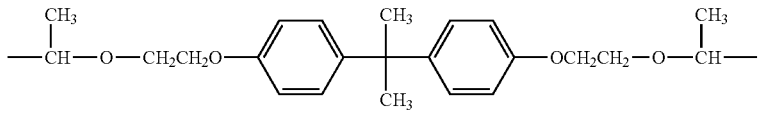 (A-2)-77

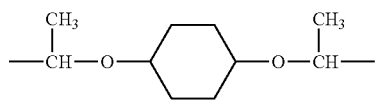 (A-2)-71

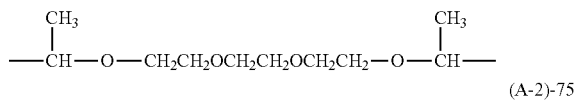 (A-2)-73

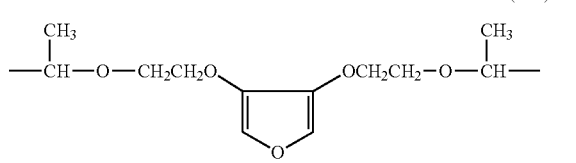 (A-2)-75

In formula (A-3), $R^{34}$, $R^{35}$ and $R^{36}$ each are a monovalent hydrocarbon group, typically a straight, branched or cyclic $C_1$-$C_{20}$ alkyl group, straight, branched or cyclic $C_2$-$C_{20}$ alkenyl group or $C_6$-$C_{20}$ aryl group, which may contain a heteroatom such as oxygen, sulfur, nitrogen or fluorine. A pair of $R^{34}$ and $R^{35}$, $R^{34}$ and $R^{36}$, or $R^{35}$ and $R^{36}$ may bond together to form a $C_3$-$C_{20}$ aliphatic ring with the carbon atom to which they are attached.

Exemplary tertiary alkyl groups of formula (A-3) include tert-butyl, triethylcarbyl, 1-ethylnorbornyl, 1-methylcyclohexyl, 1-ethylcyclopentyl, 2-(2-methyl)adamantyl, 2-(2-ethyl)adamantyl, and tert-amyl.

Other exemplary tertiary alkyl groups include those of the following formulae (A-3)-1 to (A-3)-18.

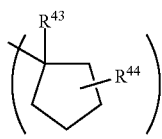 (A-3)-1

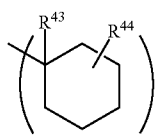 (A-3)-2

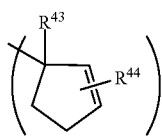 (A-3)-3

-continued

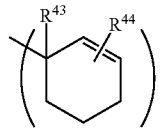 (A-3)-4

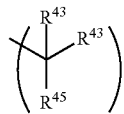 (A-3)-5

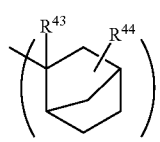 (A-3)-6

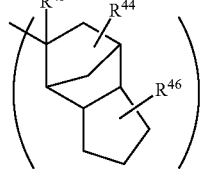 (A-3)-7

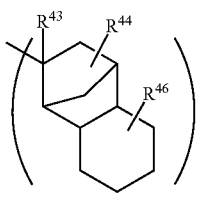
(A-3)-8

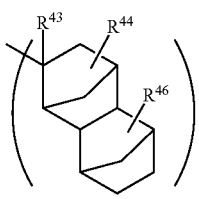
(A-3)-9

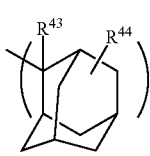
(A-3)-10

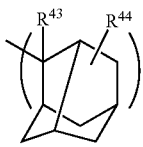
(A-3)-11

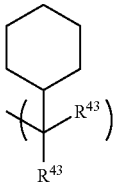
(A-3)-12

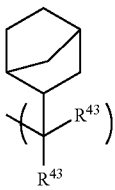
(A-3)-13

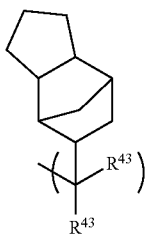
(A-3)-14

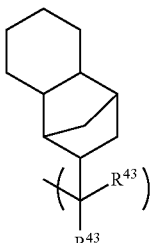
(A-3)-15

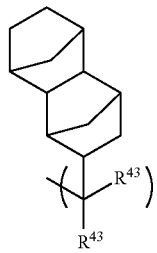
(A-3)-16

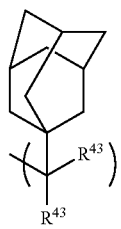
(A-3)-17

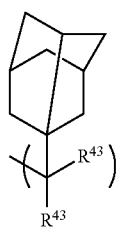
(A-3)-18

Herein $R^{43}$ is each independently a straight, branched or cyclic $C_1$-$C_8$ alkyl group or $C_6$-$C_{20}$ aryl group, typically phenyl, $R^{44}$ and $R^{46}$ each are hydrogen or a straight, branched or cyclic $C_1$-$C_{20}$ alkyl group, and $R^{45}$ is a $C_6$-$C_{20}$ aryl group, typically phenyl.

The polymer may be crosslinked within the molecule or between molecules with groups having $R^{47}$ which is a di- or multi-valent alkylene or arylene group, as shown by the following formulae (A-3)-19 and (A-3)-20.

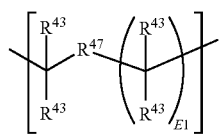
(A-3)-19

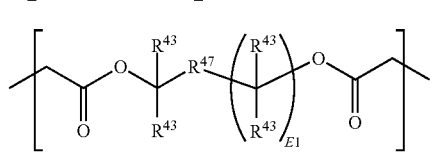
(A-3)-20

Herein $R^{43}$ is as defined above, $R^{47}$ is a straight, branched or cyclic $C_1$-$C_{20}$ alkylene group or arylene group, typically phenylene, which may contain a heteroatom such as oxygen, sulfur or nitrogen, and E1 is an integer of 1 to 3.

Of recurring units having acid labile groups of formula (A-3), recurring units of (meth)acrylate having an exo-form structure represented by the formula (A-3)-21 are preferred as the recurring unit (a1).

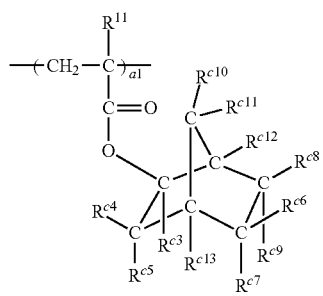

(A-3)-21

Herein, $R^{11}$ and a1 are as defined above. $R^{c3}$ is a straight, branched or cyclic $C_1$-$C_8$ alkyl group or an optionally substituted $C_6$-$C_{20}$ aryl group. $R^{c4}$ to $R^{c9}$, $R^{c12}$ and $R^{c13}$ are each independently hydrogen or a monovalent $C_1$-$C_{15}$ hydrocarbon group which may contain a heteroatom. $R^{c10}$ and $R^{c11}$ each are hydrogen or a monovalent $C_1$-$C_{15}$ hydrocarbon group which may contain a heteroatom. Alternatively, a pair of $R^{c4}$ and $R^{c5}$, $R^{c6}$ and $R^{c8}$, $R^{c6}$ and $R^{c9}$, $R^{c7}$ and $R^{c9}$, $R^{c7}$ and $R^{c13}$, $R^{c8}$ and $R^{c12}$, $R^{c10}$ and $R^{c11}$, or $R^{c11}$ and $R^{c12}$, taken together, may form a ring, and in that event, each ring-forming R is a divalent $C_1$-$C_{15}$ hydrocarbon group which may contain a heteroatom. Also, a pair of $R^{c4}$ and $R^{c13}$, $R^{c10}$ and $R^{c13}$, or $R^{c6}$ and $R^{c8}$ which are attached to vicinal carbon atoms may bond together directly to form a double bond. The formula also represents an enantiomer.

The ester form monomers from which recurring units having an exo-form structure represented by formula (A-3)-21 are derived are described in U.S. Pat. No. 6,448,420 (JP-A 2000-327633). Illustrative non-limiting examples of suitable monomers are given below.

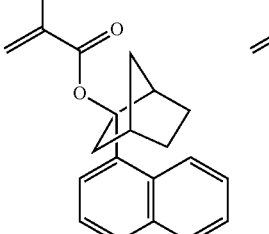

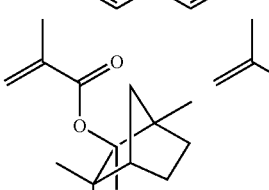

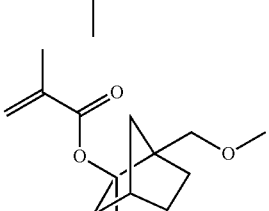

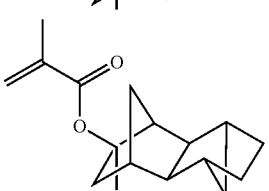

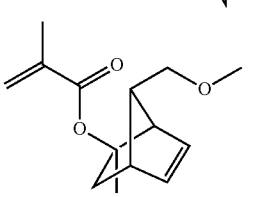

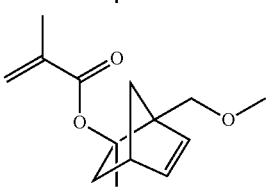

-continued

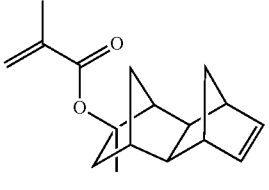

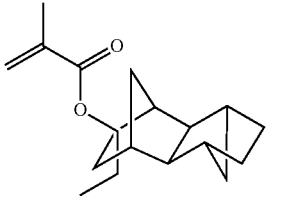

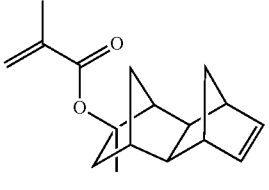

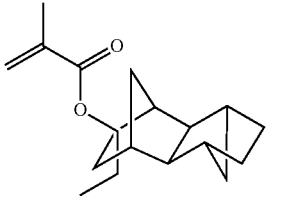

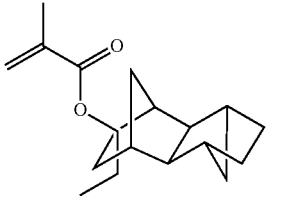

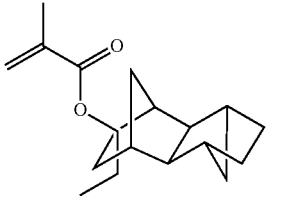

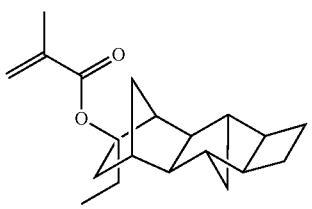

Also included in the acid labile groups of formula (A-3) are acid labile groups of (meth)acrylate having furandiyl, tetrahydrofurandiyl or oxanorbornanediyl as represented by recurring units (a1) of the following formula (A-3)-22.

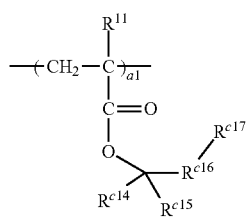

(A-3)-22

Herein, $R^{11}$ and a1 are as defined above. $R^{c14}$ and $R^{c15}$ are each independently a monovalent, straight, branched or cyclic $C_1$-$C_{10}$ hydrocarbon group, or $R^{c14}$ and $R^{c15}$, taken together, may form an aliphatic hydrocarbon ring with the carbon atom to which they are attached. $R^{c16}$ is a divalent group selected from furandiyl, tetrahydrofurandiyl and oxanorbornanediyl. $R^{c17}$ is hydrogen or a monovalent, straight, branched or cyclic $C_1$-$C_{10}$ hydrocarbon group which may contain a heteroatom.

Examples of the monomers from which the recurring units substituted with acid labile groups having furandiyl, tetrahydrofurandiyl and oxanorbornanediyl are derived are shown below. Note that Me is methyl and Ac is acetyl.

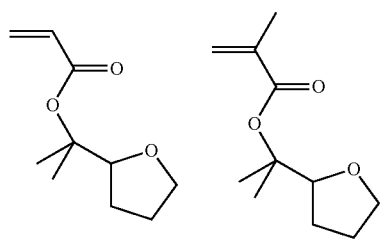

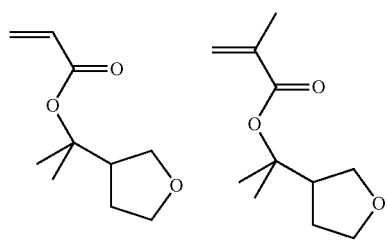

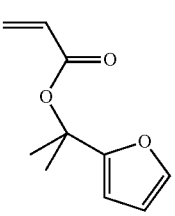 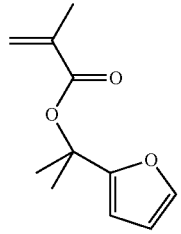

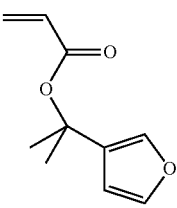 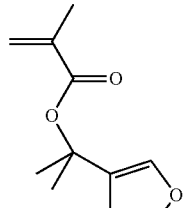

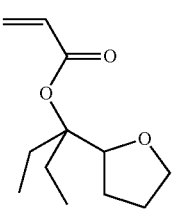 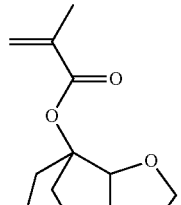

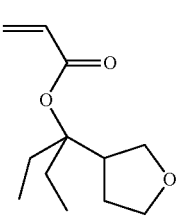 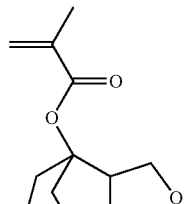

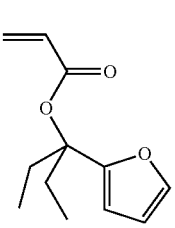 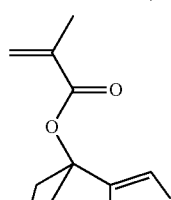

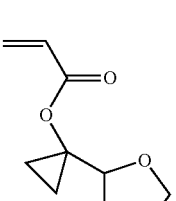 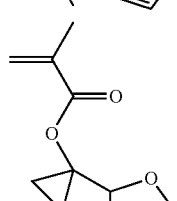

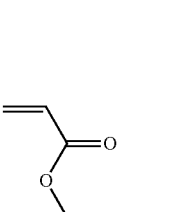 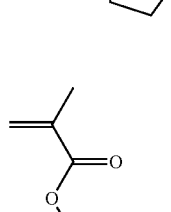

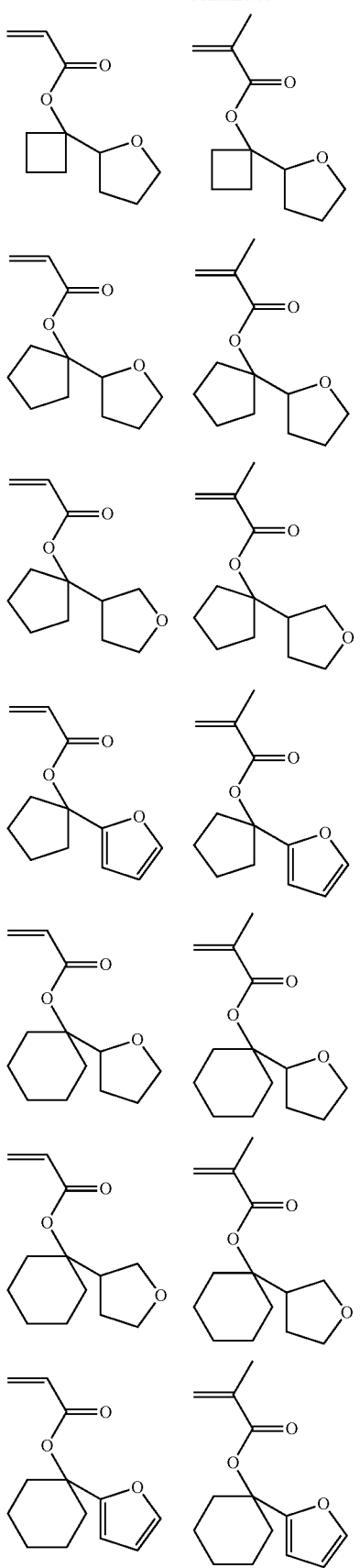
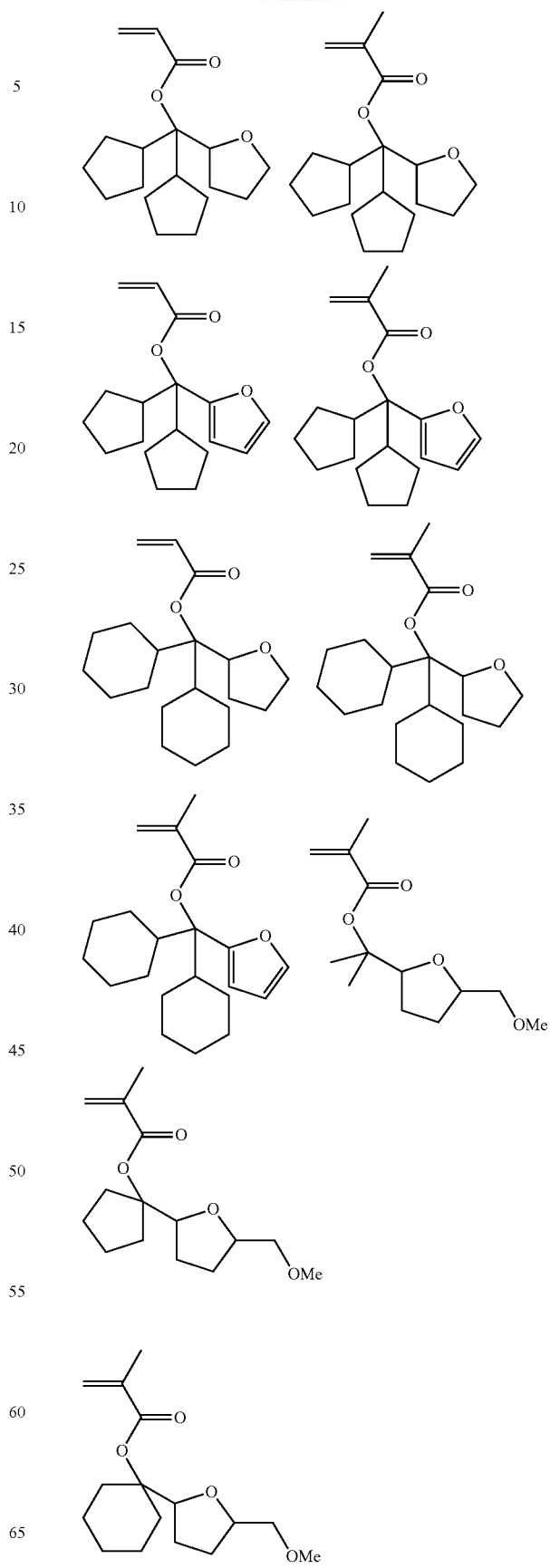

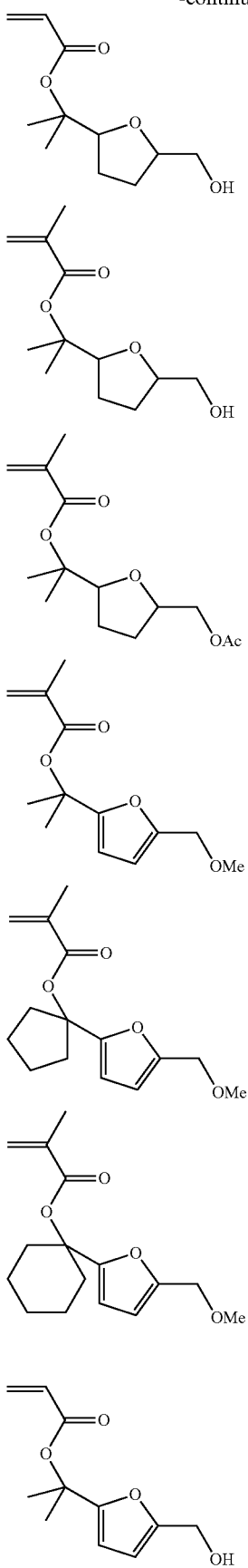
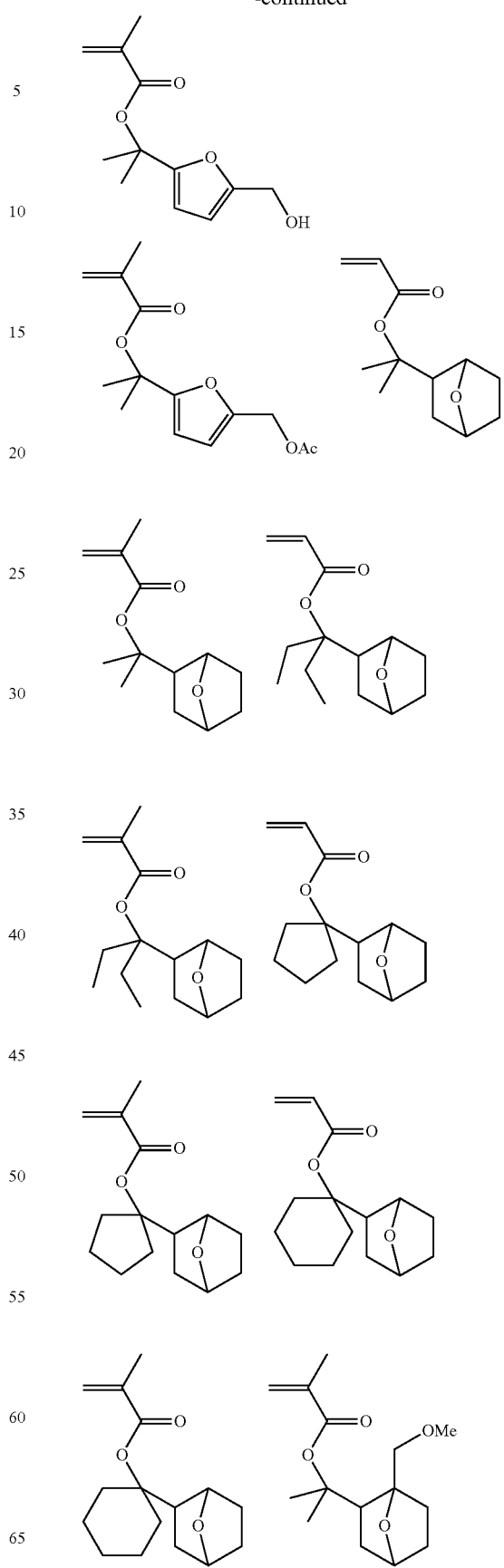

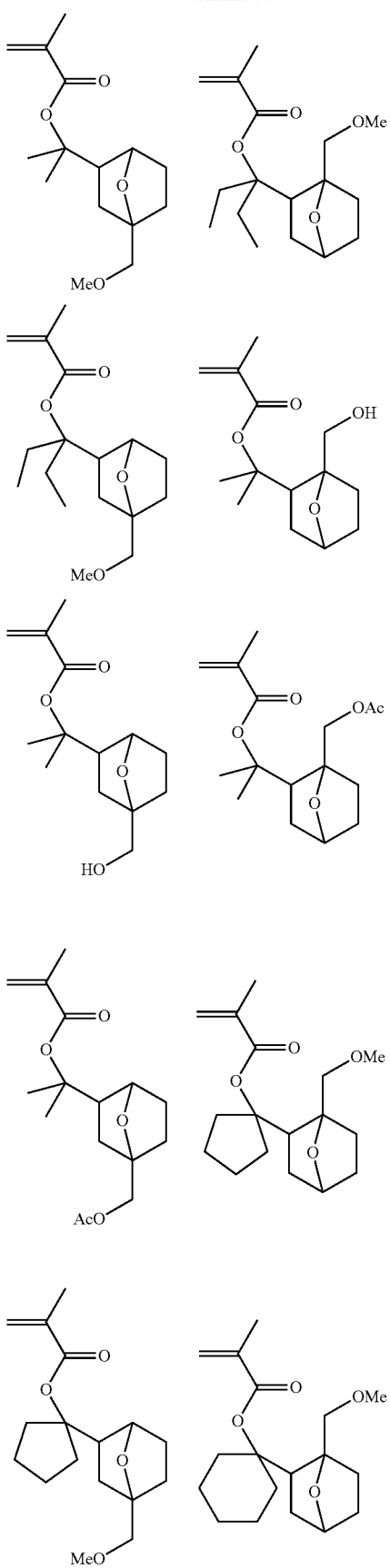
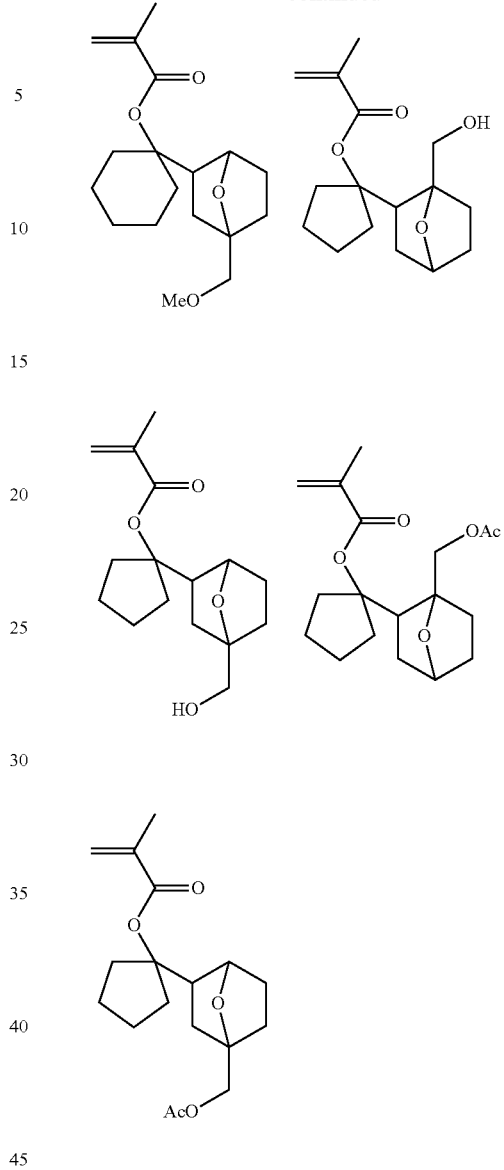
In the recurring unit (a1), $R^{12}$ may be an acid labile group having the general formula (A-3)-23.
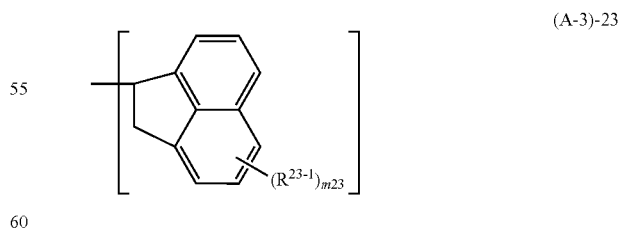
Herein $R^{23-1}$ is hydrogen, $C_1$-$C_4$ alkyl, alkoxy, alkanoyl, alkoxycarbonyl, $C_6$-$C_{10}$ aryl, halogen, or cyano group, and m23 is an integer of 1 to 4.
Examples of the monomer from which recurring units (a1) substituted with an acid labile group of formula (A-3)-23 are derived are given below.

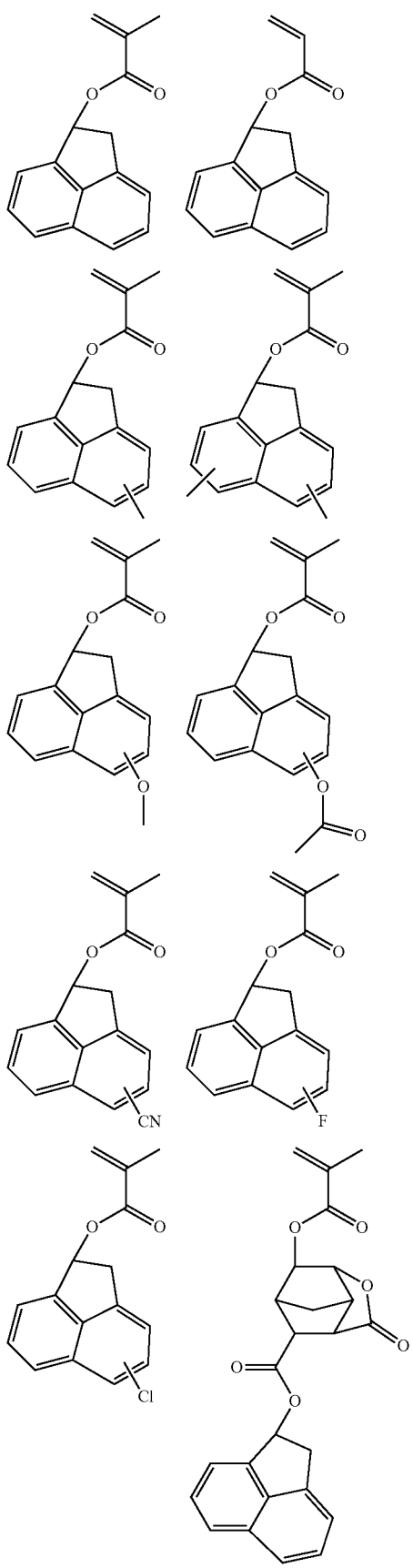
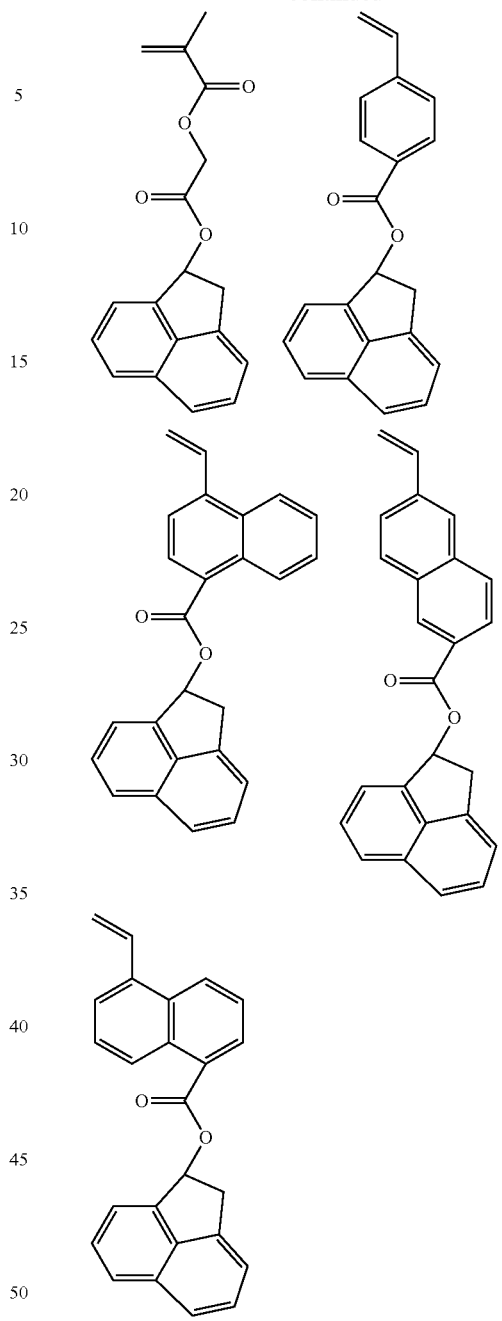
In the recurring unit (a1), $R^{12}$ may be an acid labile group having the general formula (A-3)-24.
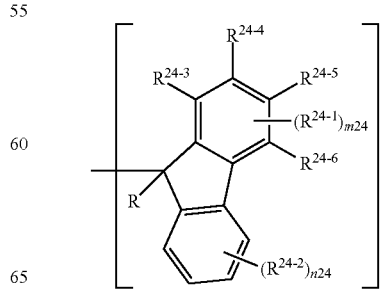
(A-3)-24

Herein $R^{24-1}$ and $R^{24-2}$ each are hydrogen, $C_1$-$C_4$ alkyl, alkoxy, alkanoyl, alkoxycarbonyl, hydroxyl, $C_6$-$C_{10}$ aryl, halogen, or cyano group; R is hydrogen, a straight, branched or cyclic $C_1$-$C_{12}$ alkyl group which may contain an oxygen or sulfur atom, $C_2$-$C_{12}$ alkenyl, $C_2$-$C_{12}$ alkynyl, or $C_6$-$C_{10}$ aryl group; $R^{24-3}$, $R^{24-4}$, $R^{24-5}$, and $R^{24-6}$ each are hydrogen, or a pair of $R^{24-3}$ and $R^{24-4}$, $R^{24-4}$ and $R^{24-5}$, or $R^{24-5}$ and $R^{24-6}$ may bond together to form a benzene ring; m24 and n24 each are an integer of 1 to 4.

Examples of the monomer from which recurring units (a1) substituted with an acid labile group of formula (A-3)-24 are derived are given below.

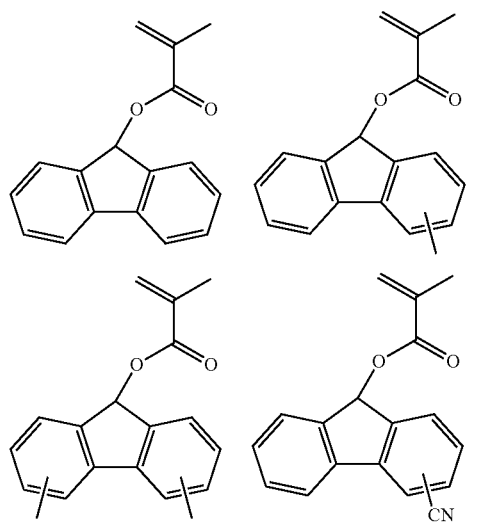
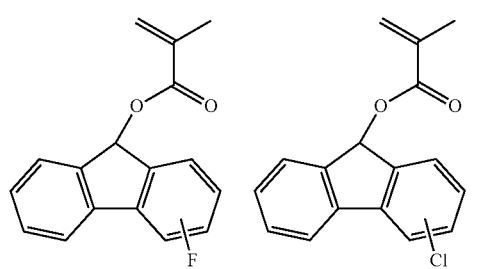
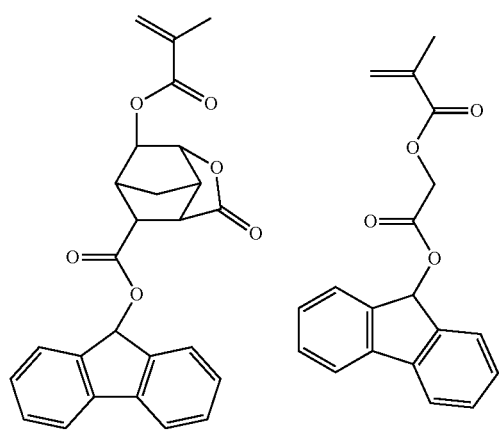

-continued

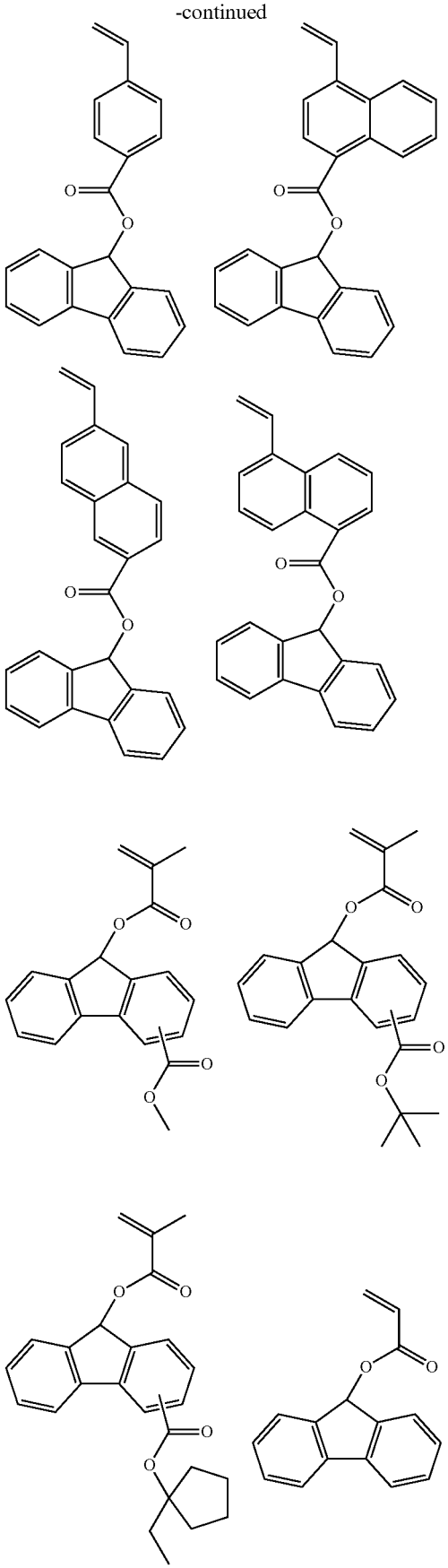

-continued
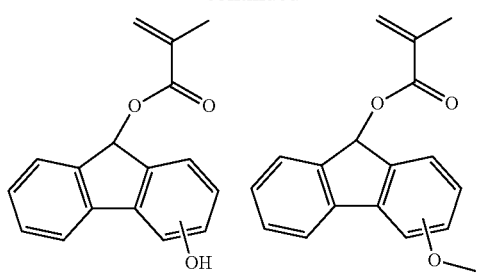
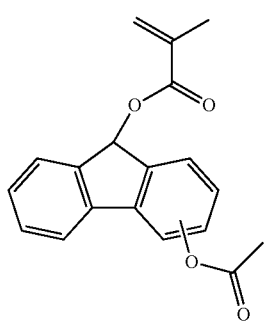
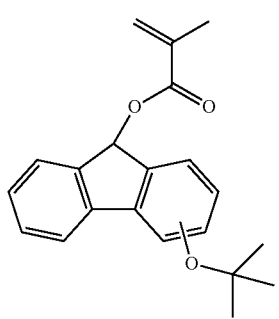
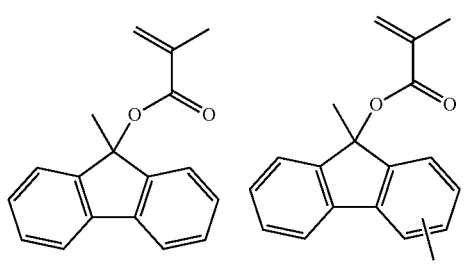
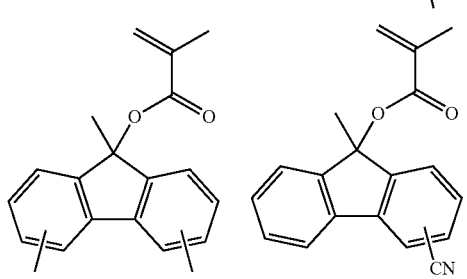
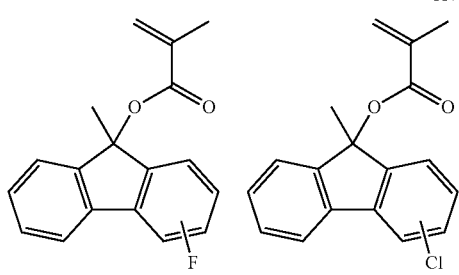
-continued
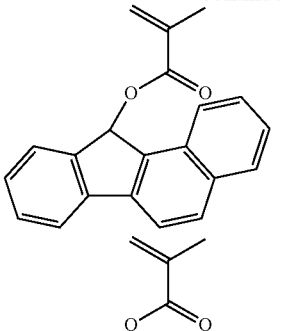
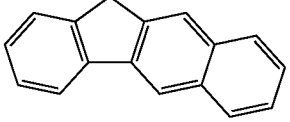
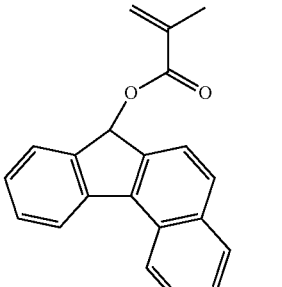
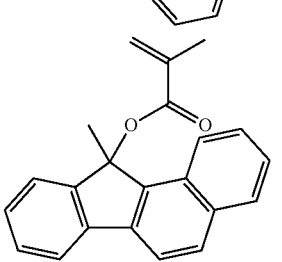
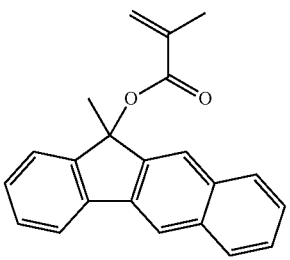
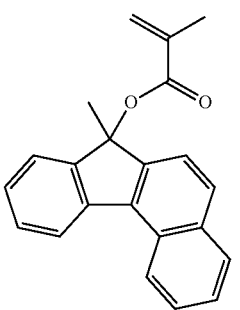

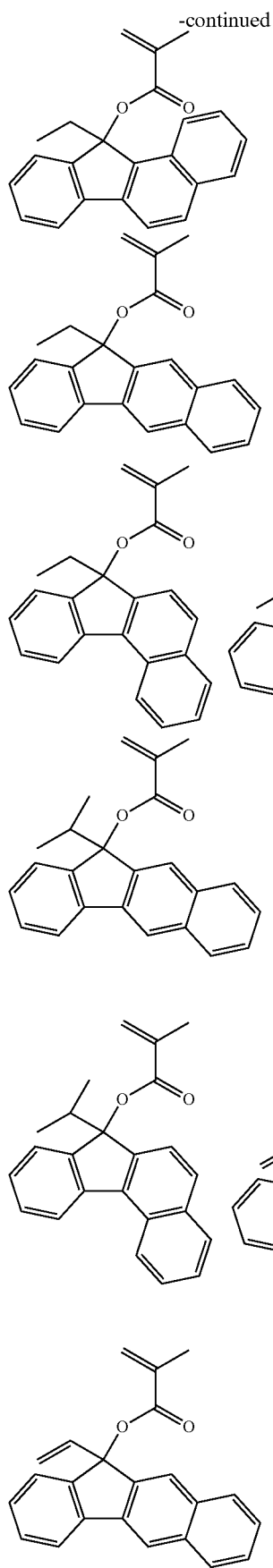
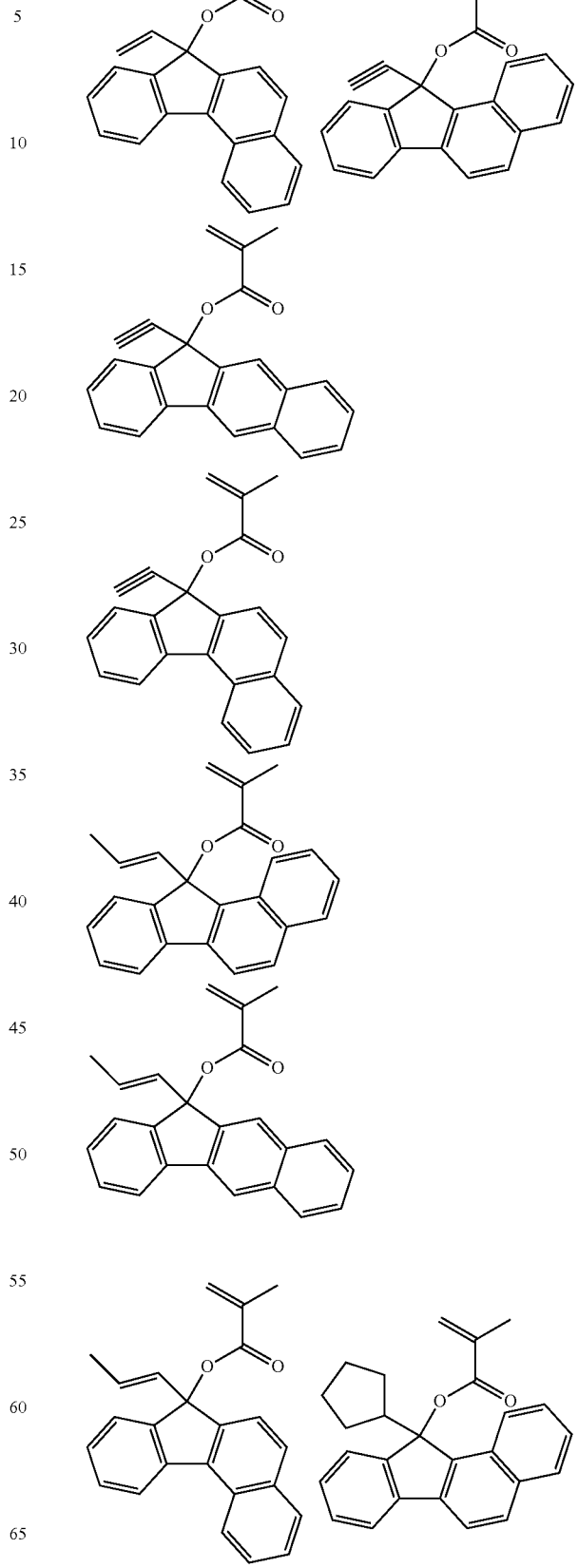

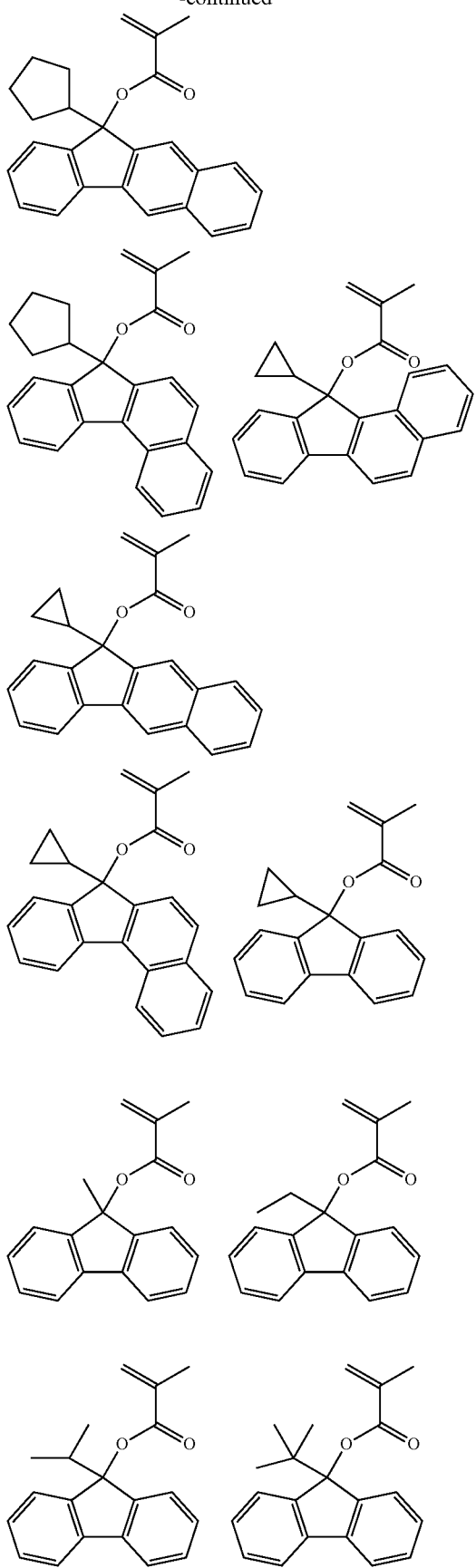
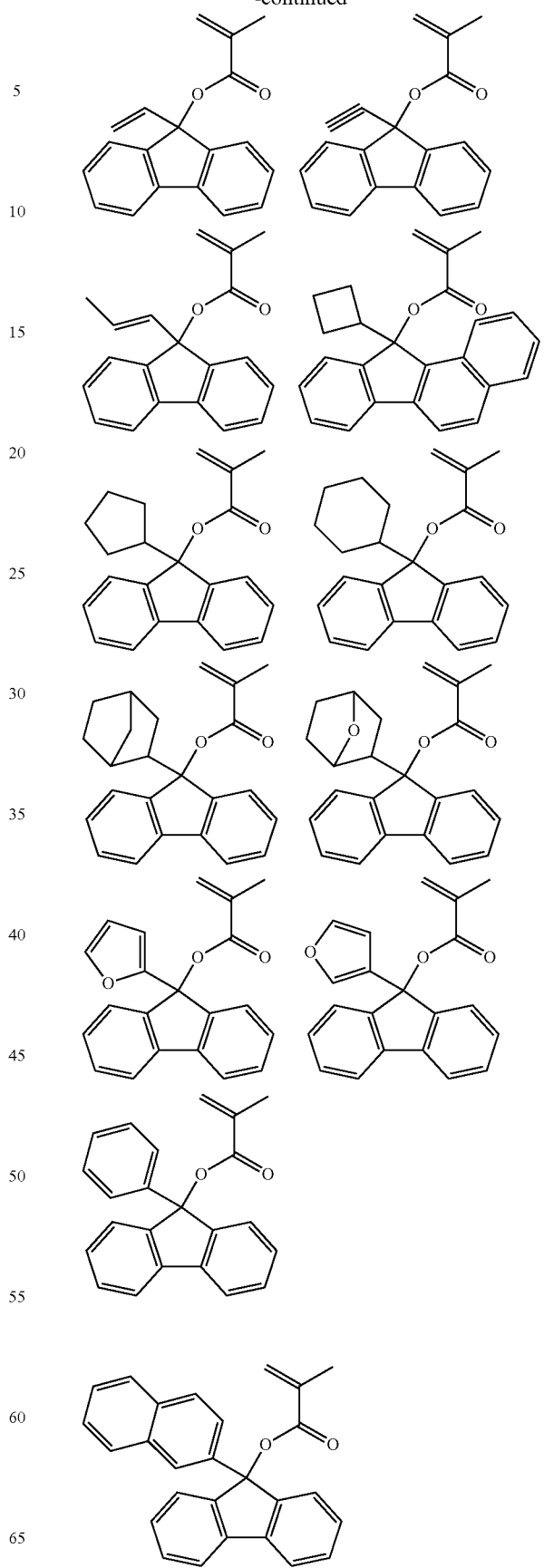

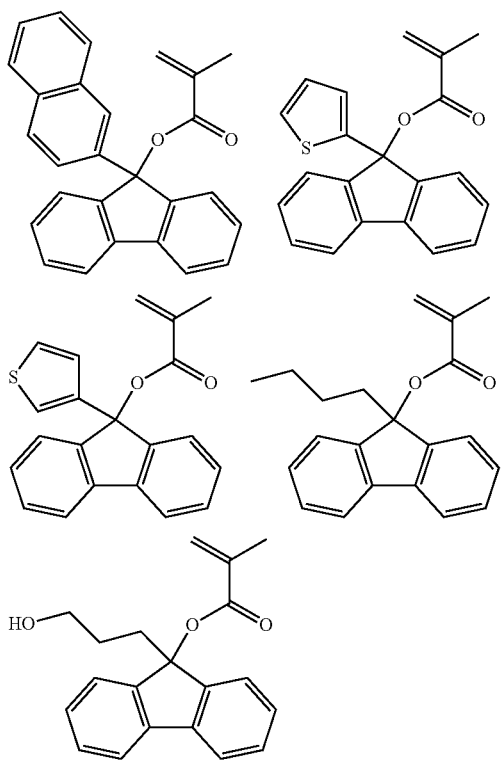

In the recurring unit (a1), $R^{12}$ may be an acid labile group having the general formula (A-3)-25.

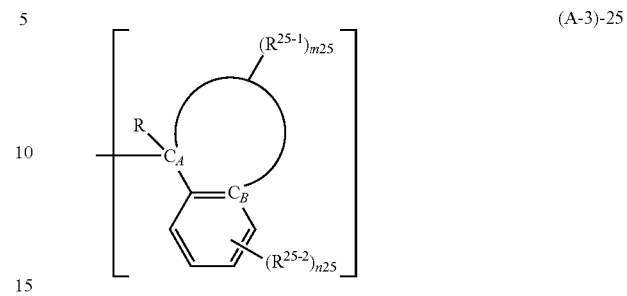

Herein $R^{25-1}$ is each independently hydrogen or a straight, branched or cyclic $C_1$-$C_6$ alkyl group, and in case m25 is 2 or more, $R^{25-1}$ may bond together to form a non-aromatic ring of 2 to 8 carbon atoms; the circle denotes a link between carbons $C_A$ and $C_B$, selected from among ethylene, propylene, butylene and pentylene; $R^{25-1}$ is not hydrogen when the circle denotes ethylene or propylene; $R^{25-2}$ is $C_1$-$C_4$ alkyl, alkoxy, alkanoyl, alkoxycarbonyl, hydroxyl, nitro, $C_6$-$C_{10}$ aryl, halogen, or cyano group; R is as defined above in formula (A-3)-24; m25 and n25 each are an integer of 1 to 4.

Examples of the monomer from which recurring units (a1) substituted with an acid labile group of formula (A-3)-25 are derived are given below.

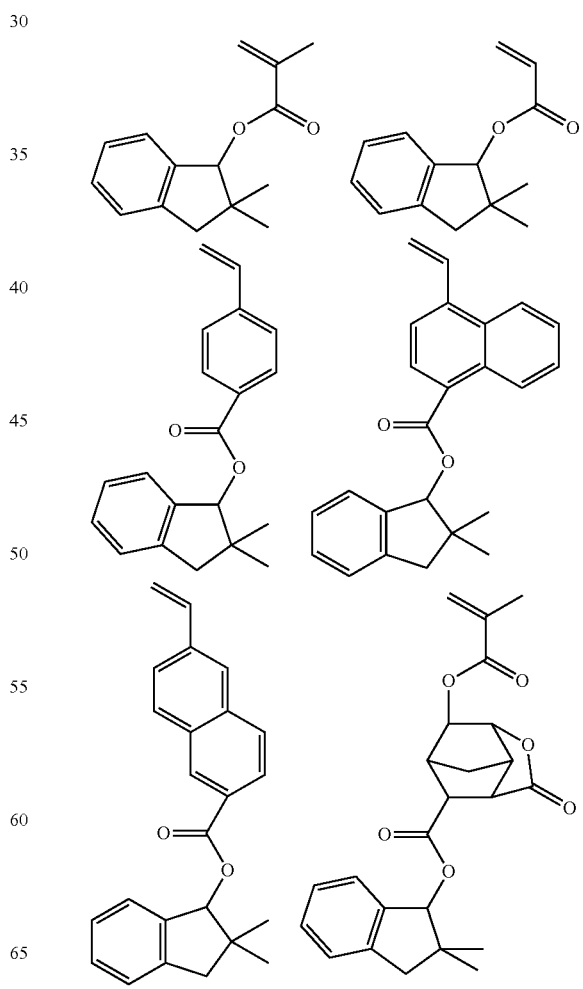

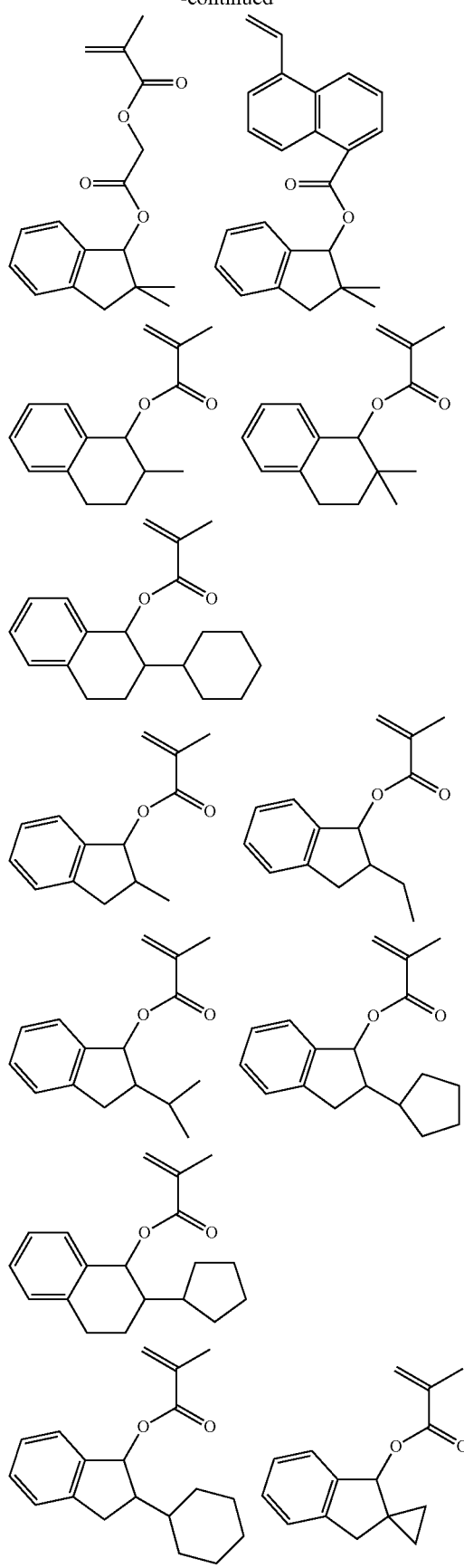
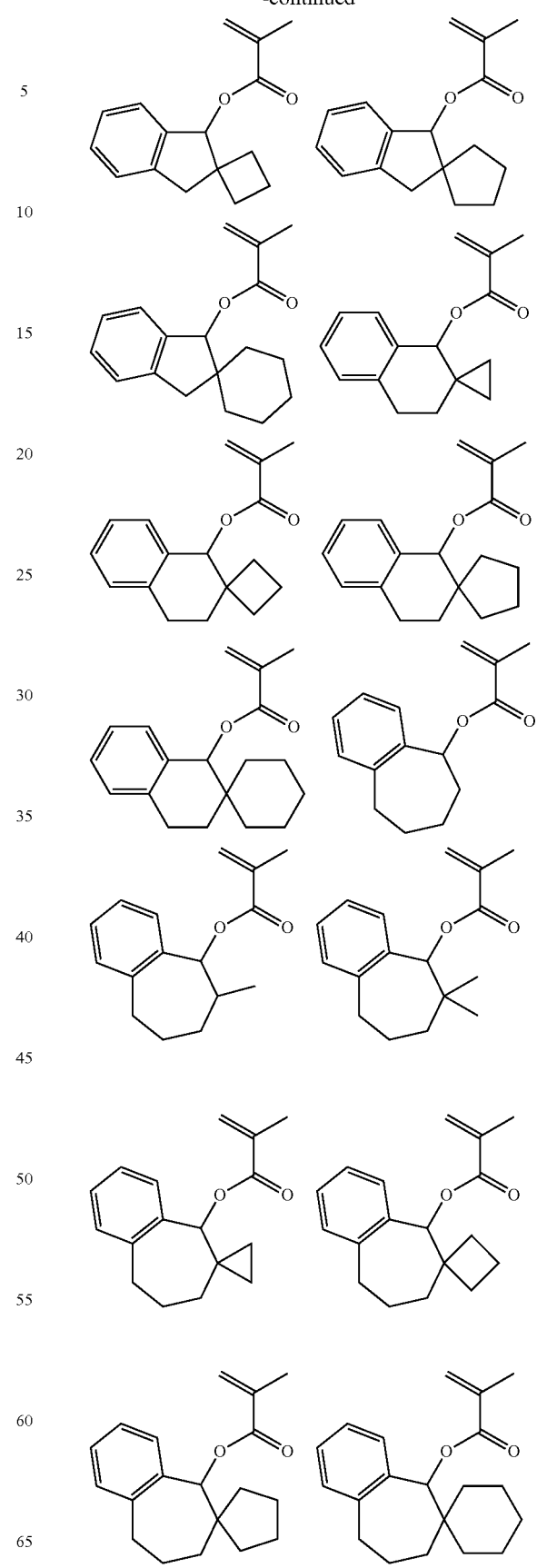

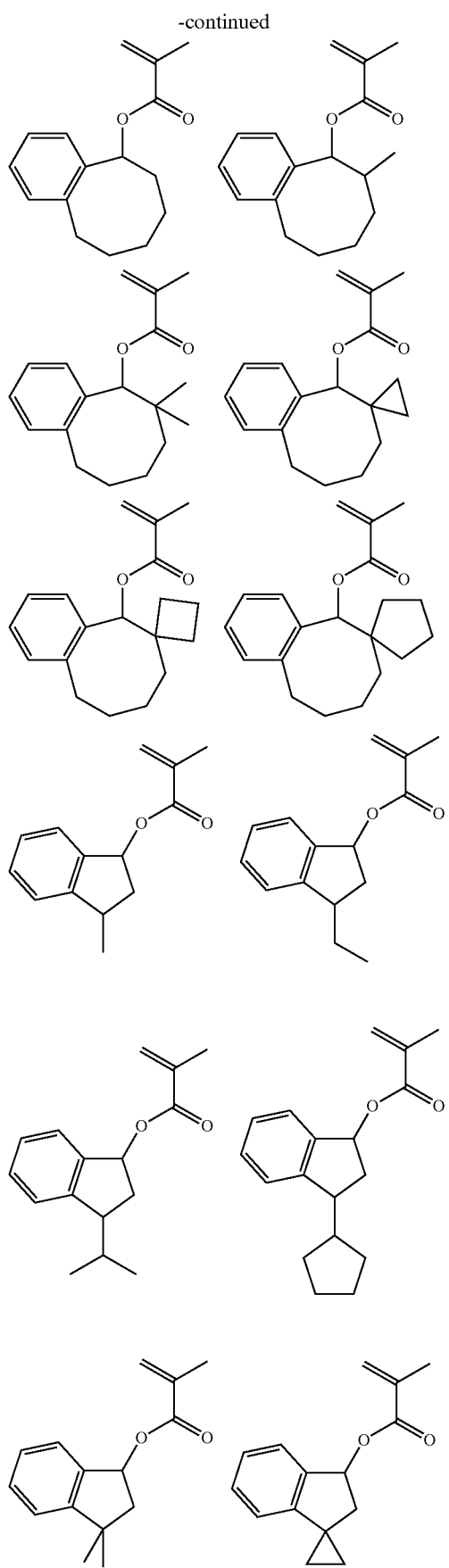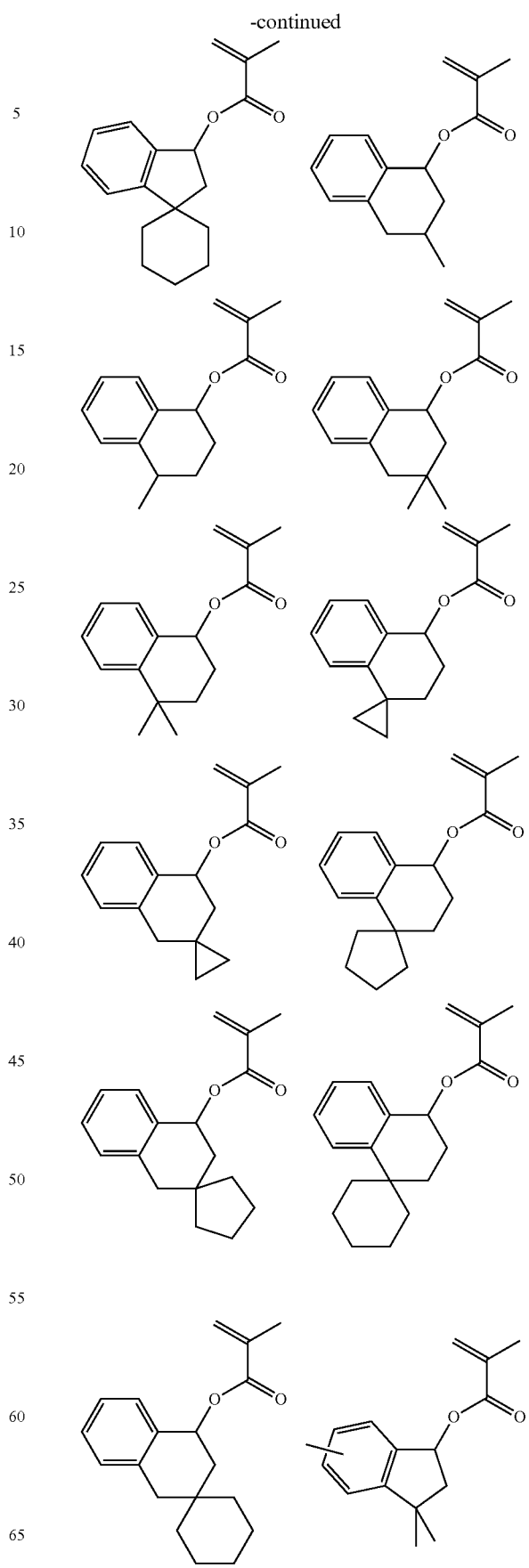

55
-continued
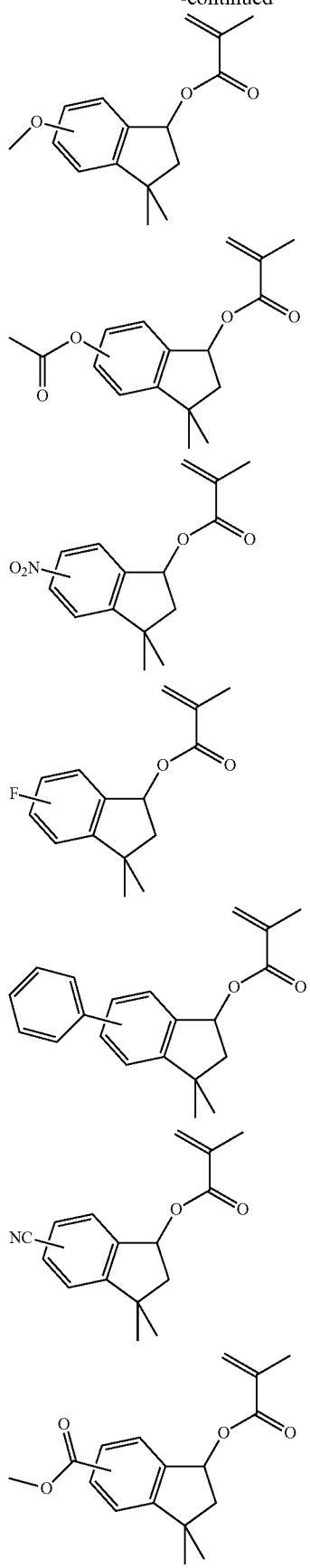
56
-continued
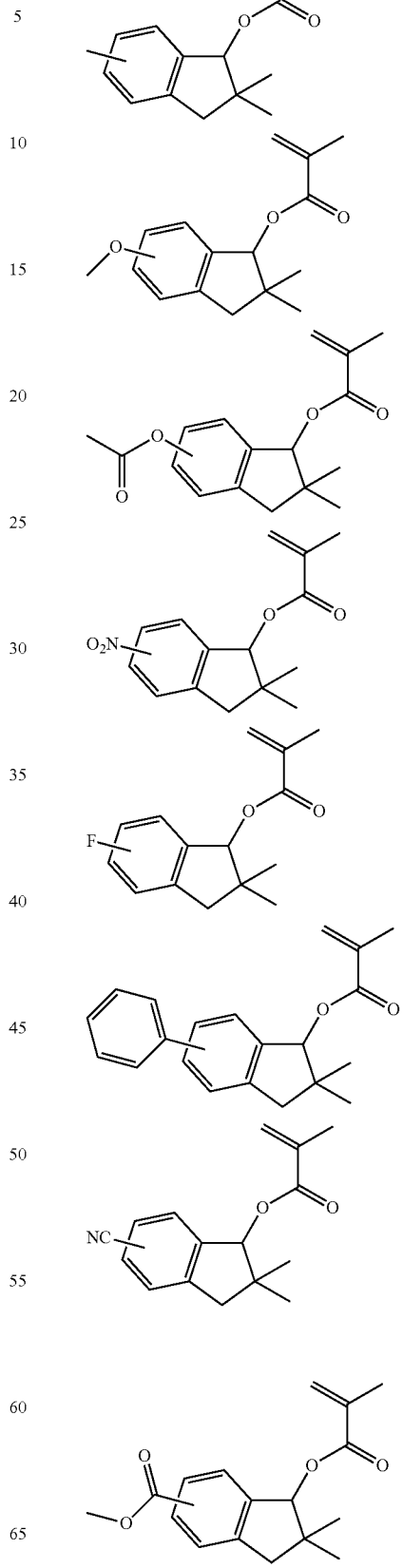

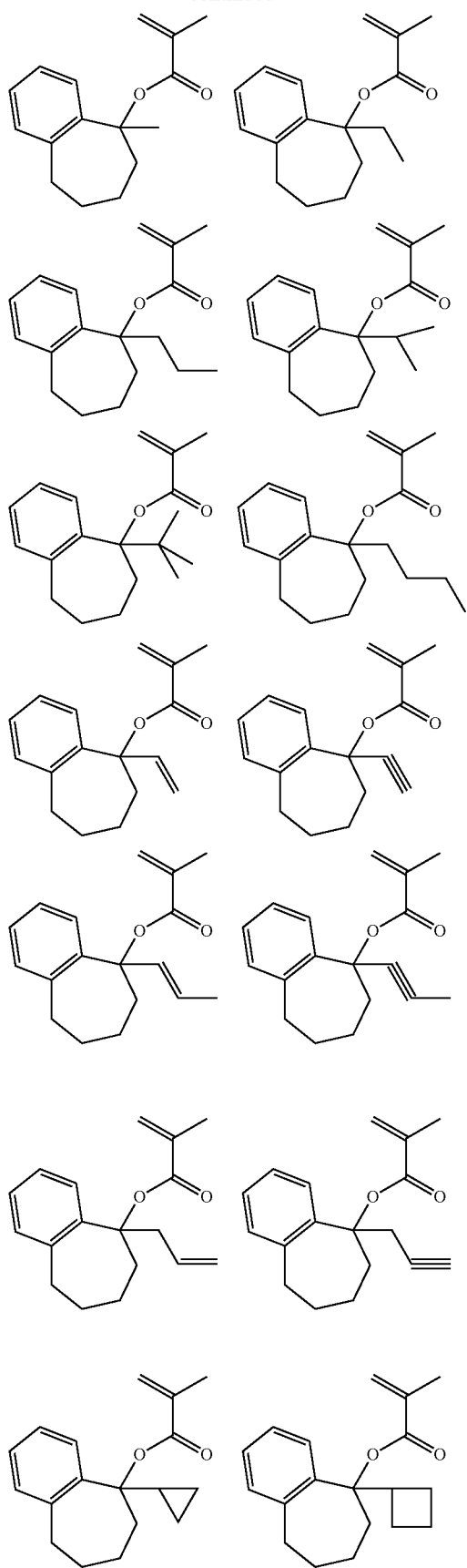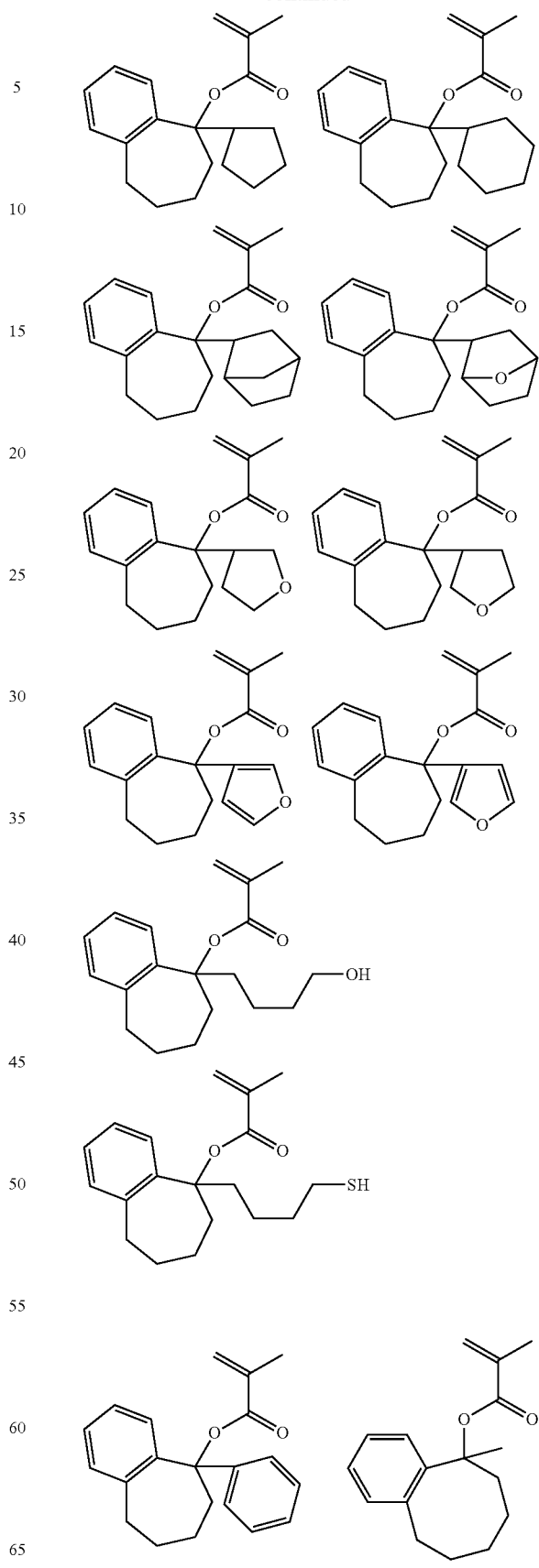

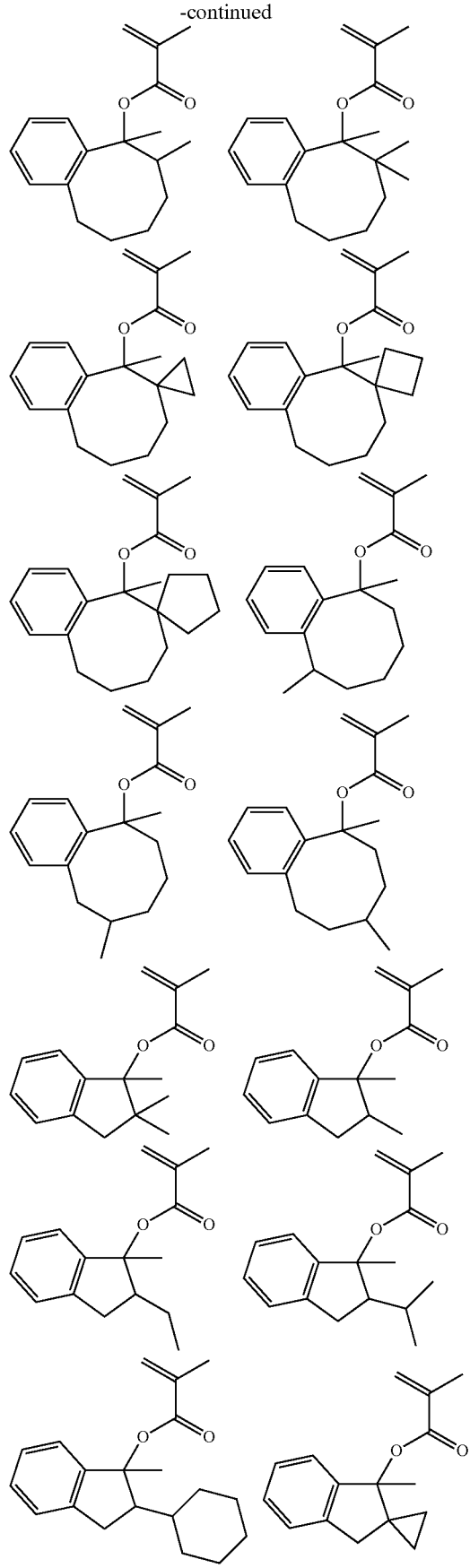
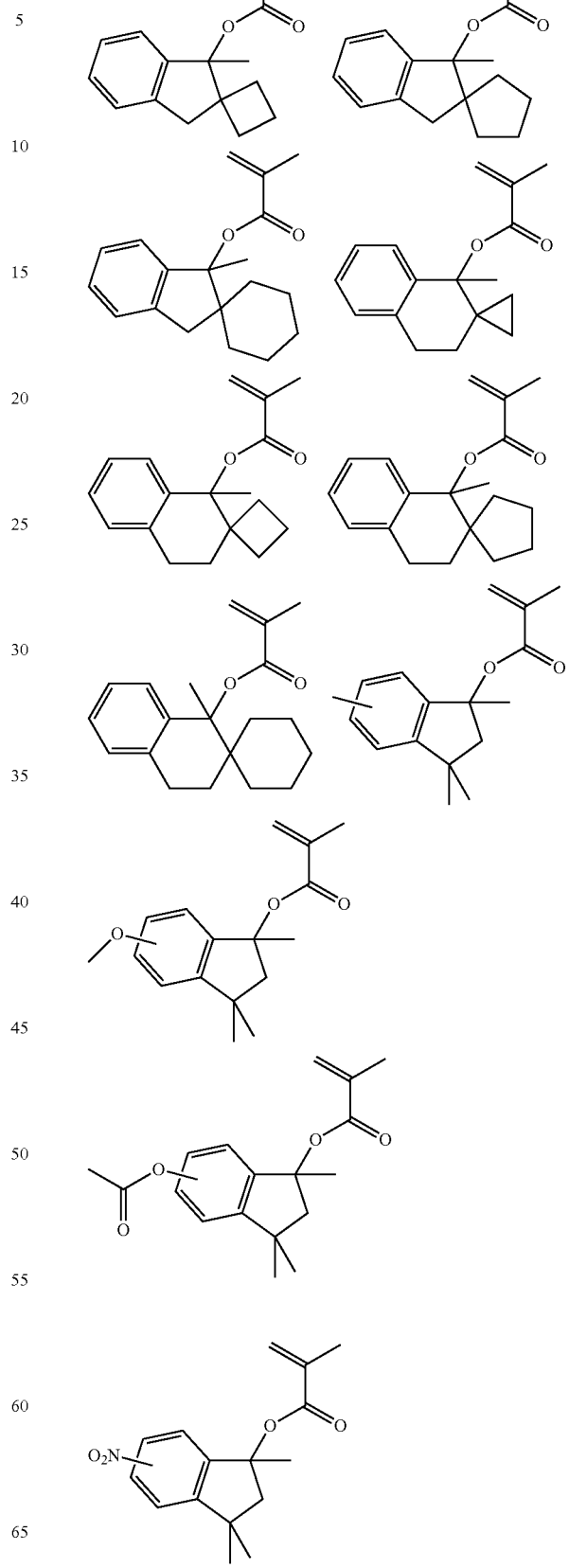

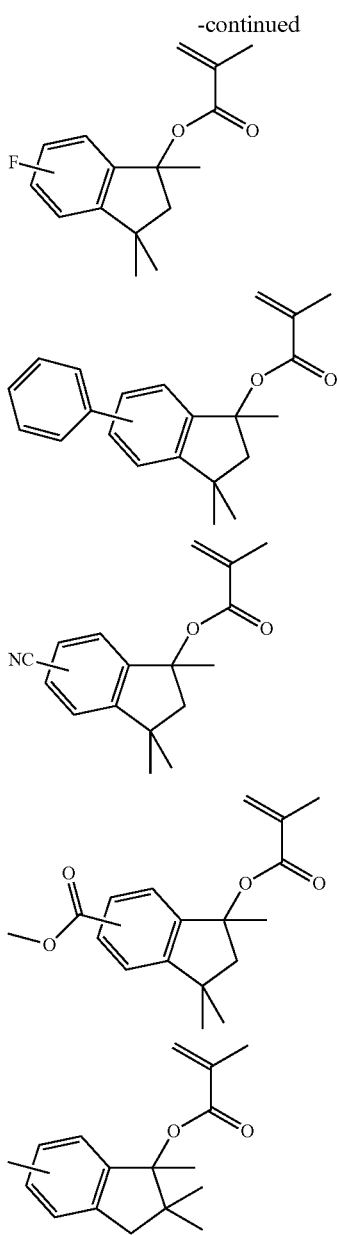

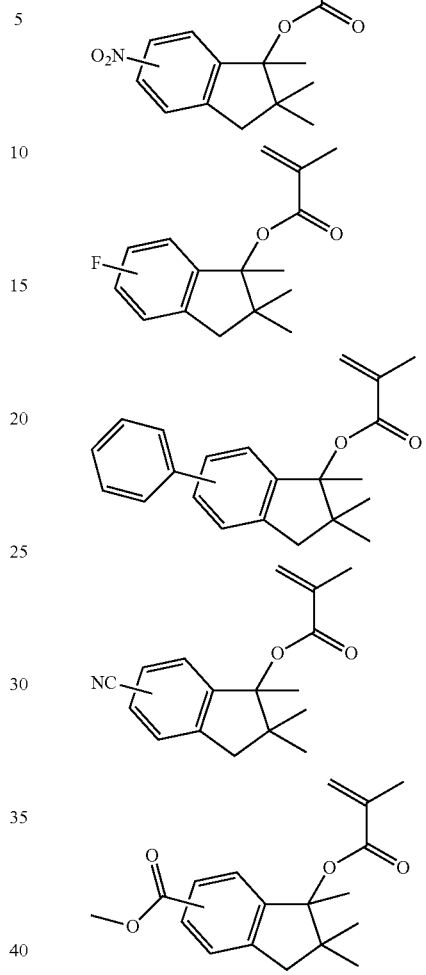

In the recurring unit (a1), $R^{12}$ may be an acid labile group having the general formula (A-3)-26.

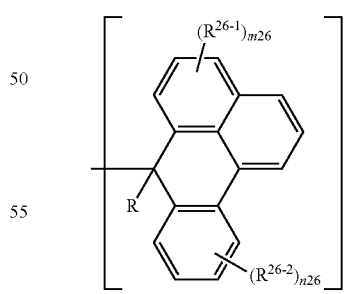

(A-3)-26

Herein $R^{26-1}$ and $R^{26-2}$ each are hydrogen, $C_1$-$C_4$ alkyl, alkoxy, alkanoyl, alkoxycarbonyl, hydroxyl, nitro, $C_6$-$C_{10}$ aryl, halogen, or cyano group; R is as defined above in formula (A-3)-24; and m26 and n26 each are an integer of 1 to 4.

Examples of the monomer from which recurring units (a1) substituted with an acid labile group of formula (A-3)-26 are derived are given below.

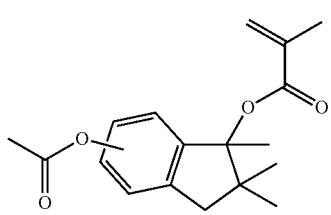

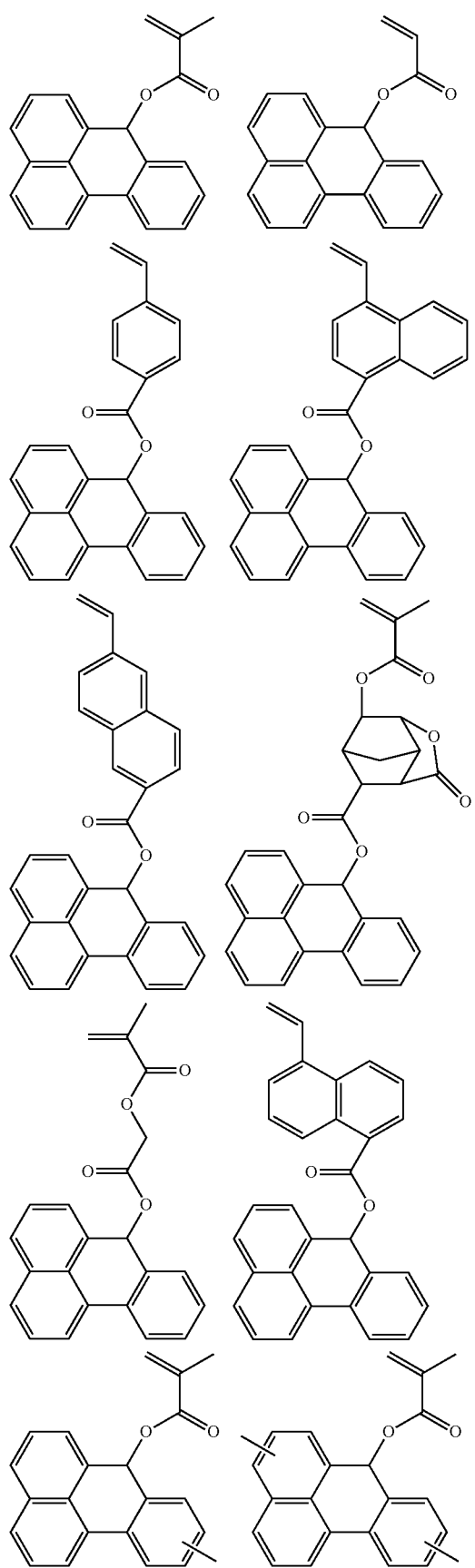
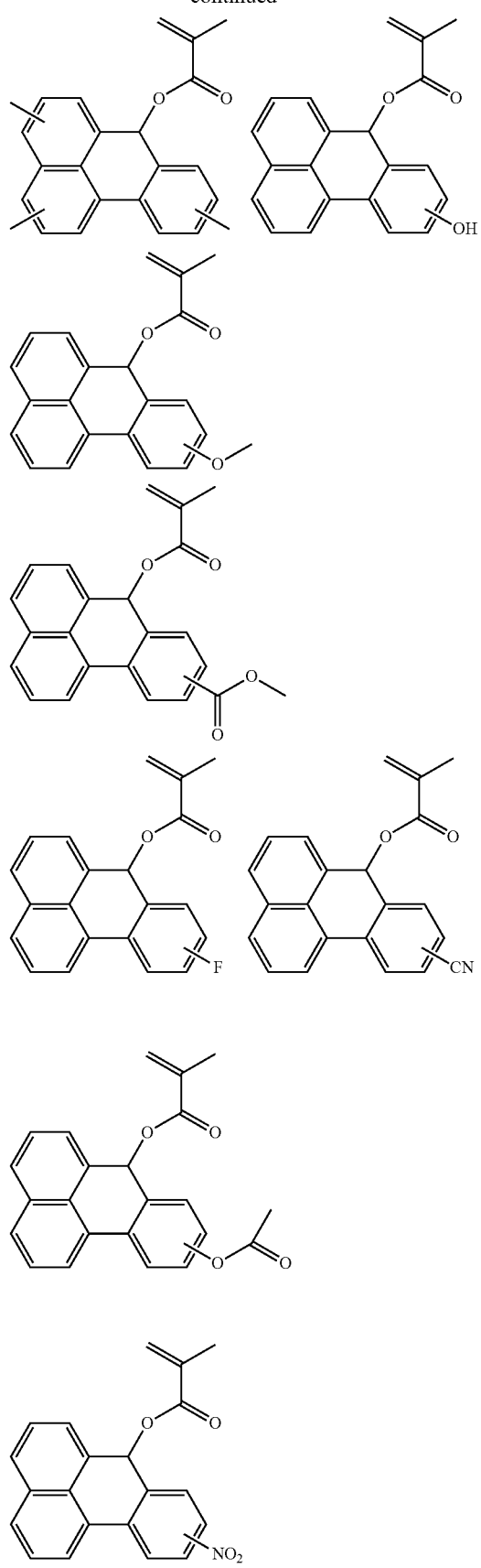
-continued

-continued
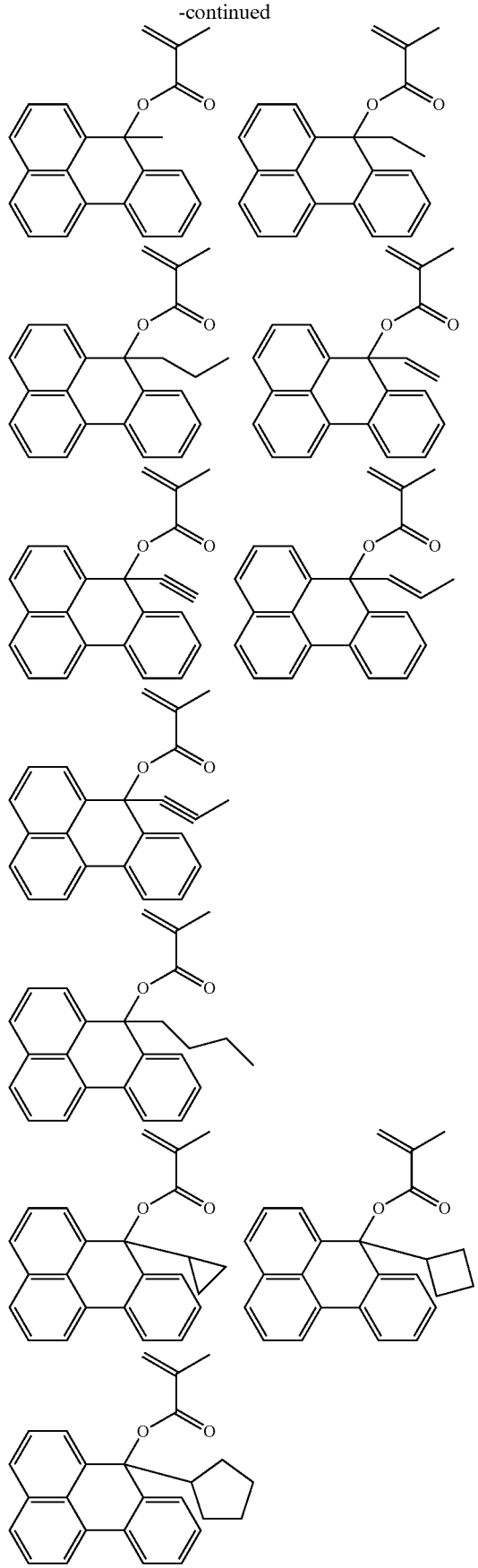
-continued
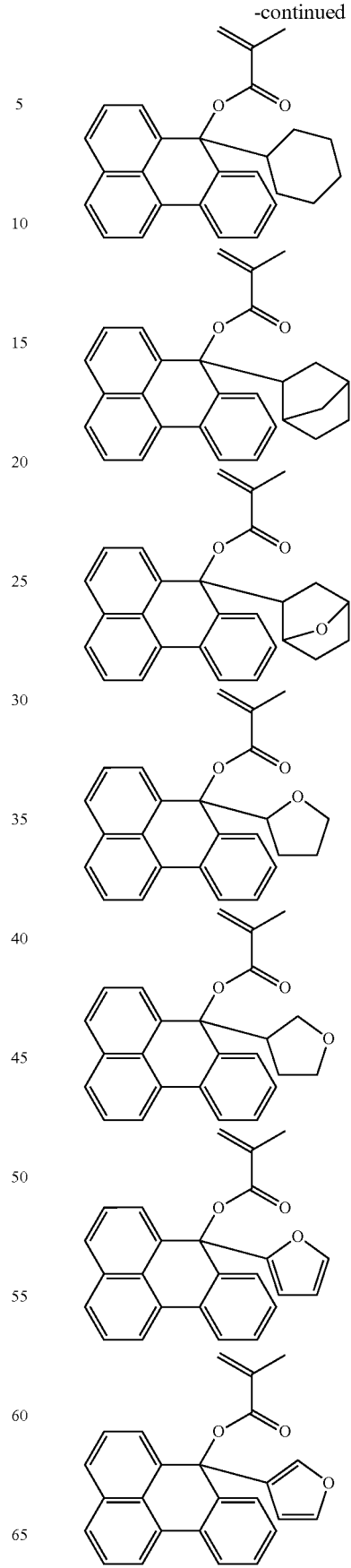

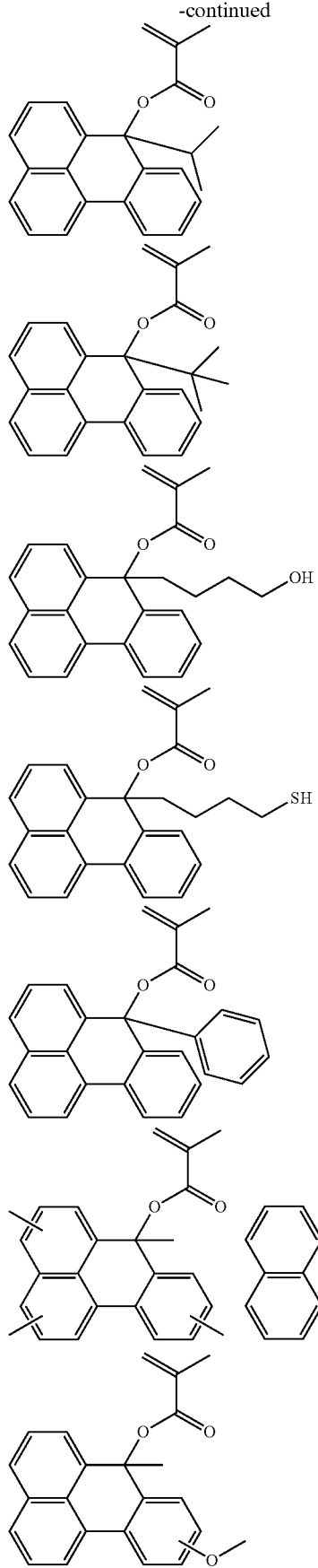
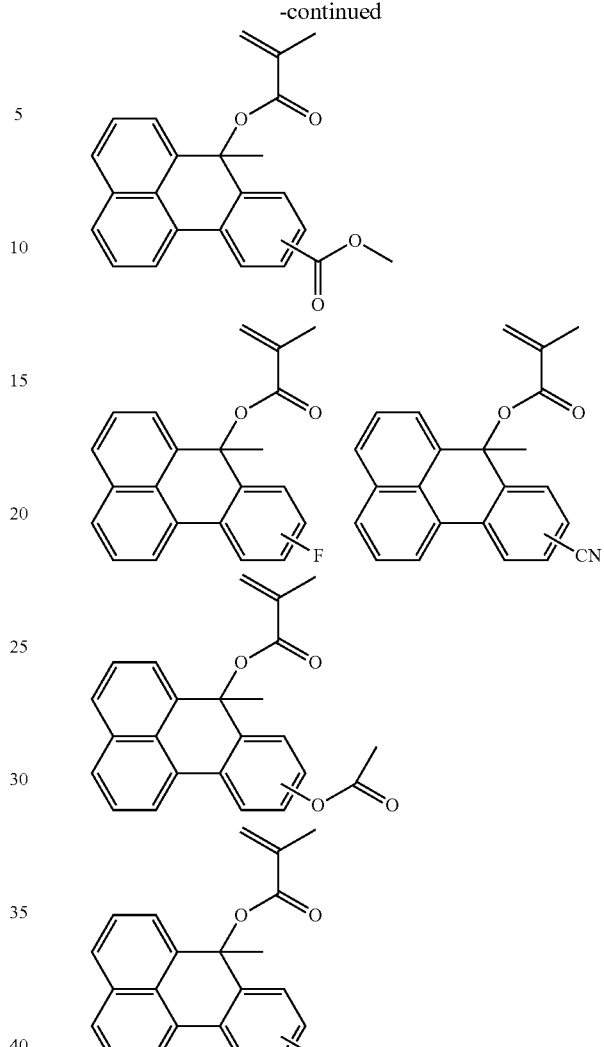

In the recurring unit (a1), $R^{12}$ may be an acid labile group having the general formula (A-3)-27.

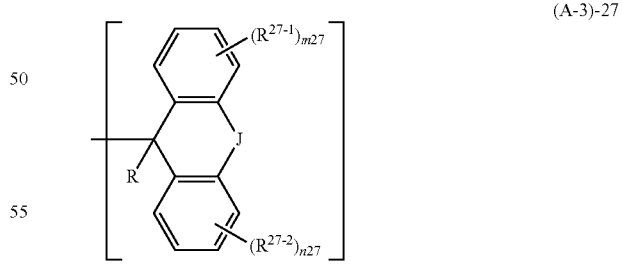

Herein $R^{27-1}$ and $R^{27-2}$ each are hydrogen, $C_1$-$C_4$ alkyl, alkoxy, alkanoyl, alkoxycarbonyl, hydroxyl, $C_6$-$C_{10}$ aryl, halogen, or cyano group; R is as defined above in formula (A-3)-24; J is methylene, ethylene, vinylene or —$CH_2$—S—; and m27 and n27 each are an integer of 1 to 4.

Examples of the monomer from which recurring units (a1) substituted with an acid labile group of formula (A-3)-27 are derived are given below.

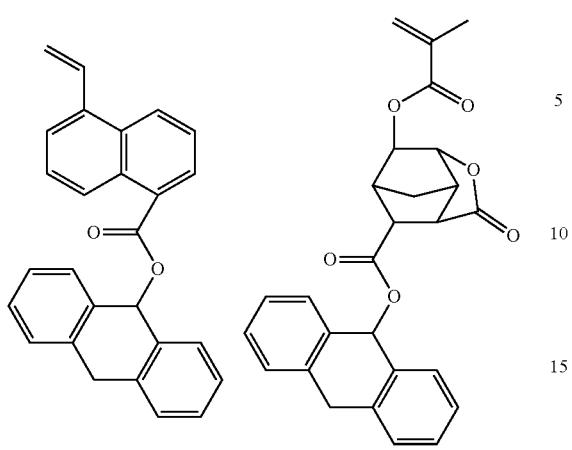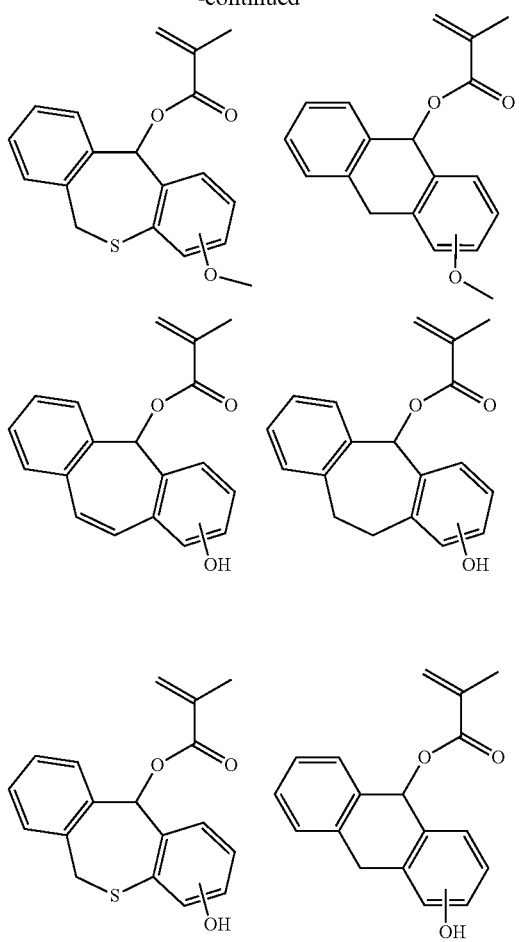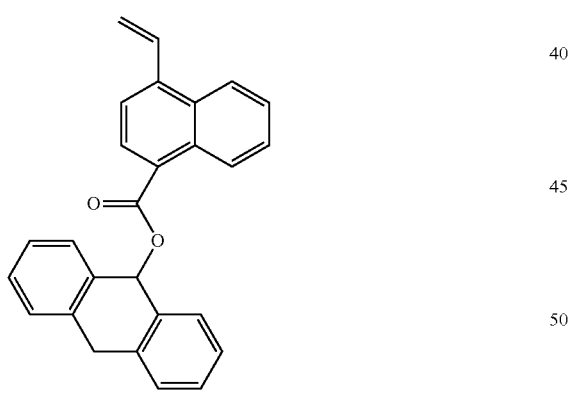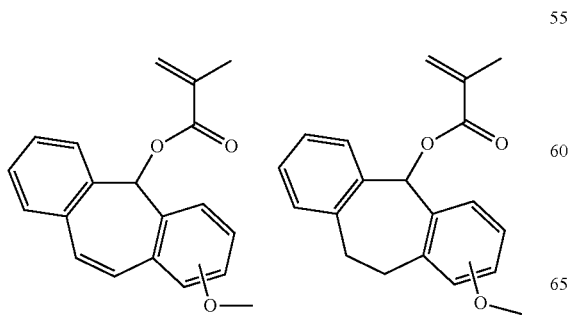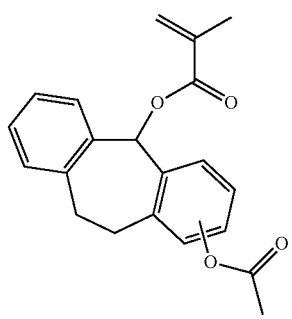

-continued
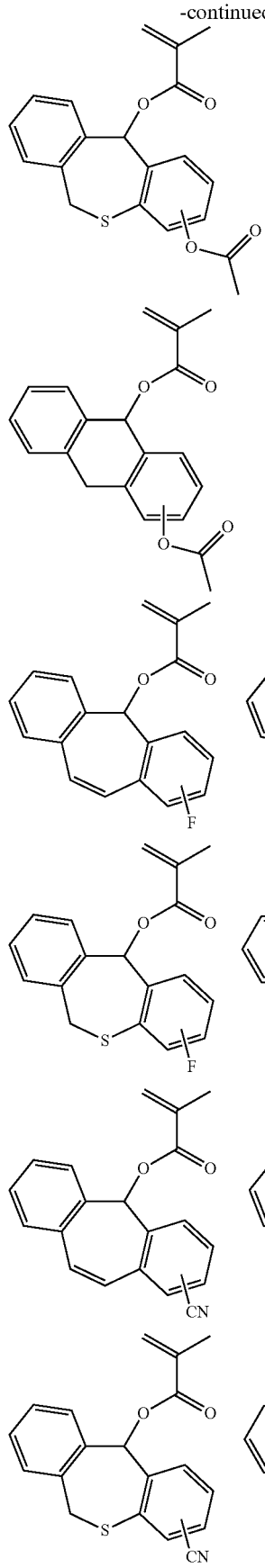
-continued
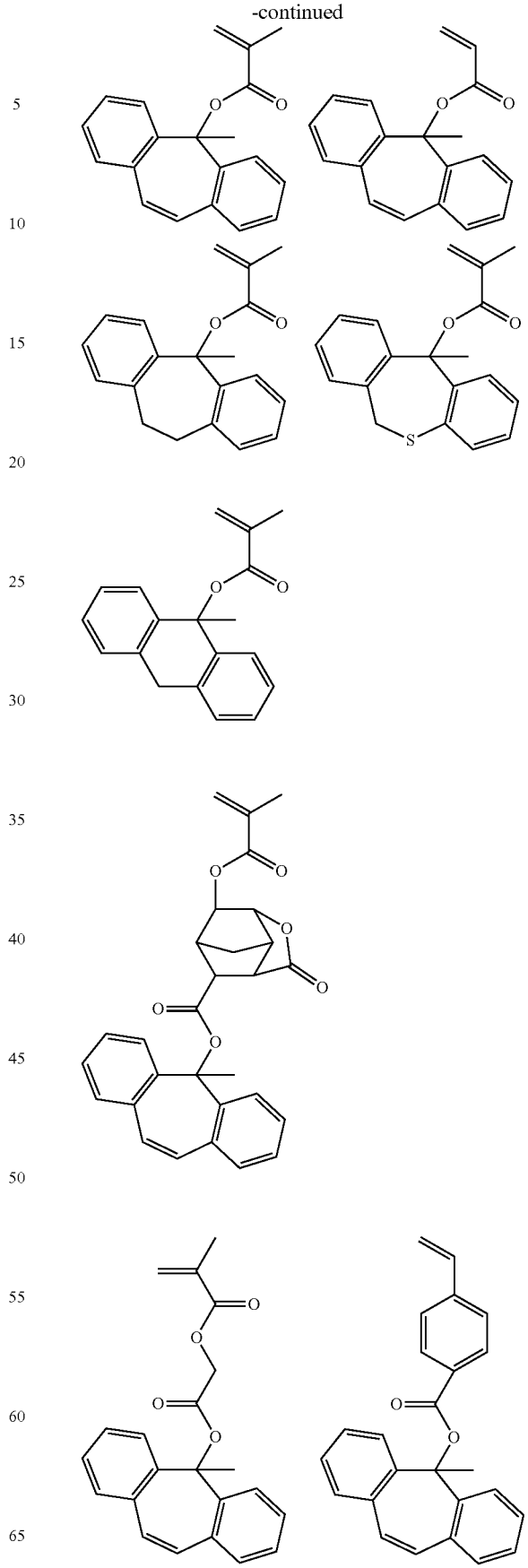

73
-continued
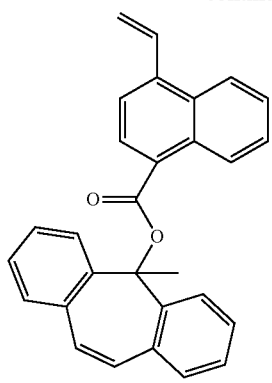
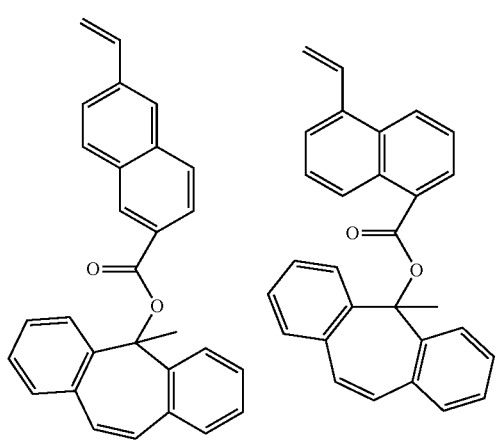
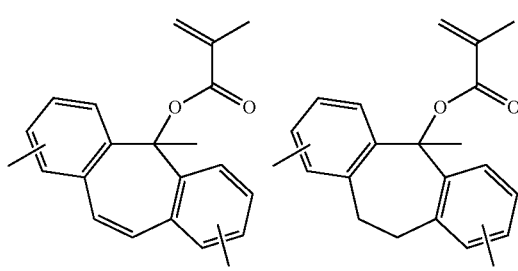
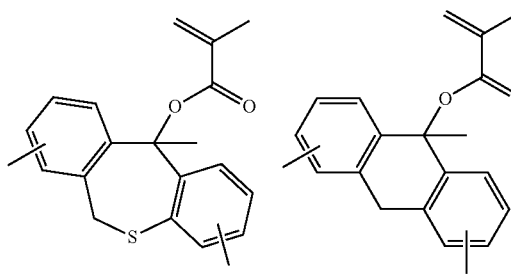
74
-continued
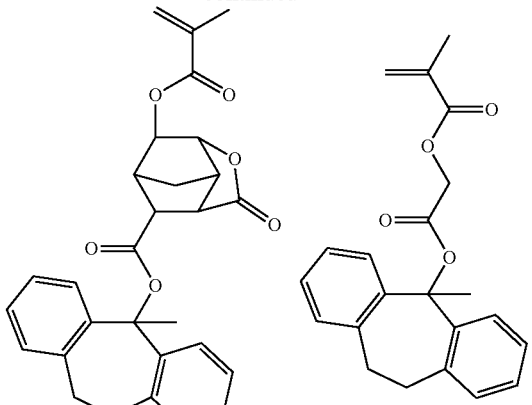
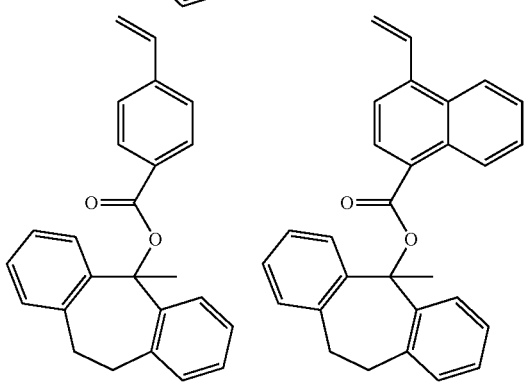
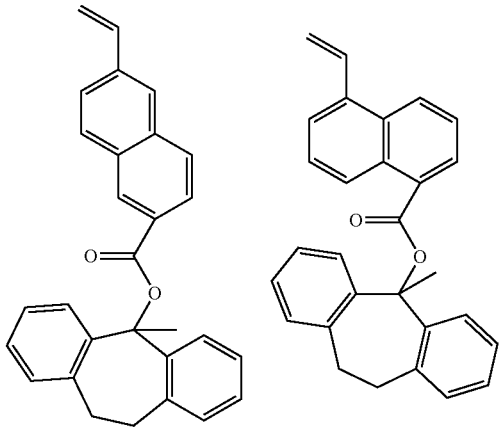
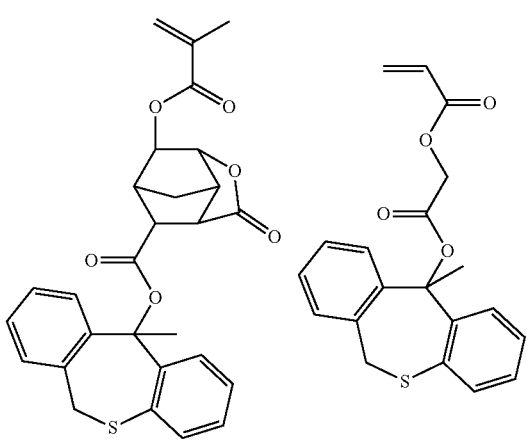

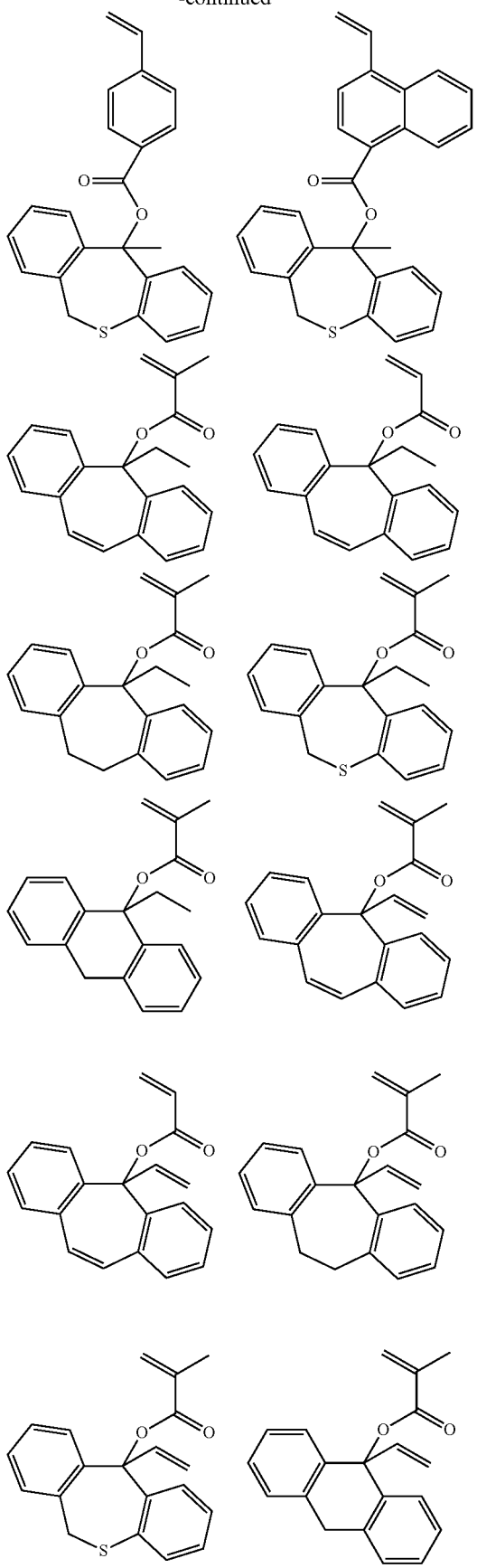
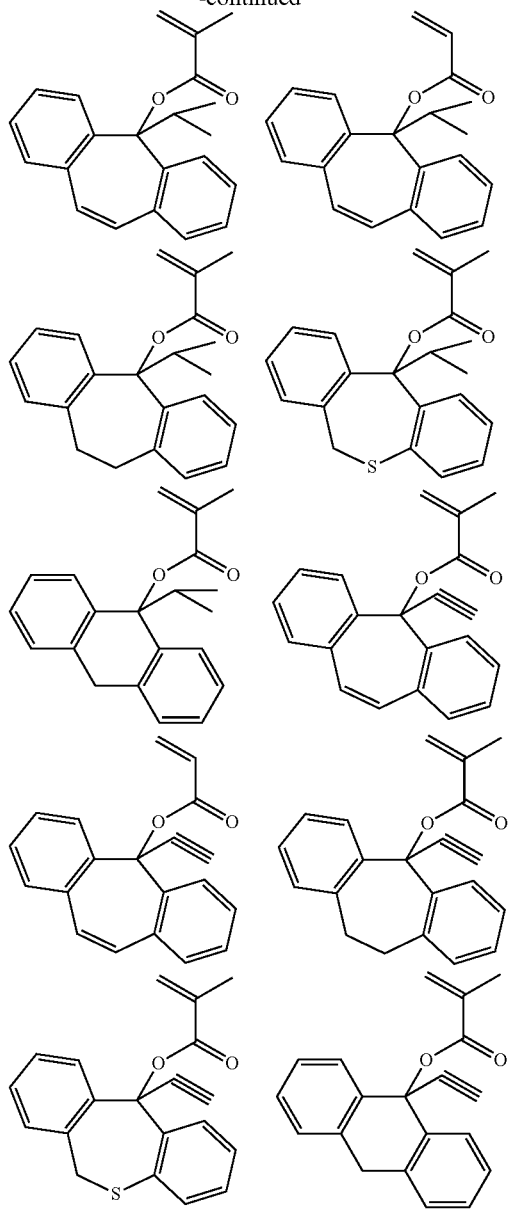
In the recurring unit (a1), $R^{12}$ may be an acid labile group having the general formula (A-3)-28.
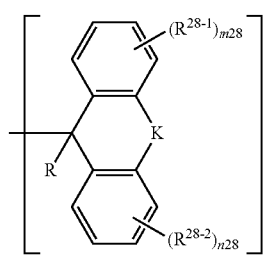
(A-3)-28
Herein $R^{28-1}$ and $R^{28-2}$ each are hydrogen, $C_1$-$C_4$ alkyl, alkoxy, alkanoyl, alkoxycarbonyl, hydroxyl, $C_6$-$C_{10}$ aryl, halogen, or cyano group; R is as defined above in formula (A-3)-24; K is carbonyl, ether, sulfide, —S(=O)— or —S(=O)$_2$—; and m28 and n28 each are an integer of 1 to 4.
Examples of the monomer from which recurring units (a1) substituted with an acid labile group of formula (A-3)-28 are derived are given below.
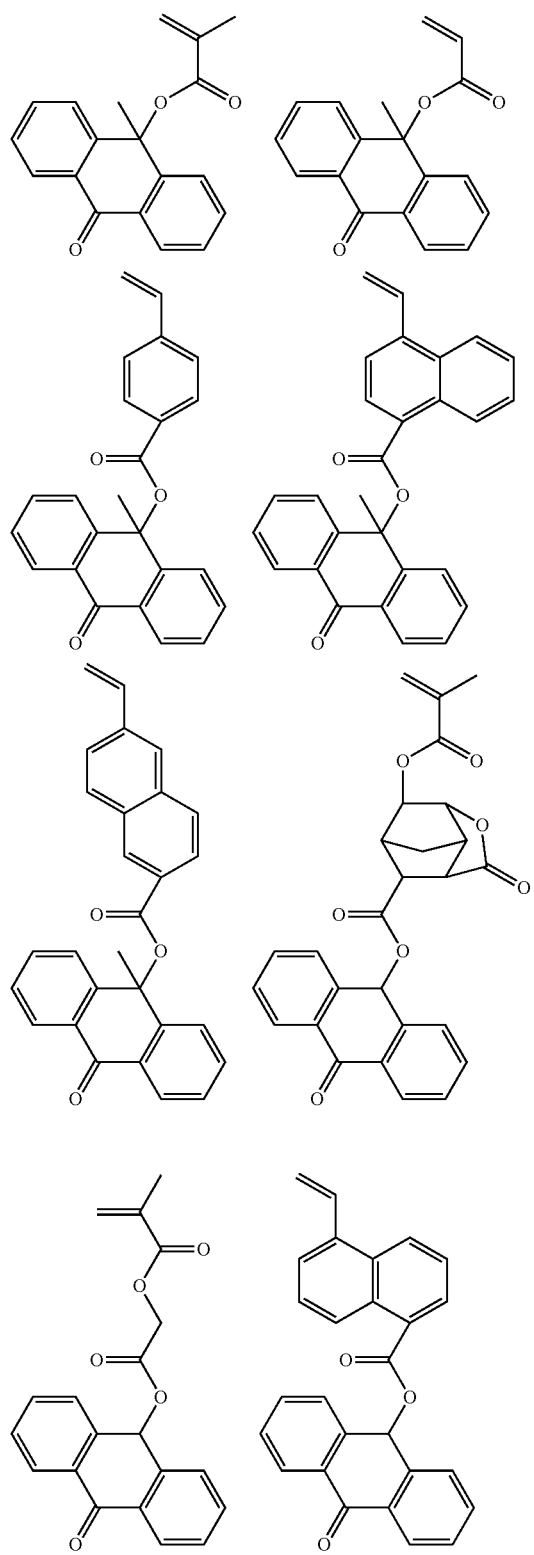
-continued
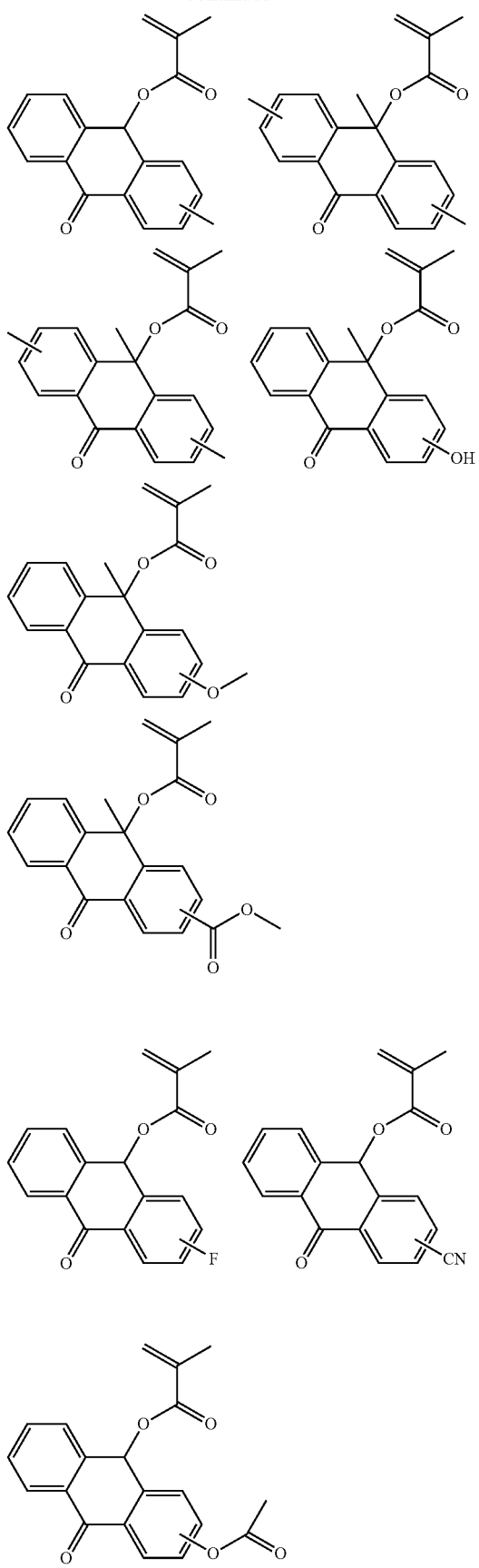

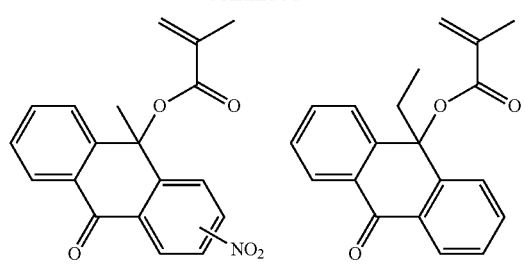
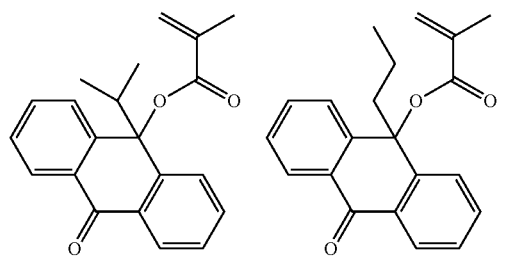
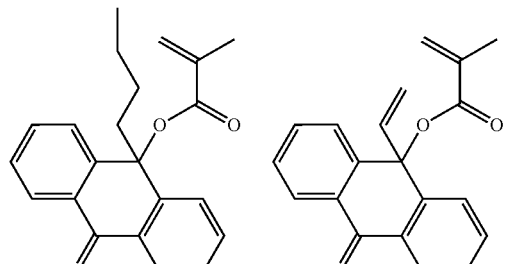
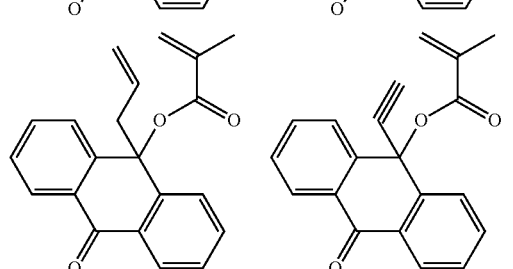
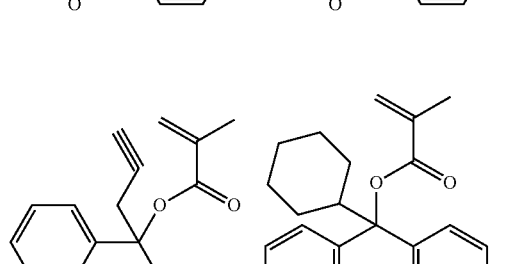
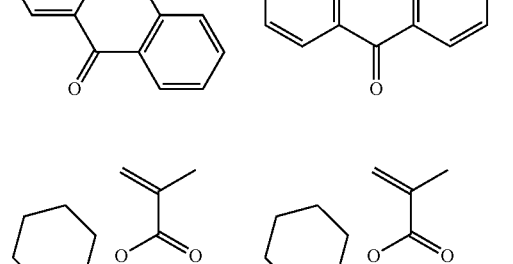
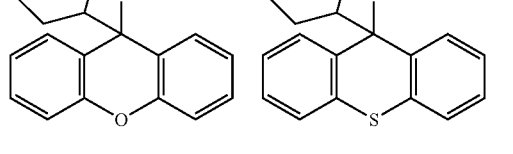
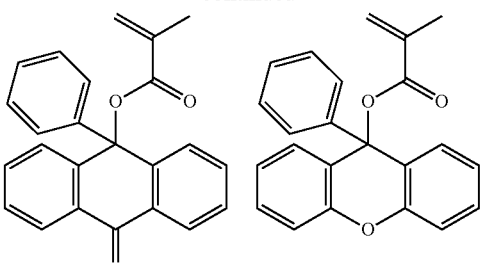
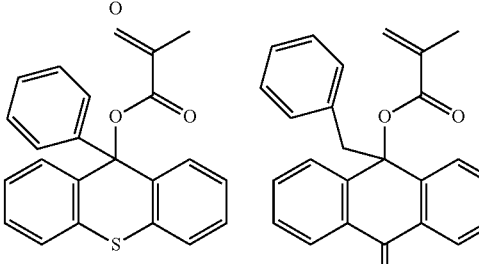
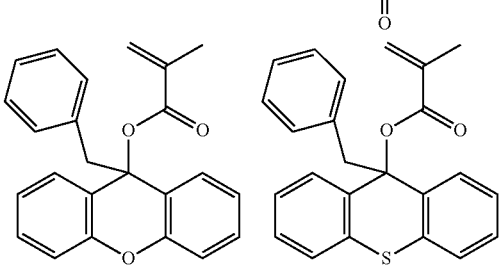
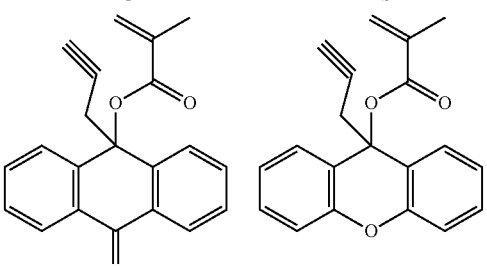
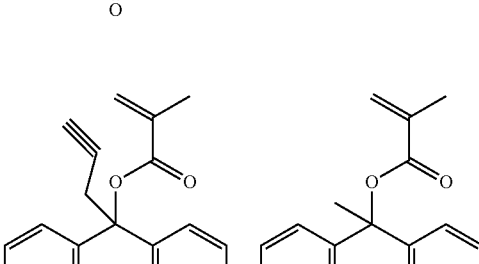
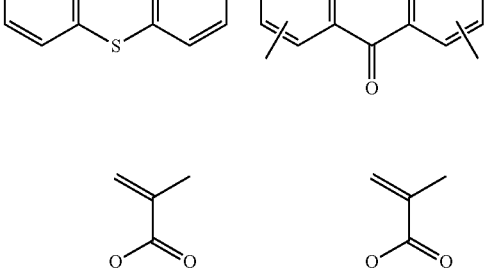
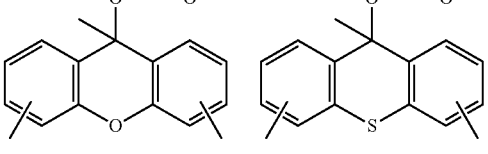

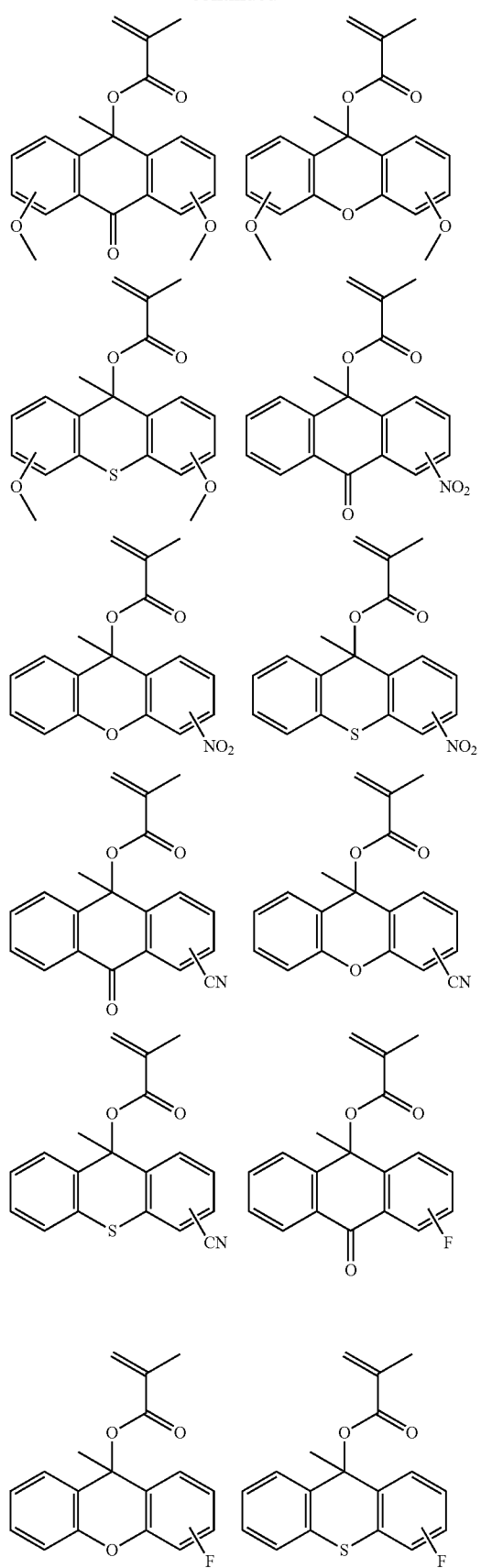
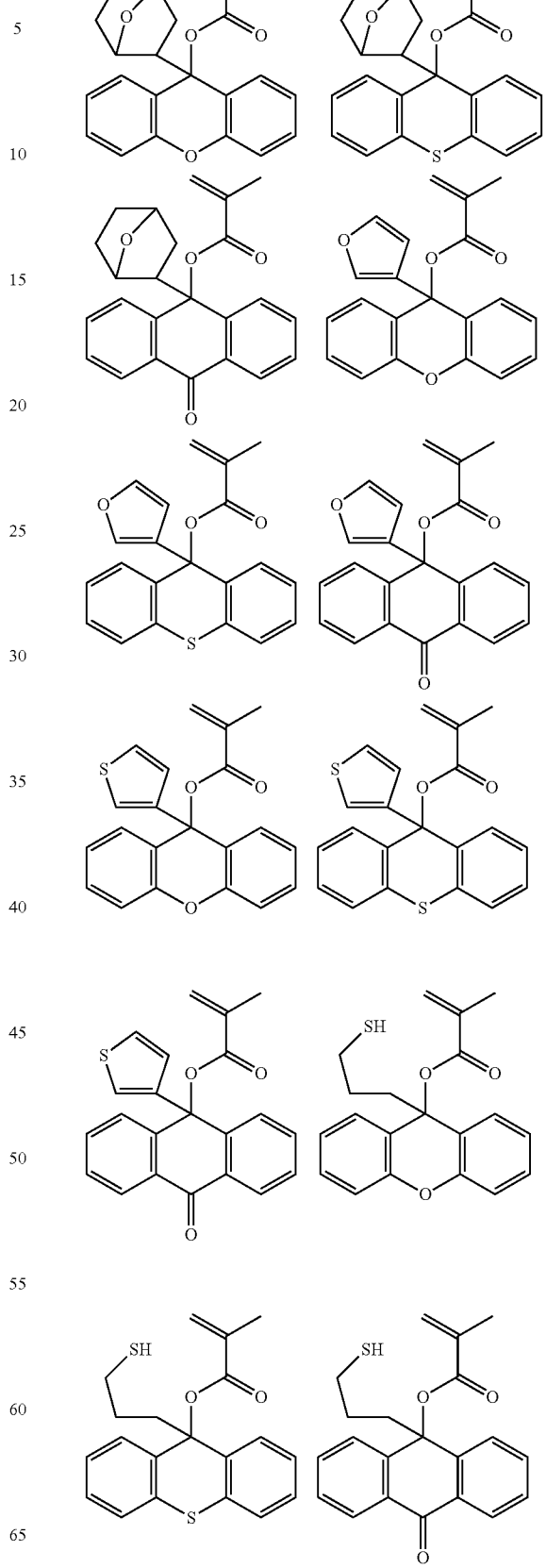

-continued

-continued
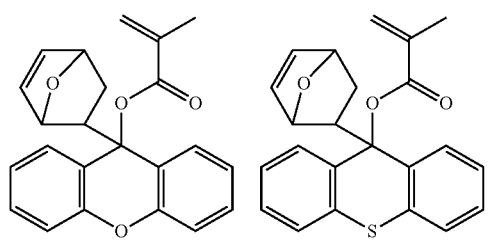
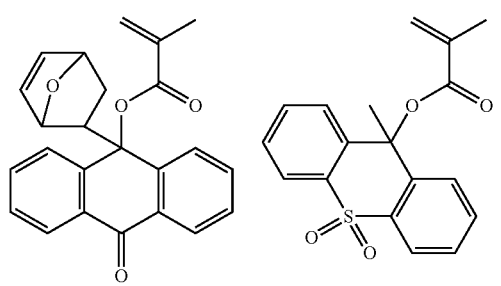
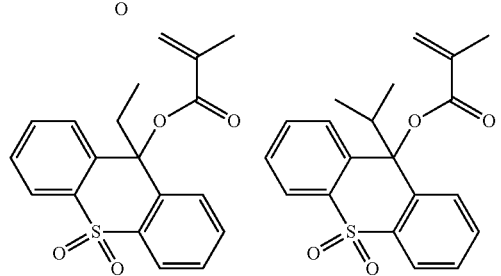
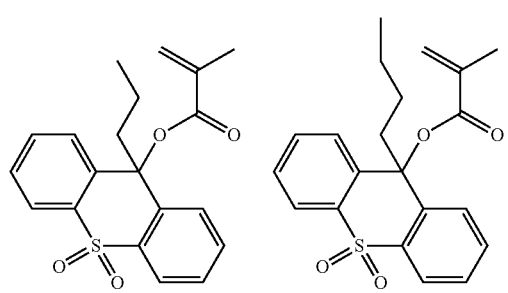
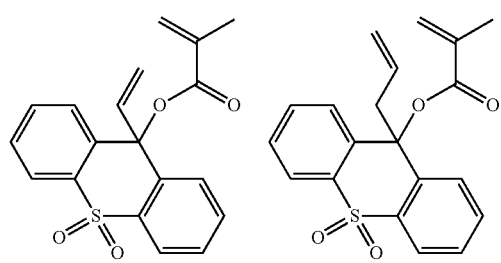
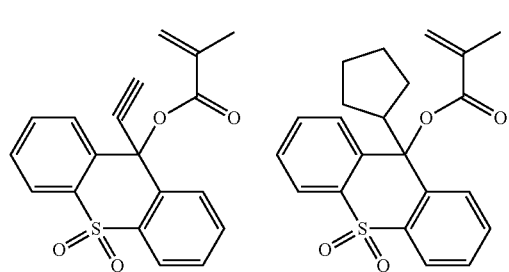
-continued
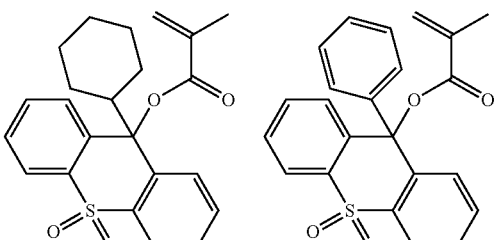
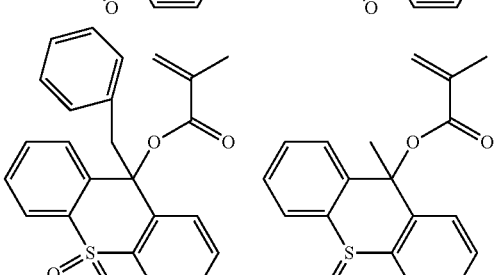
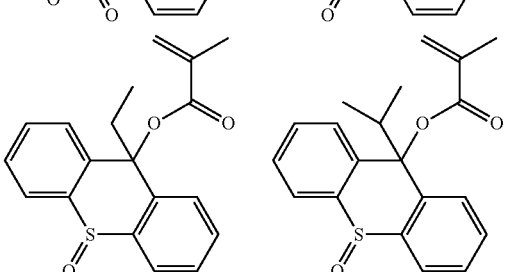
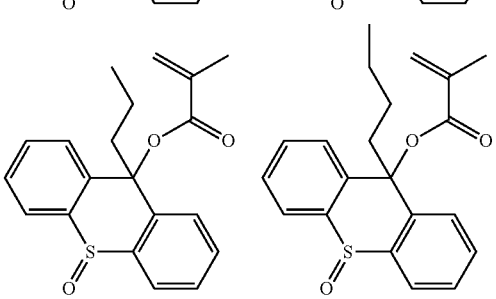
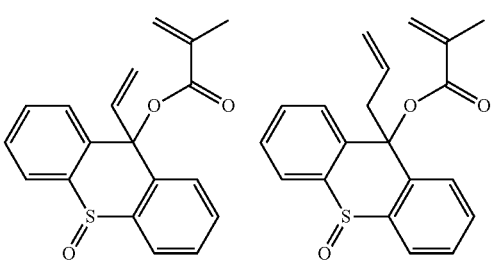
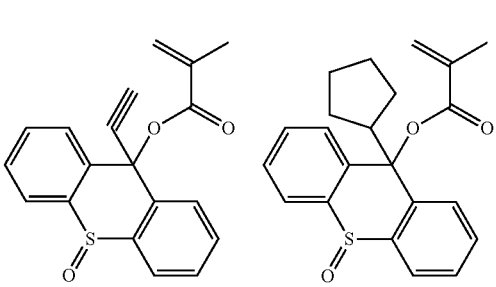

-continued

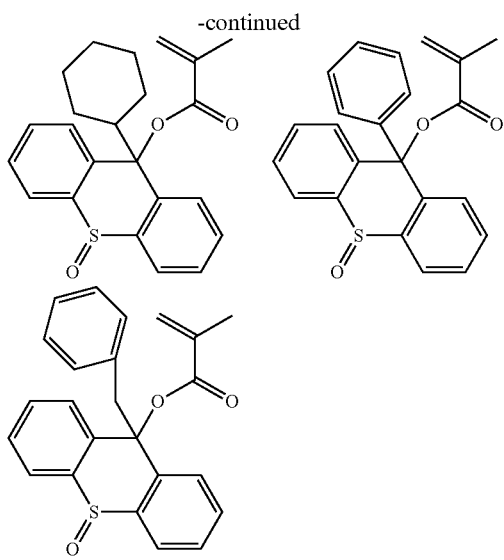

In a preferred embodiment, the polymer may have copolymerized therein recurring units (b1), (b2) or (b3) having a sulfonium salt, represented by the following formula (3). A resist composition comprising such a polymer having an acid generator bound to its main chain as base resin has the advantage that the pattern obtained after development has a reduced edge roughness (LWR).

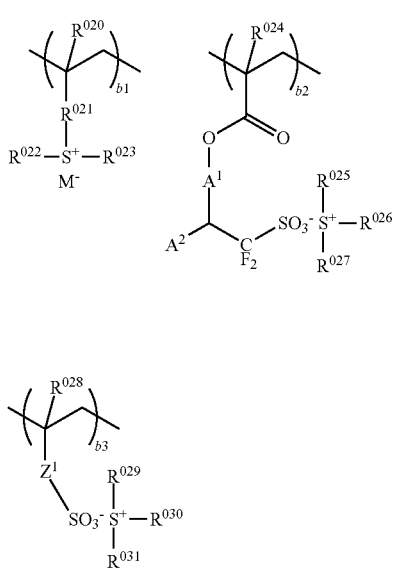

(3)

Herein $R^{020}$, $R^{024}$, and $R^{028}$ each are hydrogen or methyl. $R^{021}$ is a single bond, phenylene, —O—$R^{033}$—, or —C(=O)—Y—$R^{033}$—, wherein Y is oxygen or NH, and $R^{033}$ is a straight, branched or cyclic $C_1$-$C_6$ alkylene group, alkenylene or phenylene group, which may contain a carbonyl (—CO—), ester (—COO—), ether (—O—) or hydroxyl moiety. $R^{022}$, $R^{023}$, $R^{025}$, $R^{026}$, $R^{027}$, $R^{029}$, $R^{030}$, and $R^{031}$ are each independently a straight, branched or cyclic $C_1$-$C_{12}$ alkyl group which may contain a carbonyl, ester or ether moiety, or a $C_6$-$C_{12}$ aryl, $C_7$-$C_{20}$ aralkyl, or thiophenyl group. $A^1$ is a single bond, -$A^0$-C(=O)—O—, -$A^0$-O— or -$A^0$-O—C(=O)—, wherein $A^0$ is a straight, branched or cyclic $C_1$-$C_{12}$ alkylene group which may contain a carbonyl, ester or ether moiety. $A^2$ is hydrogen, $CF_3$ or carbonyl. $Z^1$ is a single bond, methylene, ethylene, phenylene, fluorophenylene, —O—$R^{032}$—, or —C(=O)—$Z^2$—$R^{032}$—, wherein $Z^2$ is oxygen or NH, and $R^{032}$ is a straight, branched or cyclic $C_1$-$C_6$ alkylene, phenylene, fluorophenylene, trifluoromethyl-substituted phenylene or alkenylene group, which may contain a carbonyl, ester, ether or hydroxyl moiety. $M^-$ is a non-nucleophilic counter ion. Molar fractions b1, b2 and b3 are in the range of $0 \leq b1 \leq 0.3$, $0 \leq b2 \leq 0.3$, $0 \leq b3 \leq 0.3$, and $0 \leq b1+b2+b3 \leq 0.3$.

Examples of the monomer from which sulfonium salt-containing recurring units (b1) in formula (3) are derived are given below.

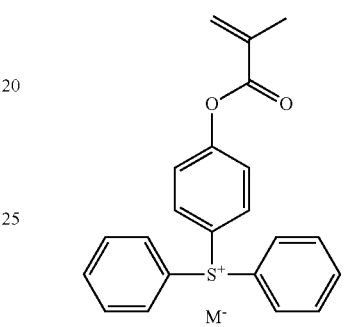

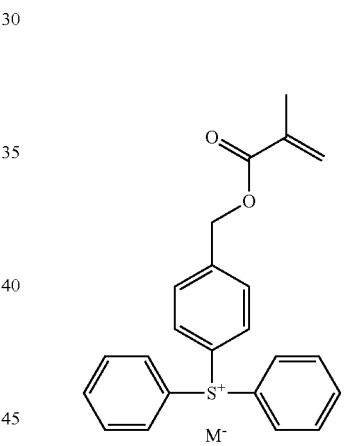

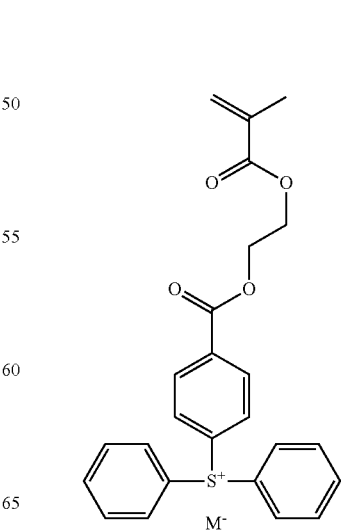

89
-continued
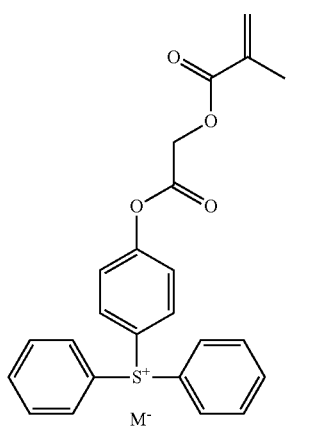
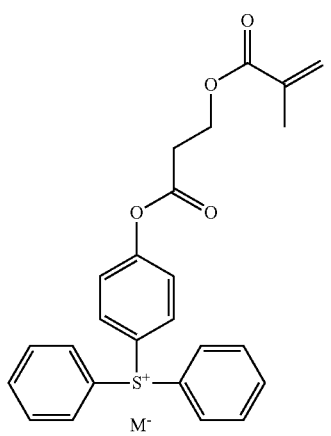
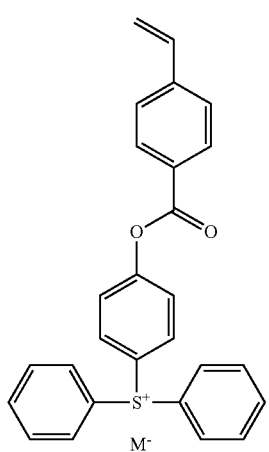
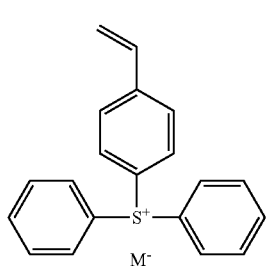
90
-continued
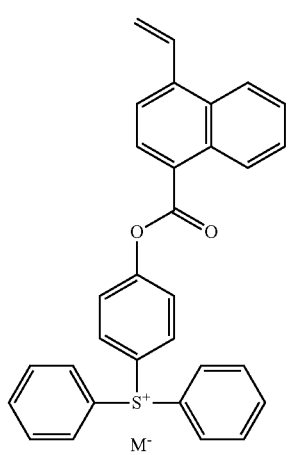

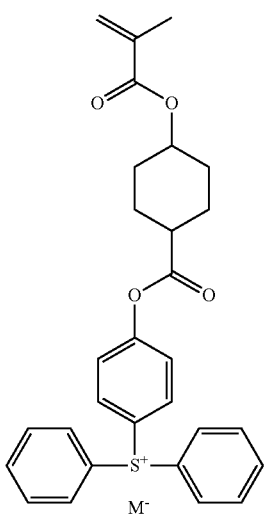

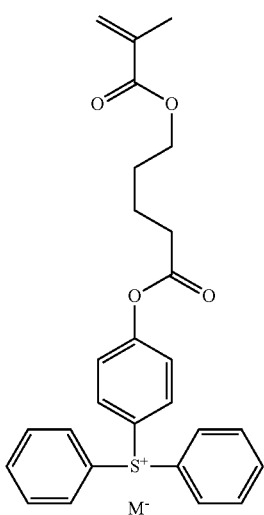

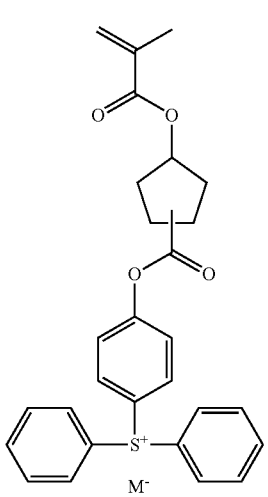

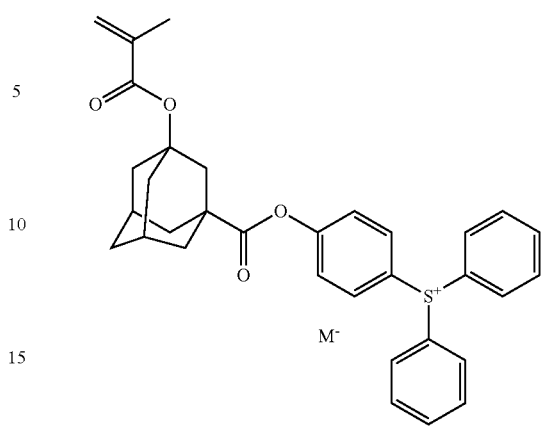

Herein M⁻ is a non-nucleophilic counter ion.

Examples of the non-nucleophilic counter ion represented by M⁻ include halide ions such as chloride and bromide ions; fluoroalkylsulfonate ions such as triflate, 1,1,1-trifluoroethanesulfonate, and nonafluorobutanesulfonate; arylsulfonate ions such as tosylate, benzenesulfonate, 4-fluorobenzenesulfonate, and 1,2,3,4,5-pentafluorobenzenesulfonate; alkylsulfonate ions such as mesylate and butanesulfonate; imidates such as bis(trifluoromethylsulfonyl)imide, bis(perfluoroethylsulfonyl)imide and bis(perfluorobutylsulfonyl)imide; methidates such as tris(trifluoromethylsulfonyl)methide and tris(perfluoroethylsulfonyl)methide.

Other non-nucleophilic counter ions include sulfonates having fluorine substituted at α-position as represented by the general formula (K-1) and sulfonates having fluorine substituted at α- and β-positions as represented by the general formula (K-2).

$$R^{102}-F_2C-SO_3^- \quad (K\text{-}1)$$

$$\begin{array}{c} R^{103}-O \\ \phantom{R^{103}-}\diagdown \\ \phantom{R^{103}-O}CH-F_2C-SO_3^- \\ \phantom{R^{103}-}\diagup \\ F_3C \end{array} \quad (K\text{-}2)$$

In formula (K-1), $R^{102}$ is hydrogen, or a straight, branched or cyclic $C_1$-$C_{20}$ alkyl group, $C_2$-$C_{20}$ alkenyl group, or $C_6$-$C_{20}$ aryl group, which may have an ether, ester, carbonyl moiety, lactone ring or fluorine. In formula (K-2), $R^{103}$ is hydrogen, or a straight, branched or cyclic $C_1$-$C_{30}$ alkyl or acyl group, $C_2$-$C_{20}$ alkenyl group, or $C_6$-$C_{20}$ aryl or aryloxy group, which may have an ether, ester, carbonyl moiety or lactone ring.

Examples of the monomer from which sulfonium salt-containing recurring units (b2) in formula (3) are derived are given below.

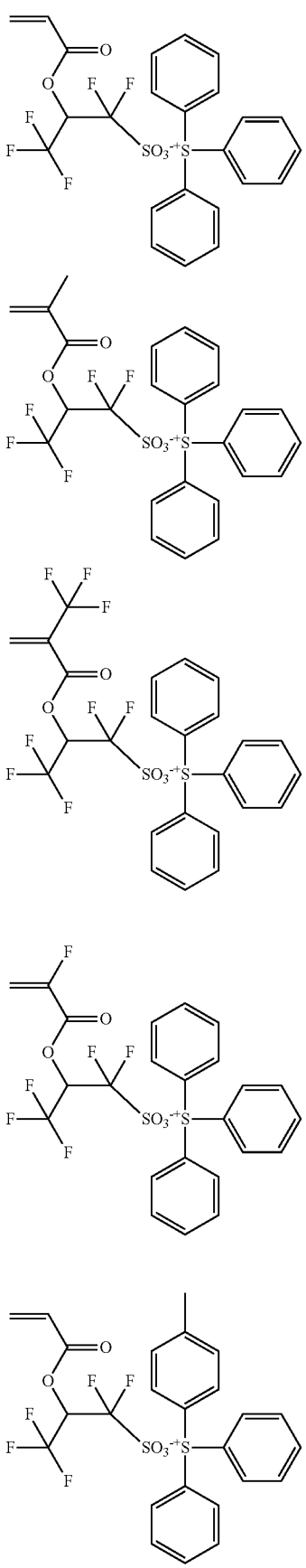
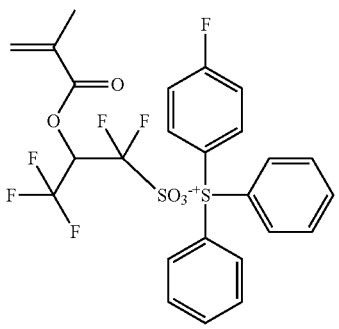
-continued
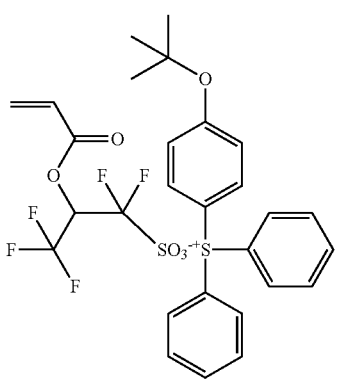
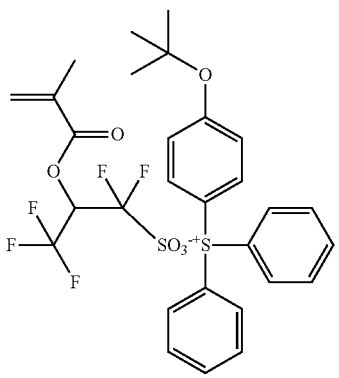
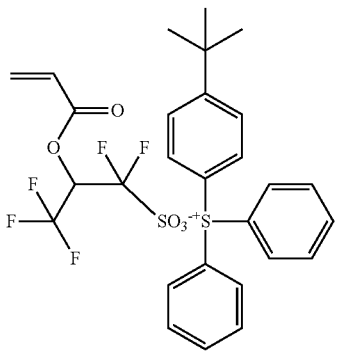

-continued
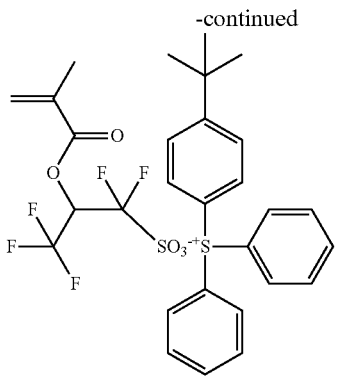
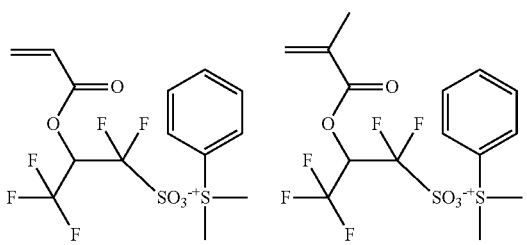
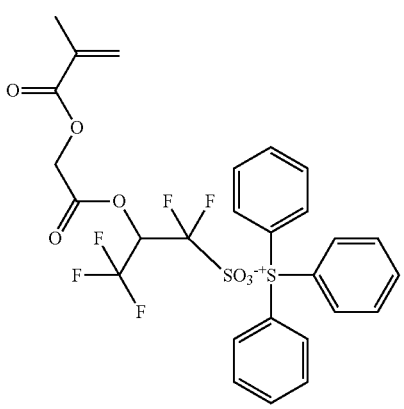
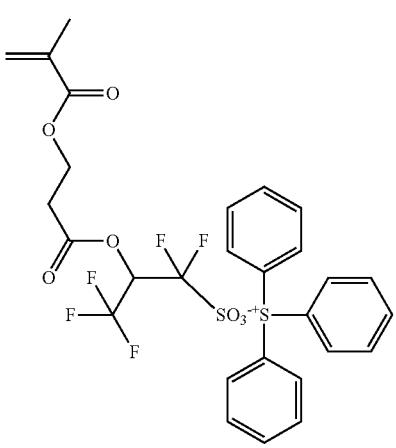
-continued
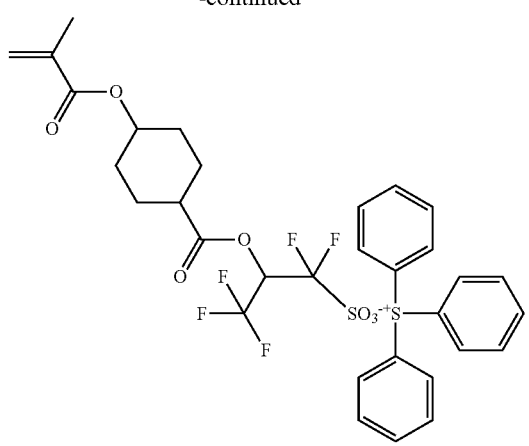
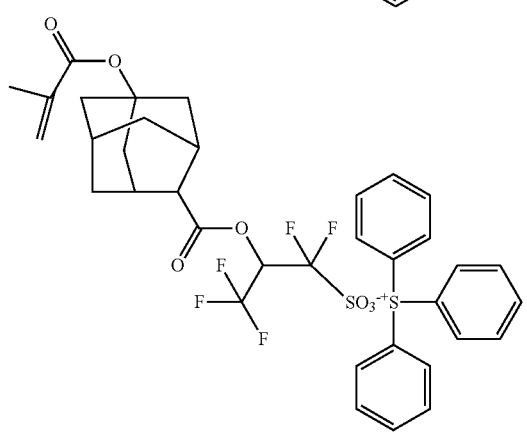
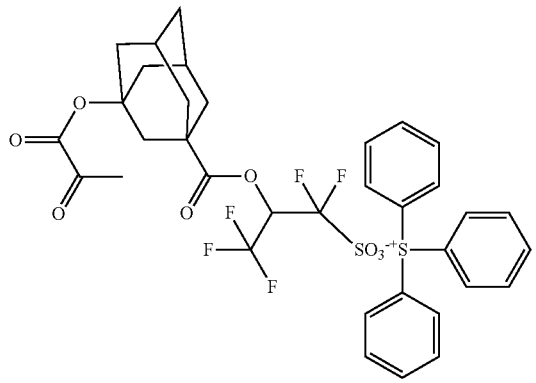
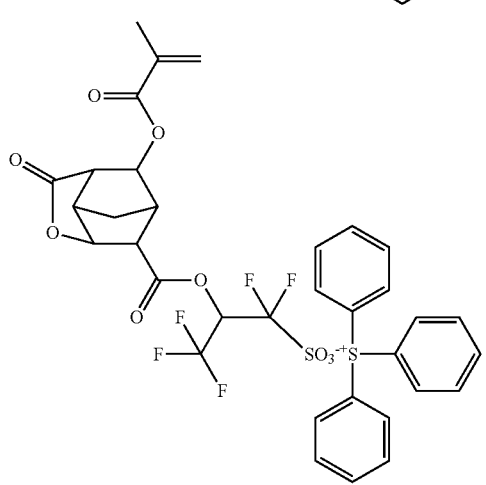

97
-continued
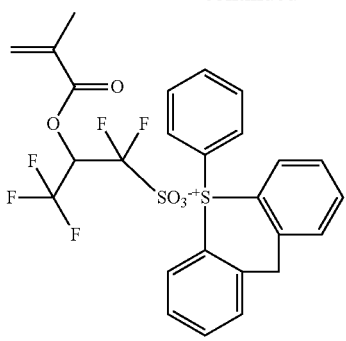
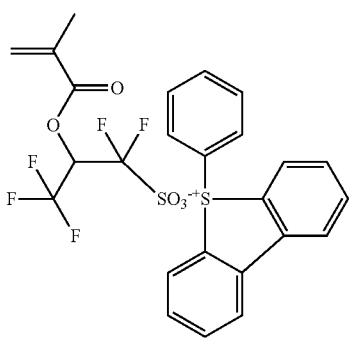
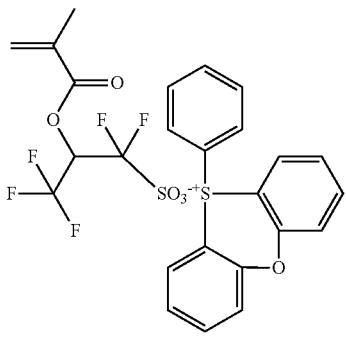
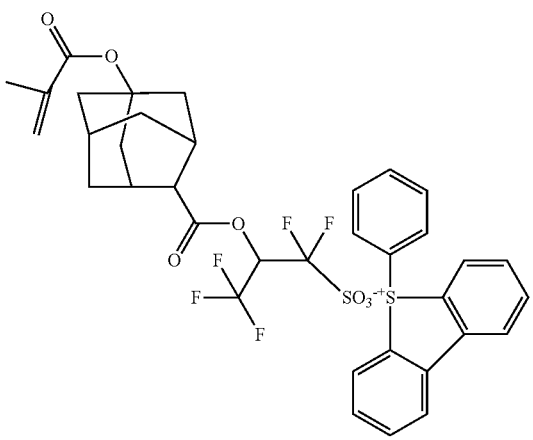
98
-continued
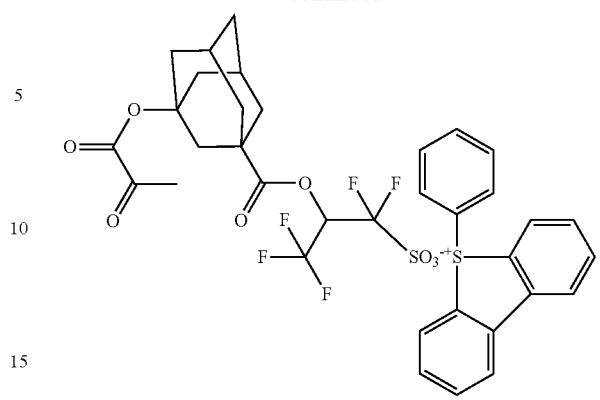
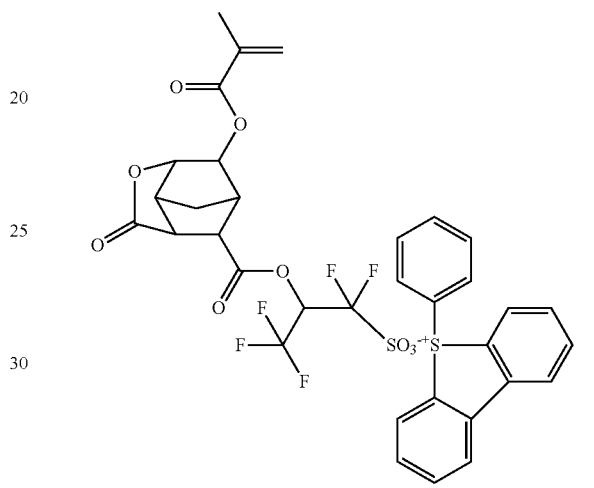
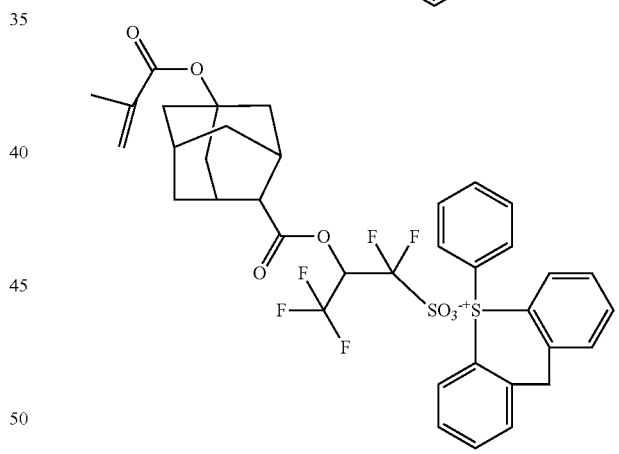
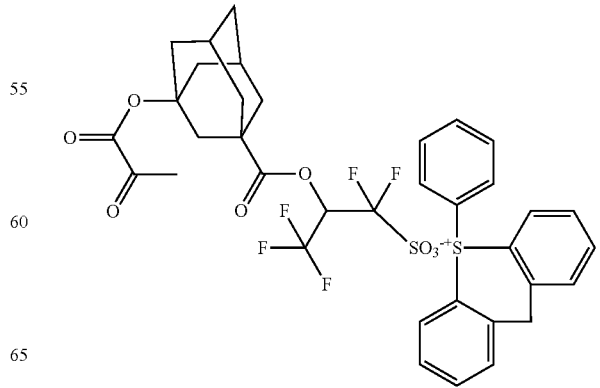

99
-continued
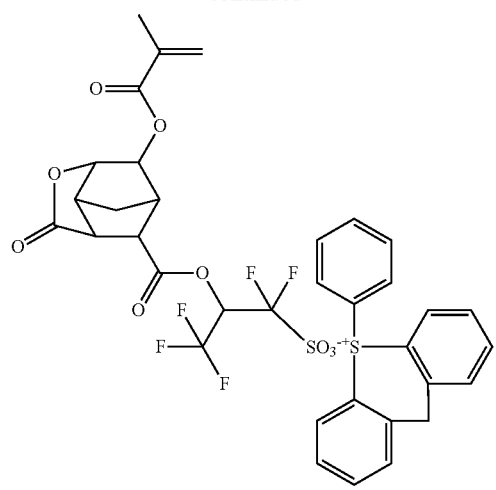
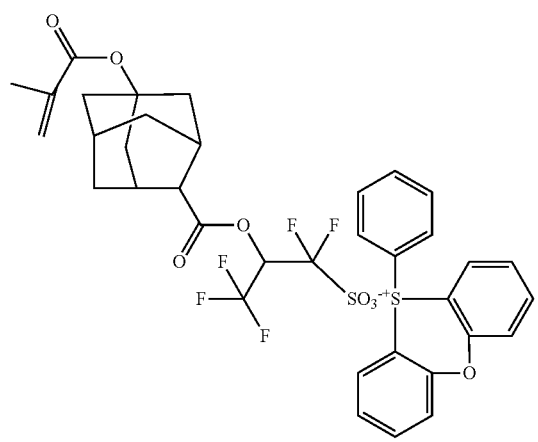
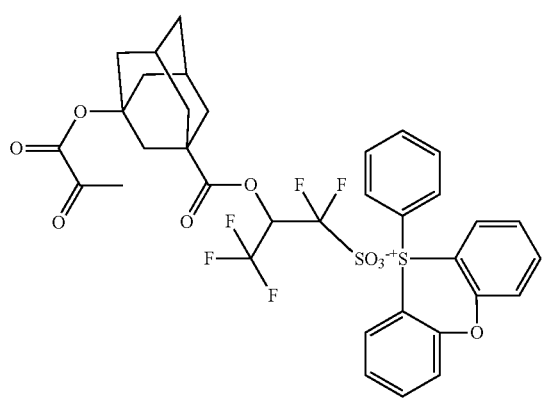
100
-continued
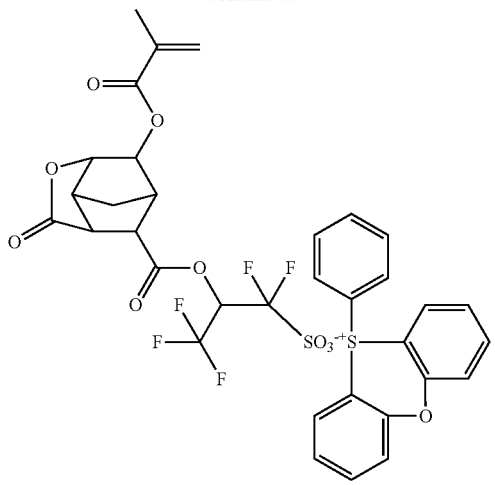
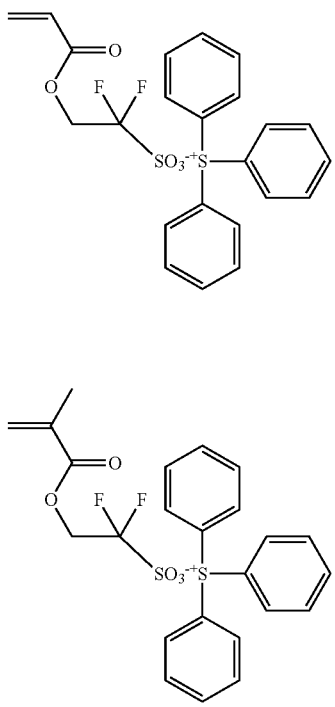
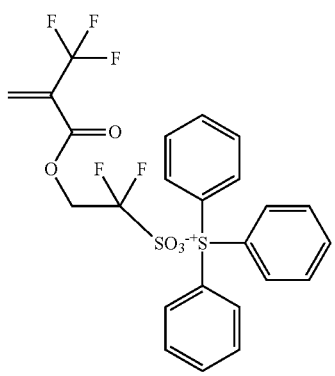

101
-continued
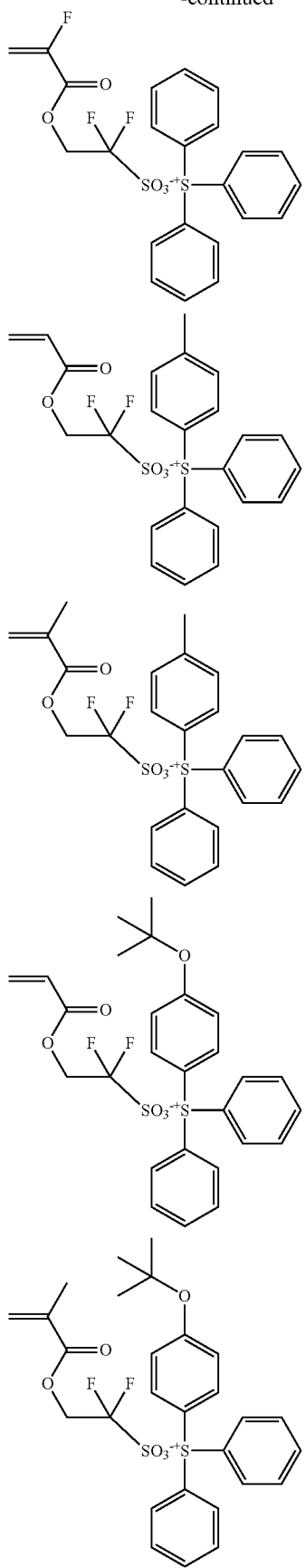
102
-continued
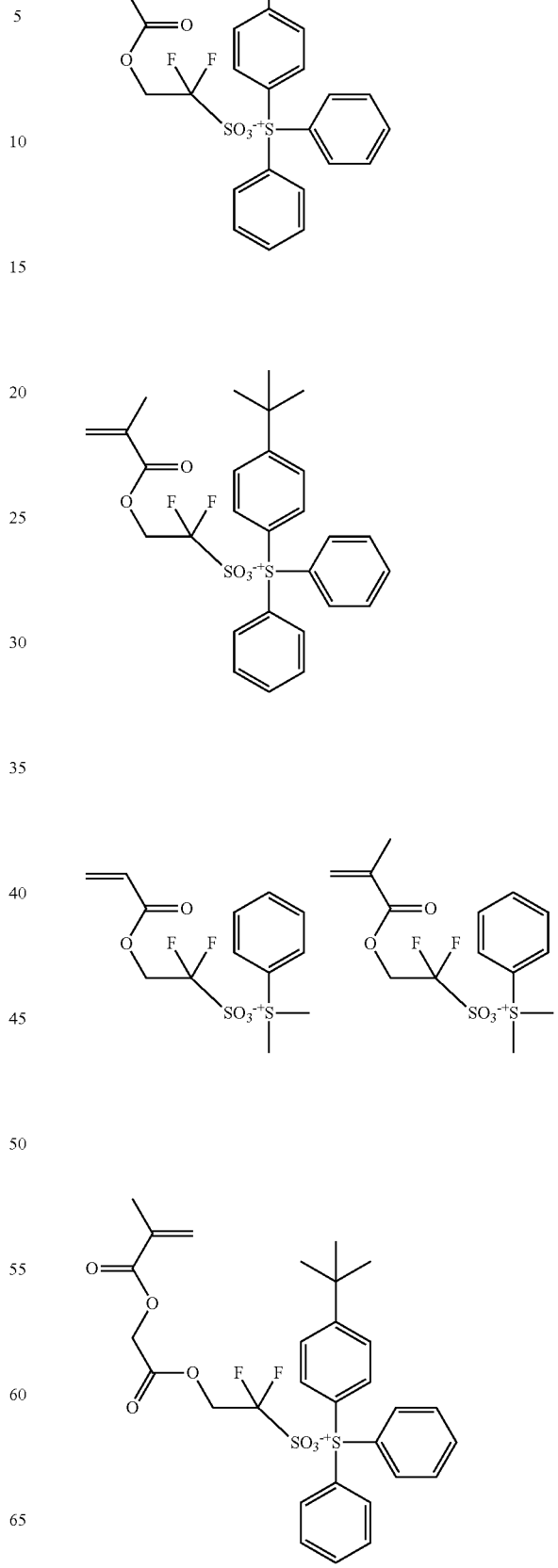

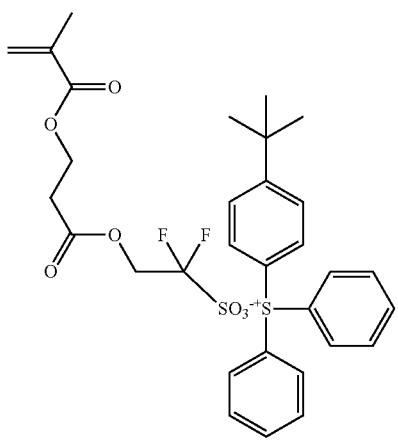
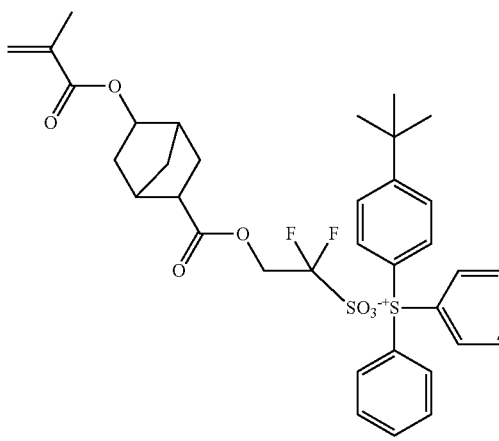
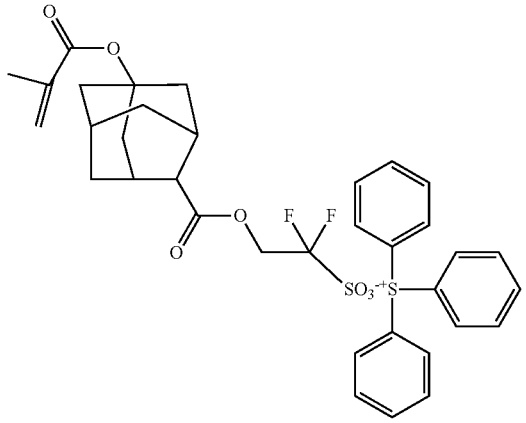
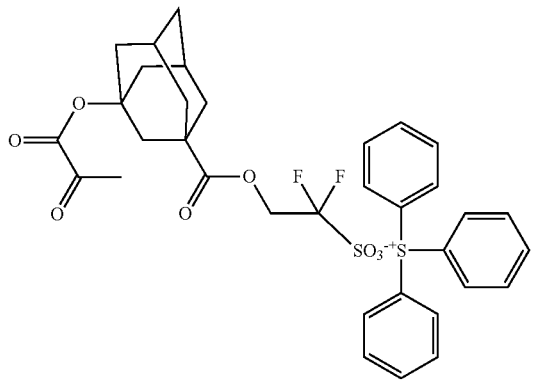
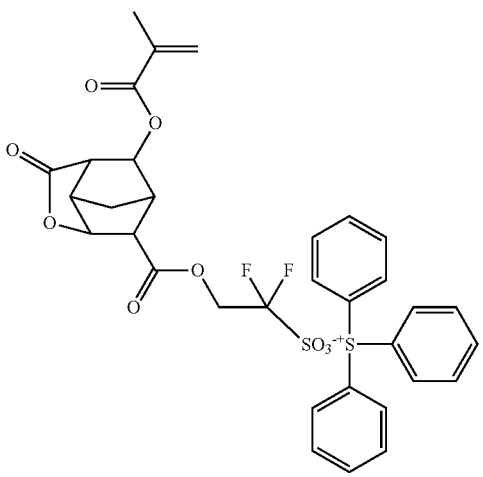
Examples of the monomer from which sulfonium salt-containing recurring units (b3) in formula (3) are derived are given below.
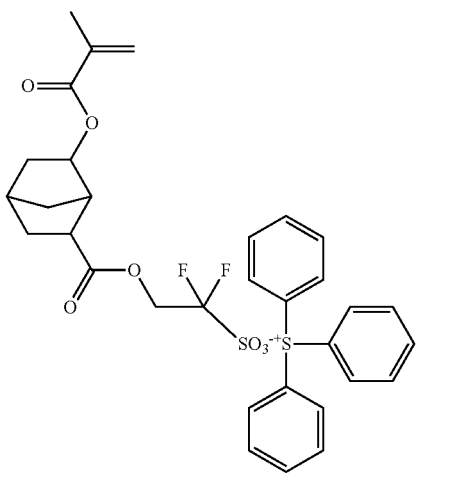

105
-continued
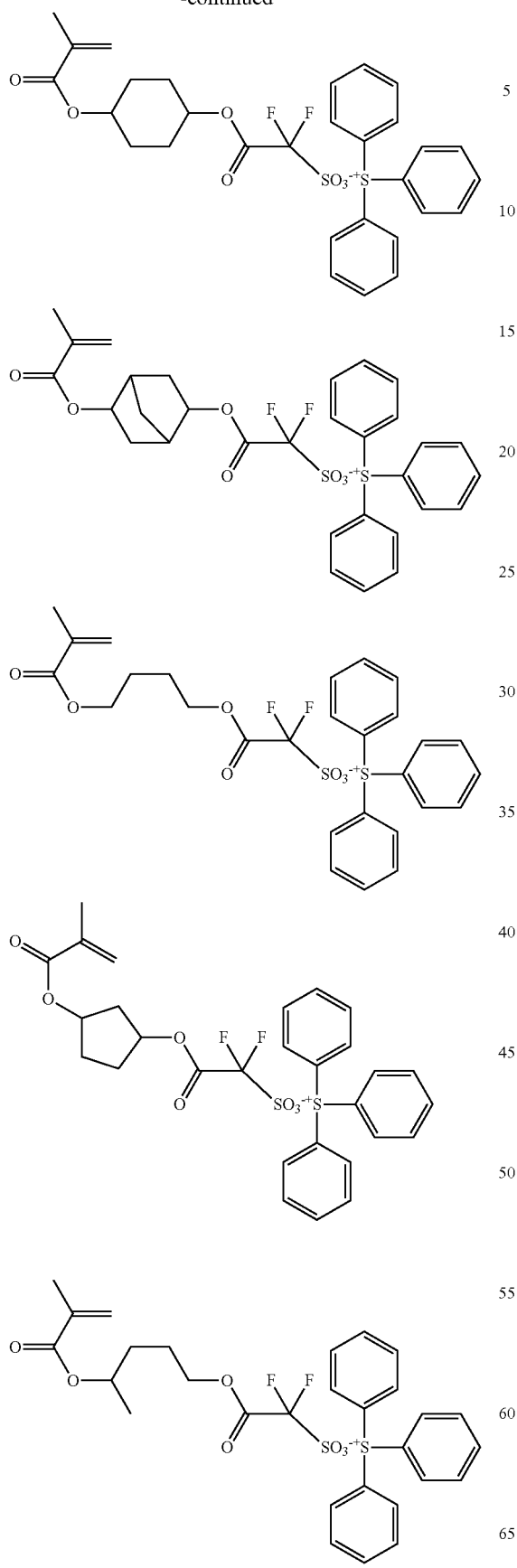
106
-continued
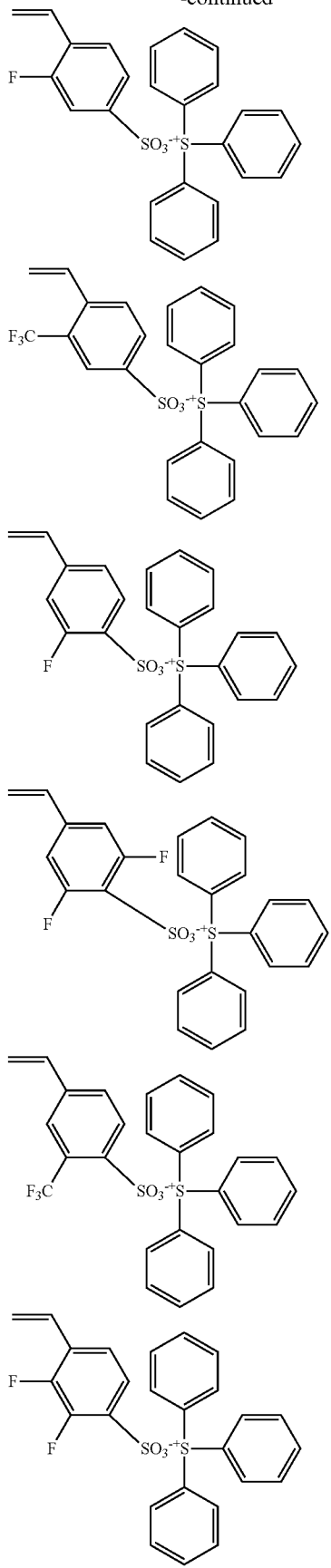

-continued

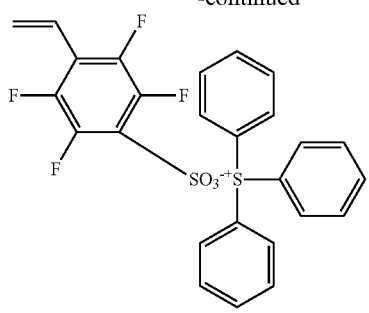

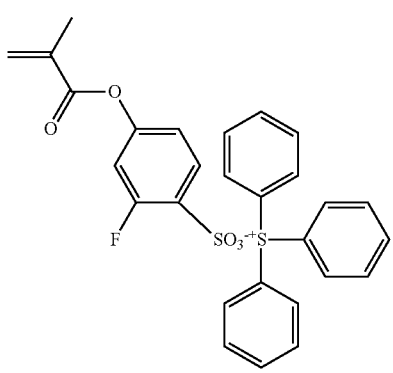

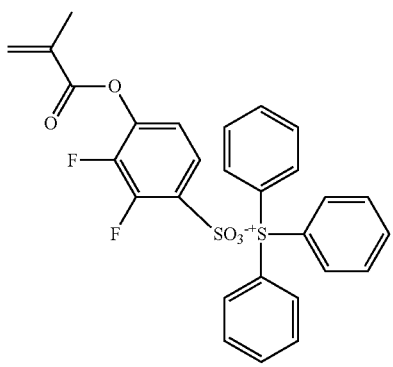

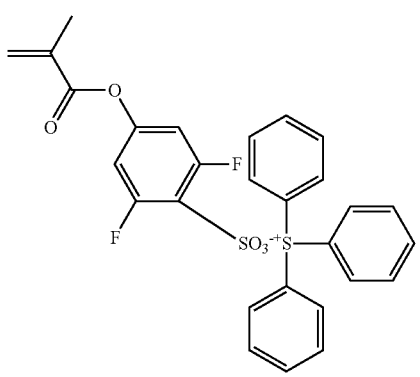

-continued

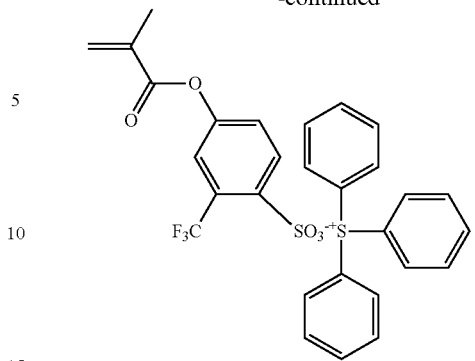

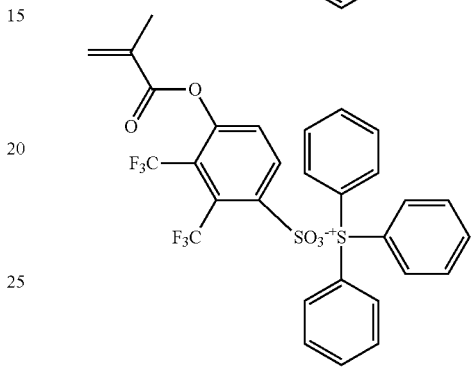

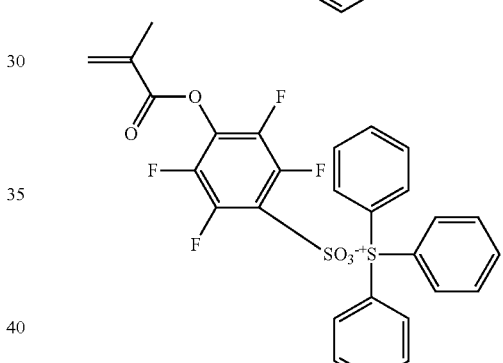

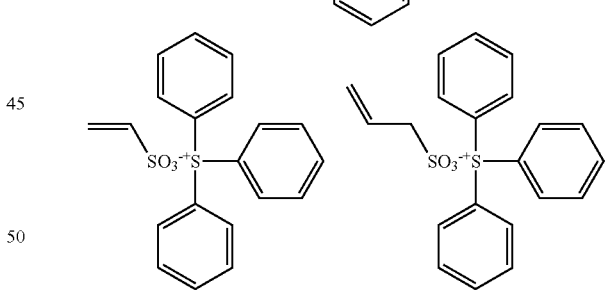

While the base resin in the resist composition used in the pattern forming process of the invention is a polymer comprising essentially recurring units (a1) having a carboxyl group substituted with an acid labile group and/or recurring units (a2) having a phenolic hydroxyl group substituted with an acid labile group and optionally recurring units (b1), (b2) or (b3) having an acid generator or sulfonic acid sulfonium salt bound to the main chain, the polymer may have further copolymerized therein recurring units (c) having a phenolic hydroxyl group as adhesive group.

Examples of the monomer from which recurring units (c) having a phenolic hydroxyl group are derived are shown below.

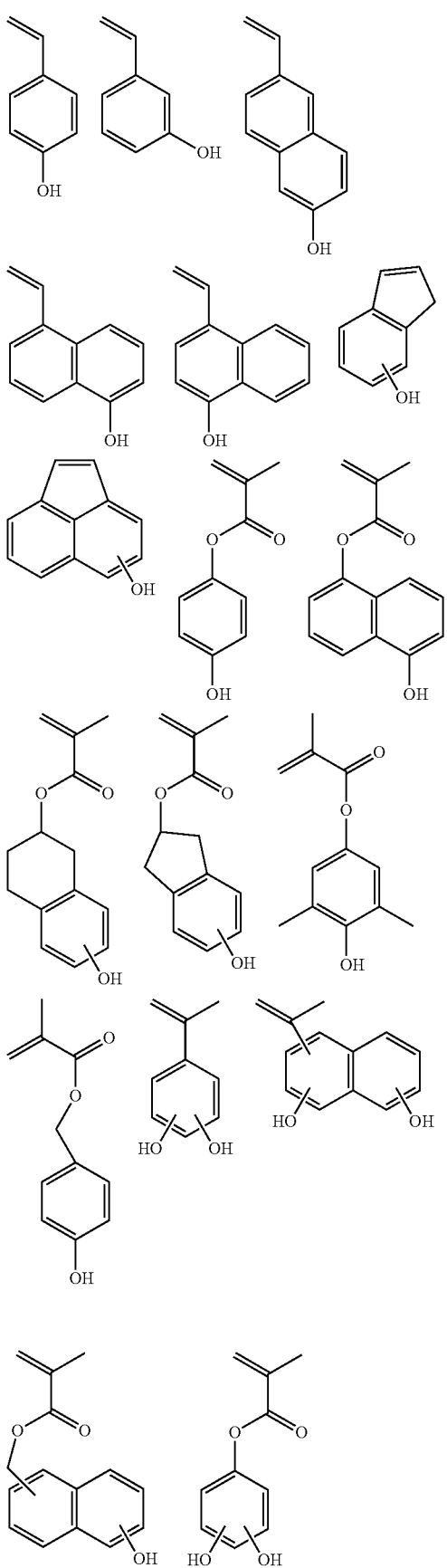
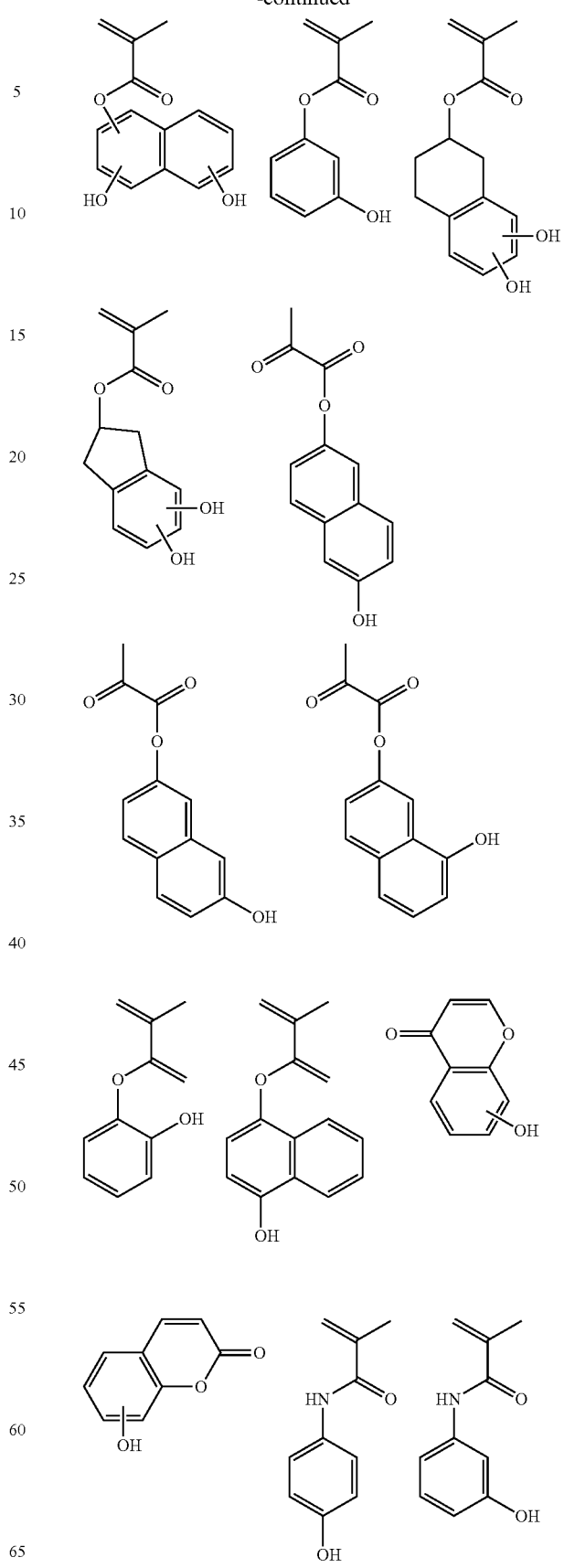

111
-continued
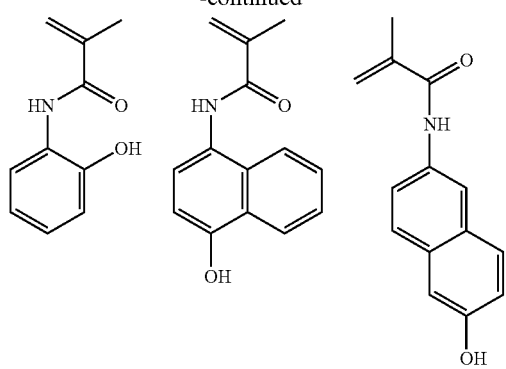
112
-continued
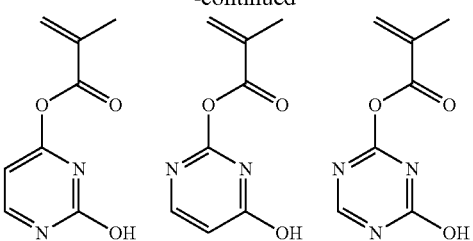
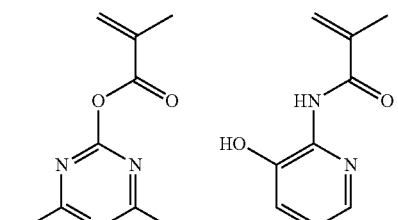
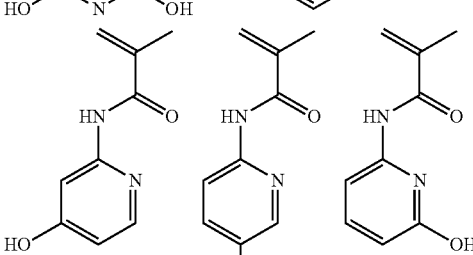
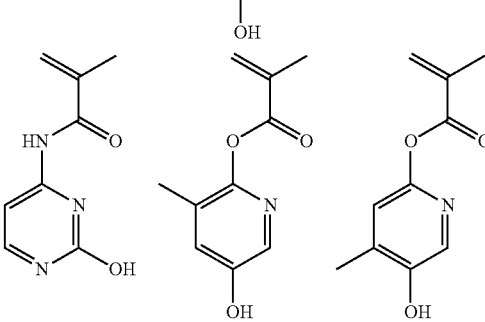
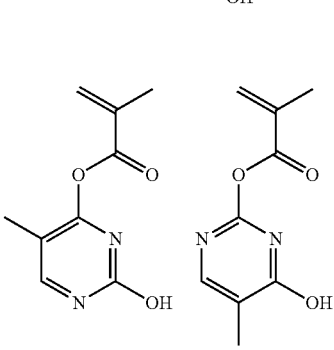
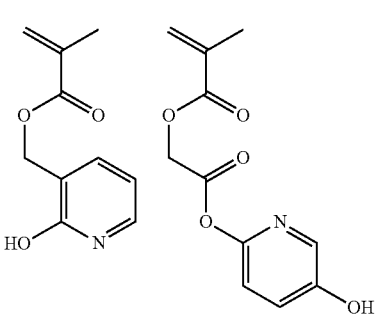

113
-continued
114
-continued
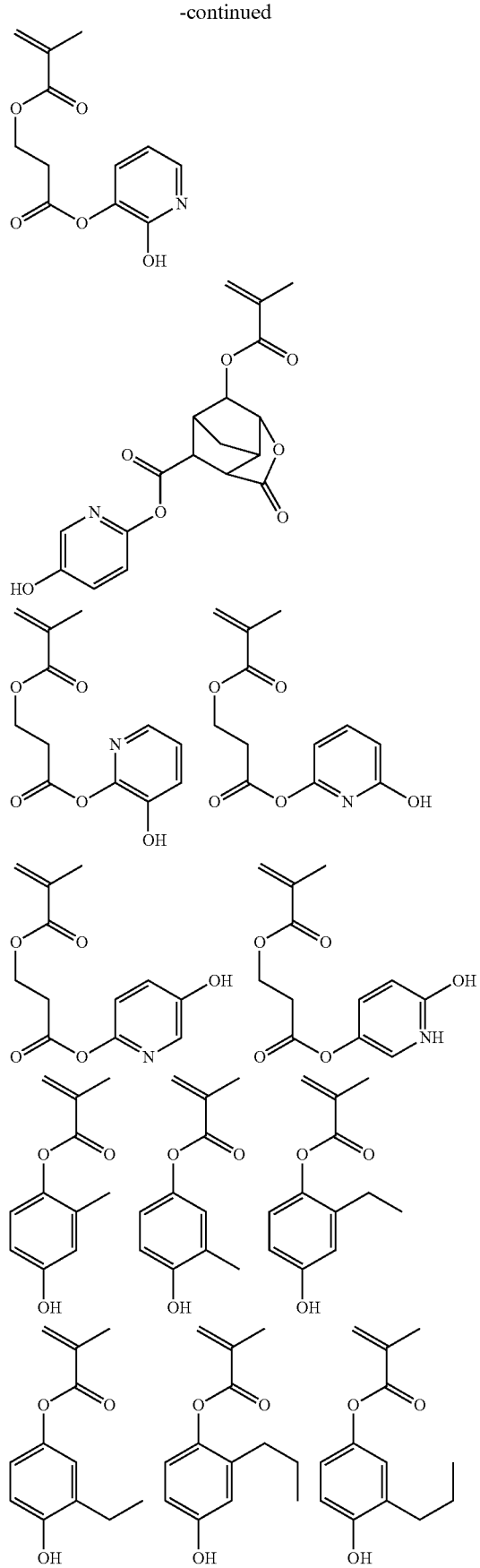
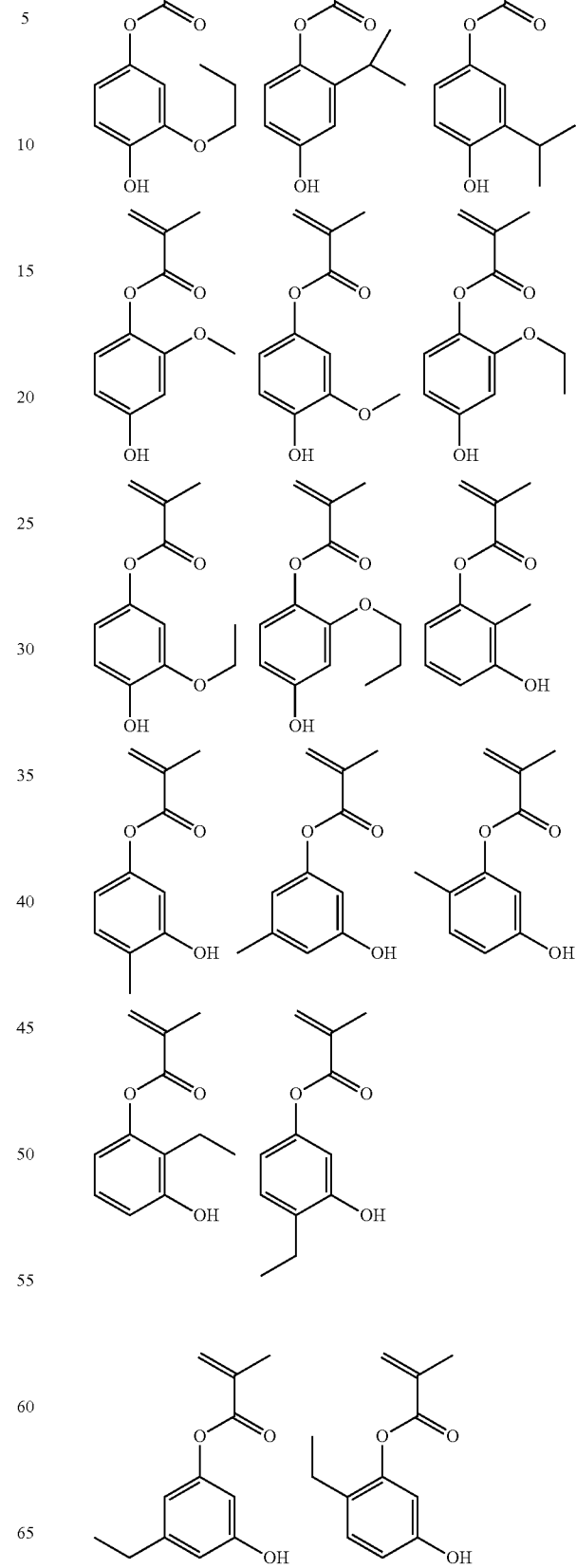

-continued
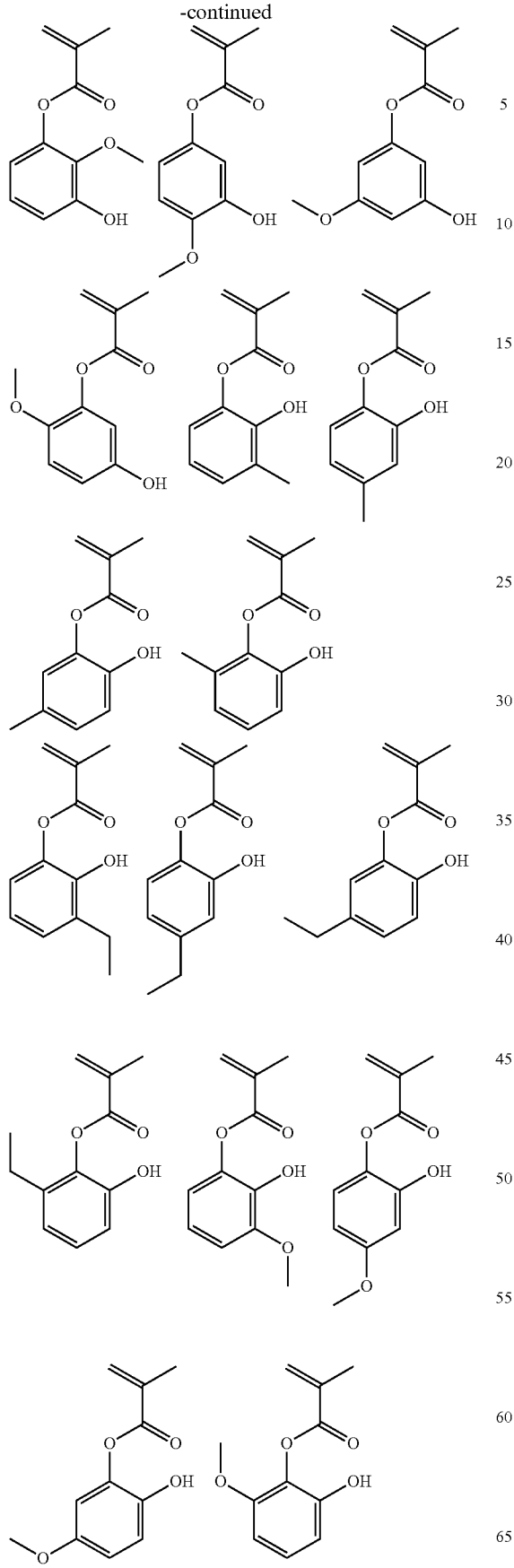
-continued
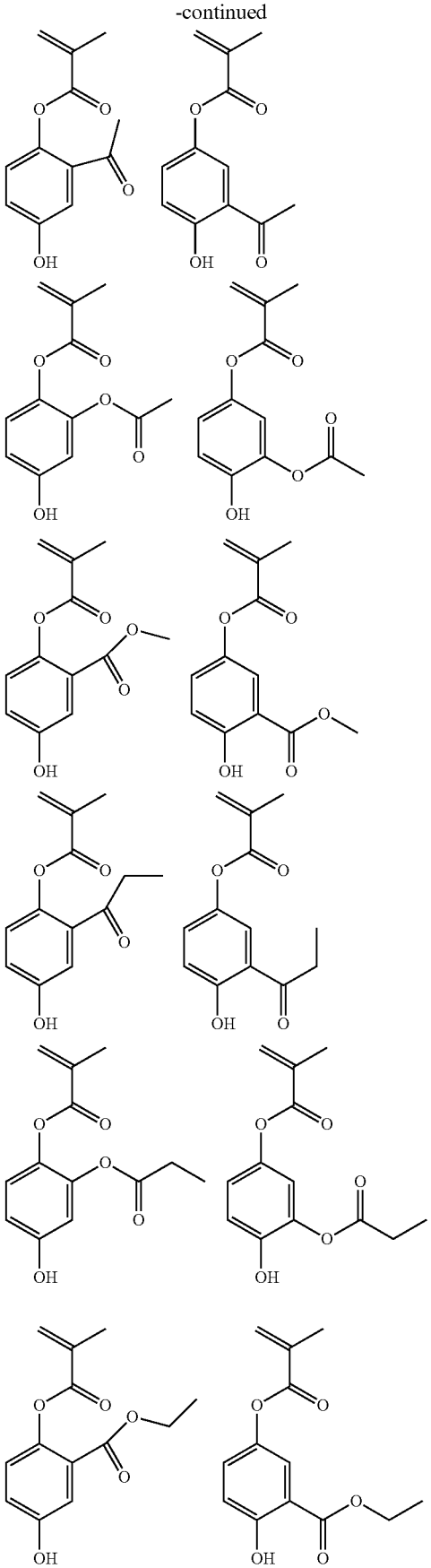

117
-continued
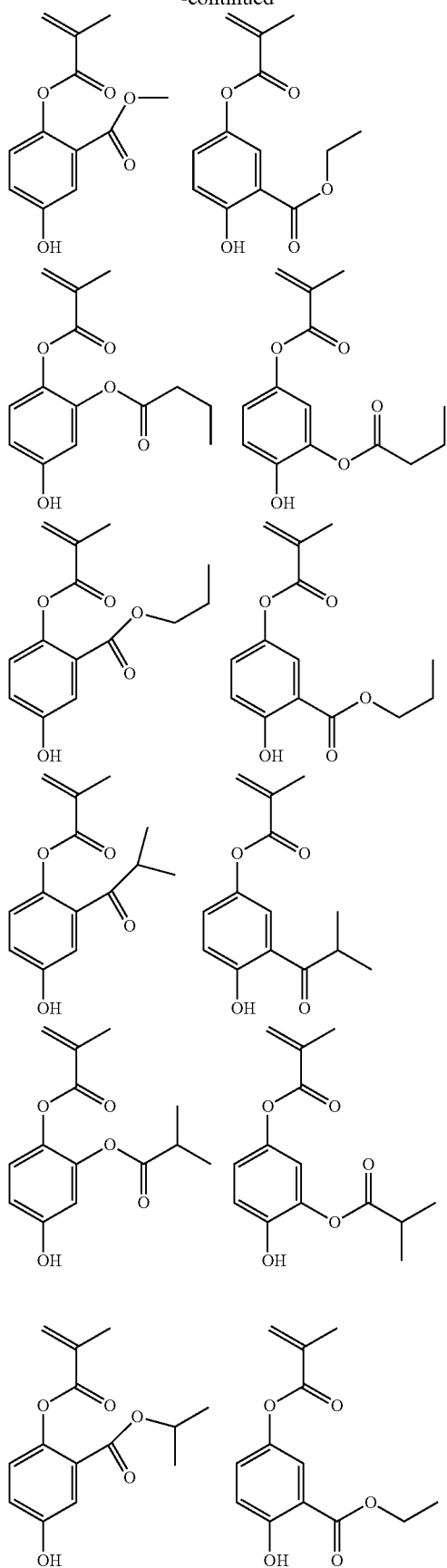
118
-continued
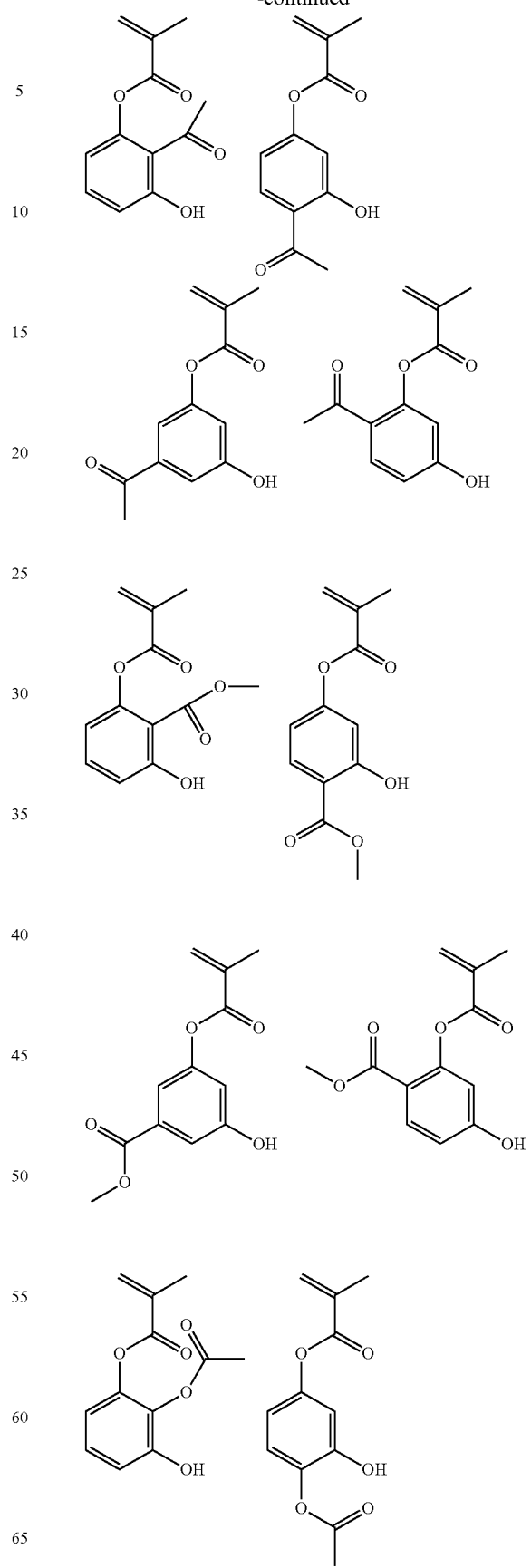

119
-continued
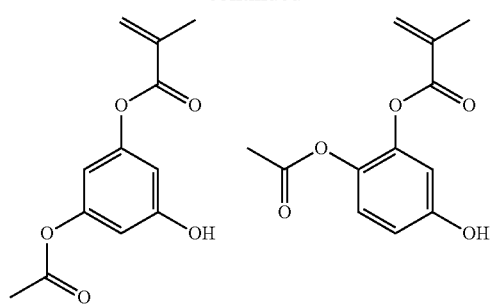
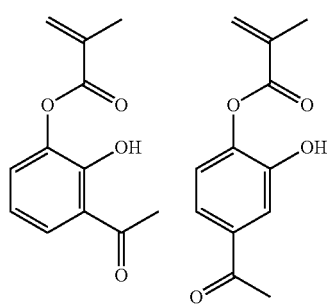
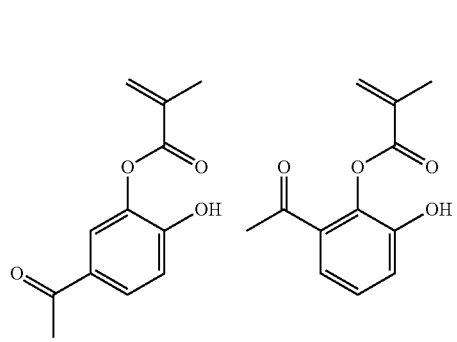
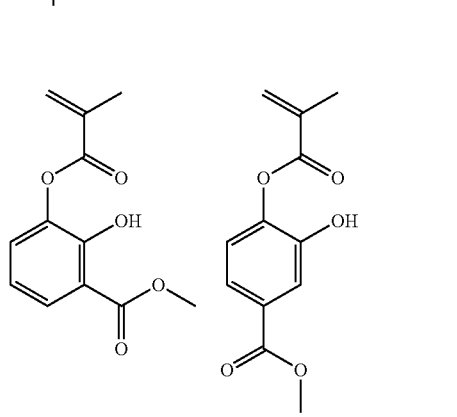
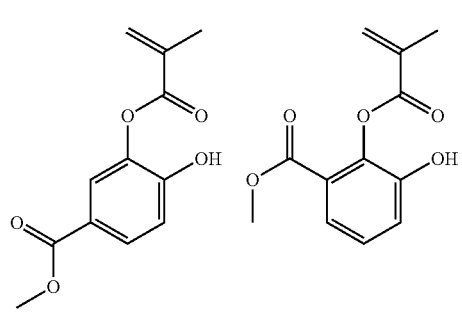
120
-continued
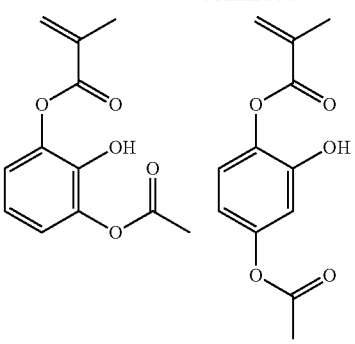
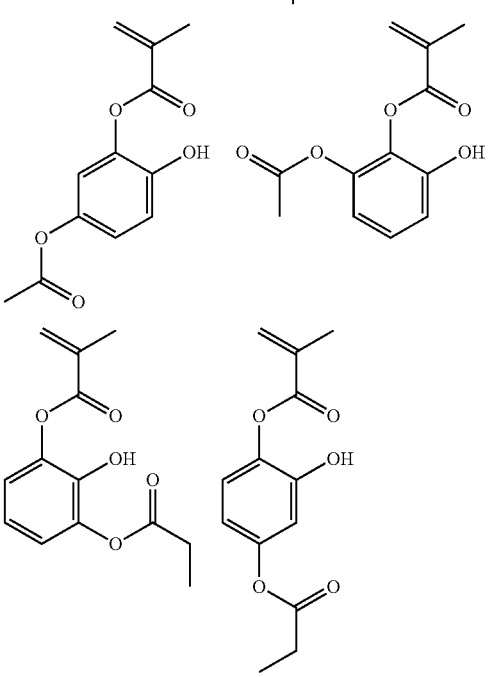
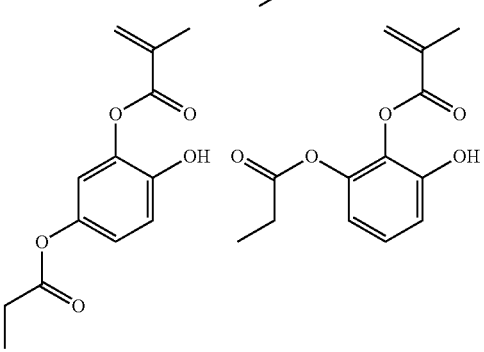
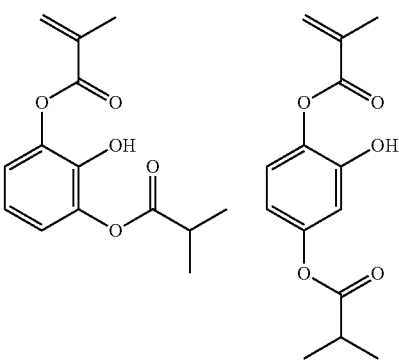

121
-continued
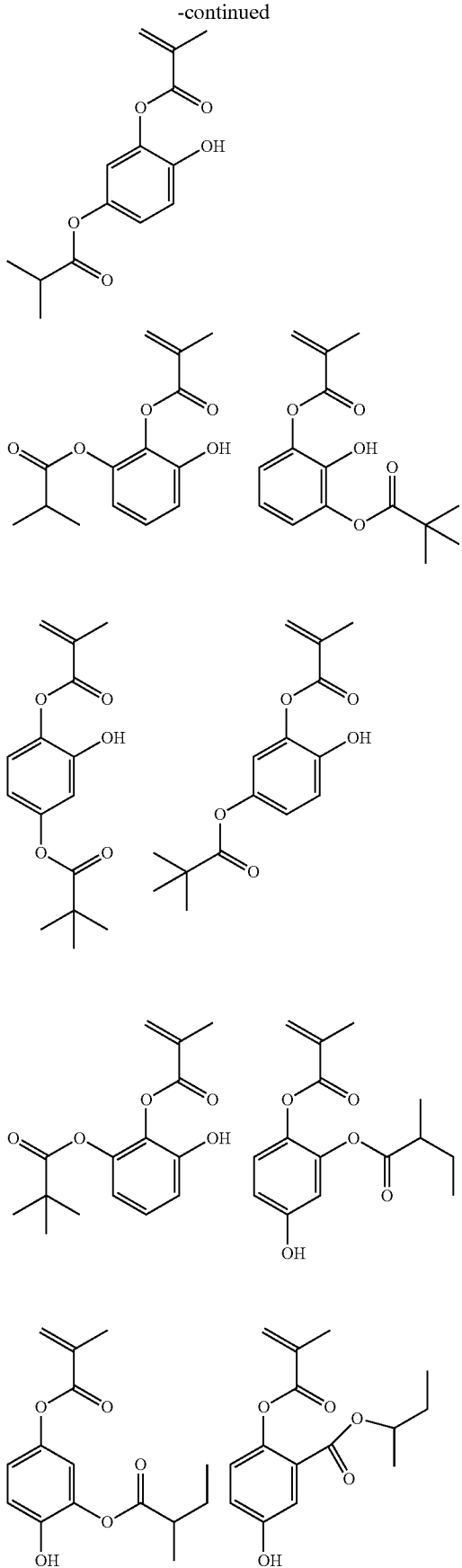
122
-continued
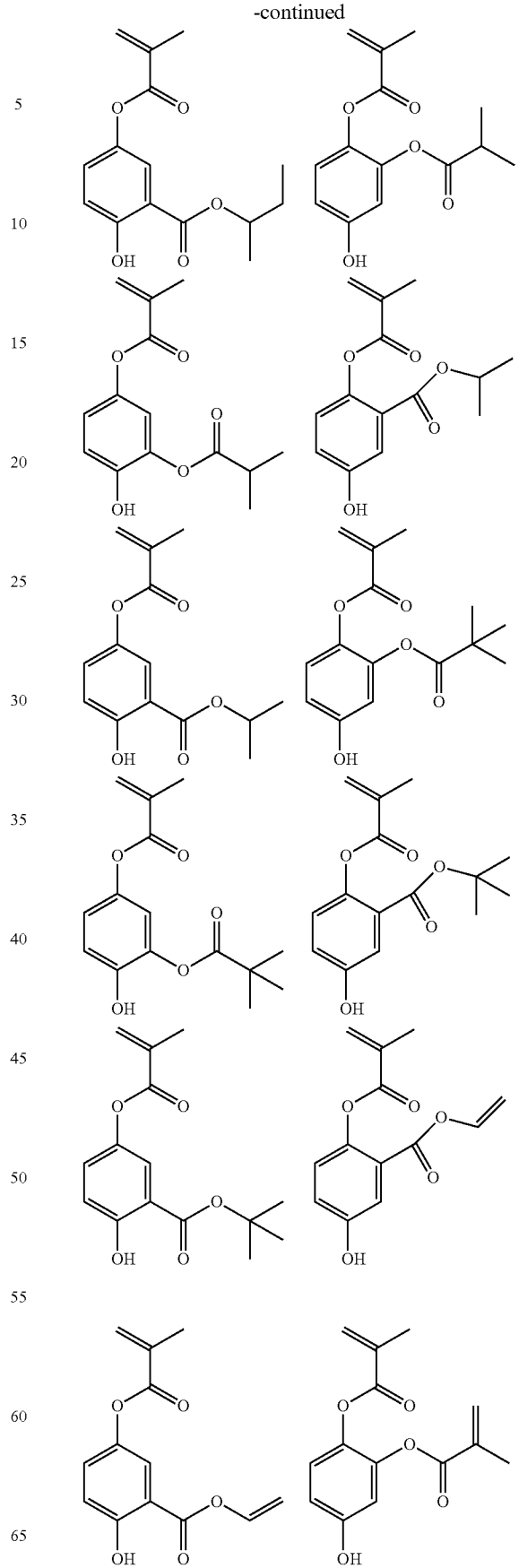

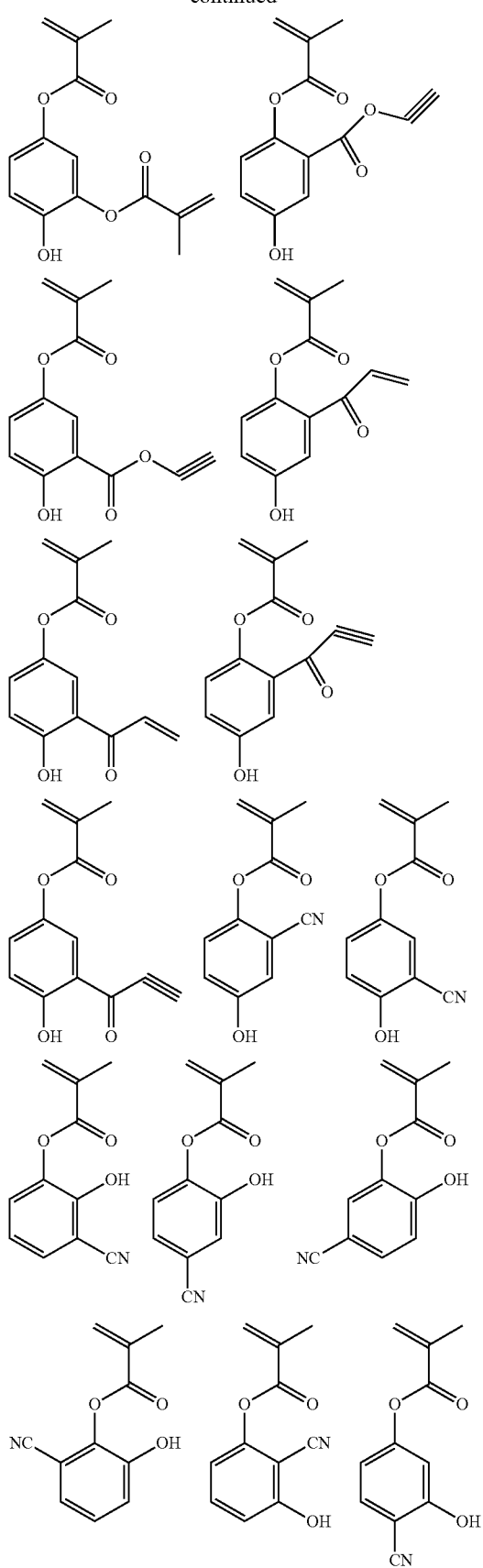

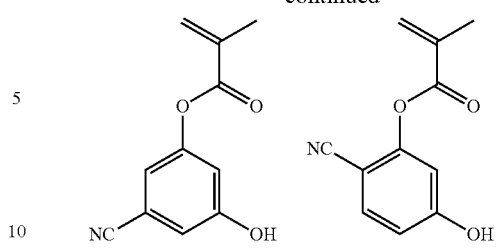

Furthermore, recurring units (d) having another adhesive group may be copolymerized. Suitable other adhesive groups include hydroxyl, carboxyl, lactone ring, carbonate, thiocarbonate, carbonyl, cyclic acetal, ether, ester, sulfonic acid ester, cyano, amide, and —O—C(=O)-G- wherein G is sulfur or NH. Inter alia, units having a lactone ring as the adhesive group are preferred.

Examples of the monomer from which recurring units (d) having another adhesive group are derived are shown below.

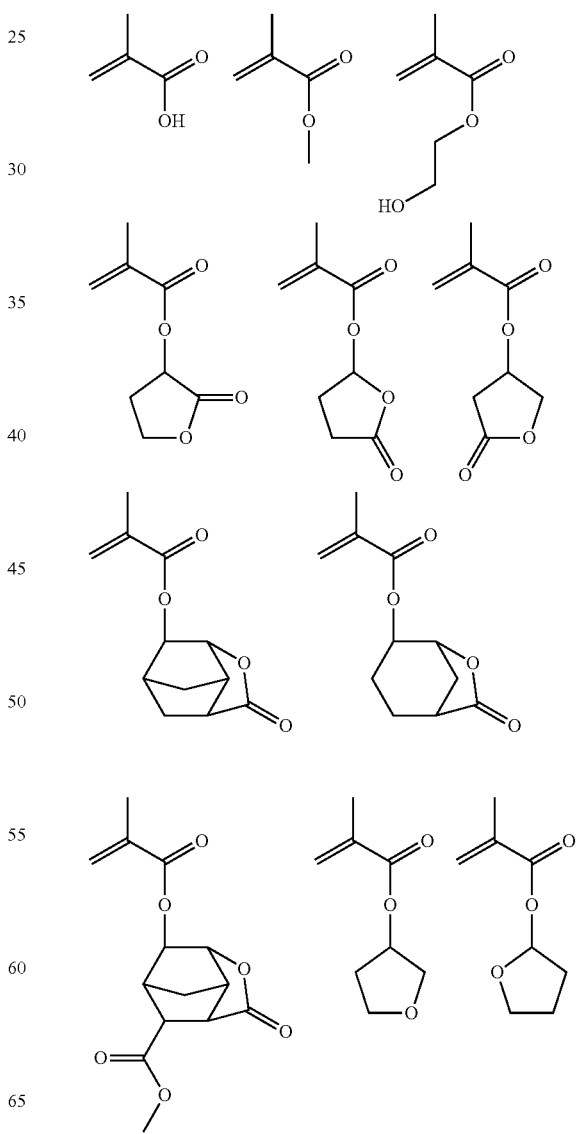

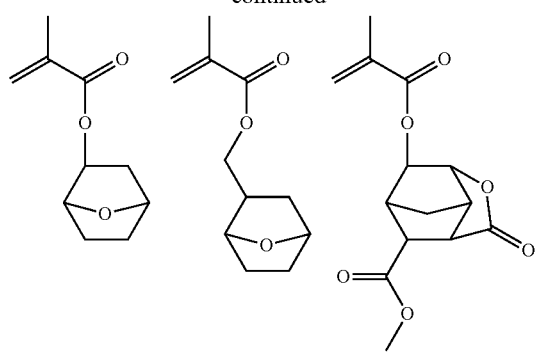
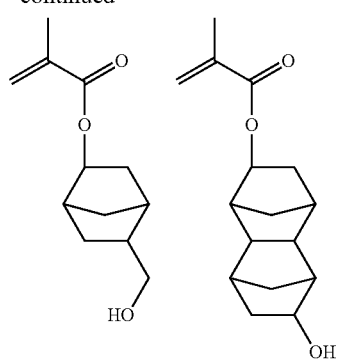

127
-continued
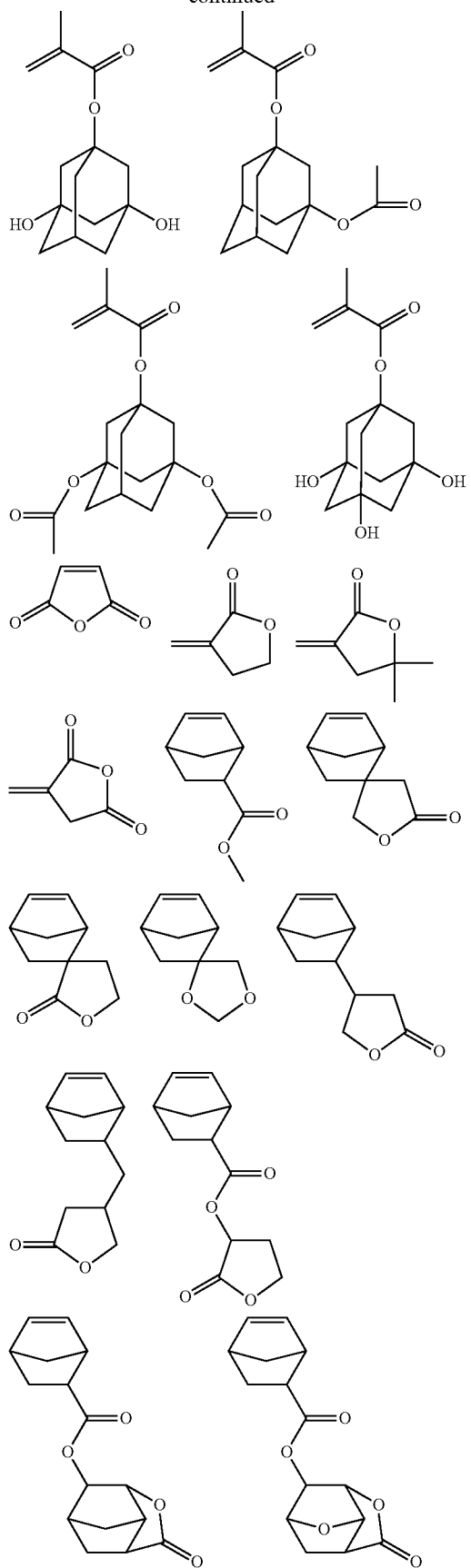
128
-continued
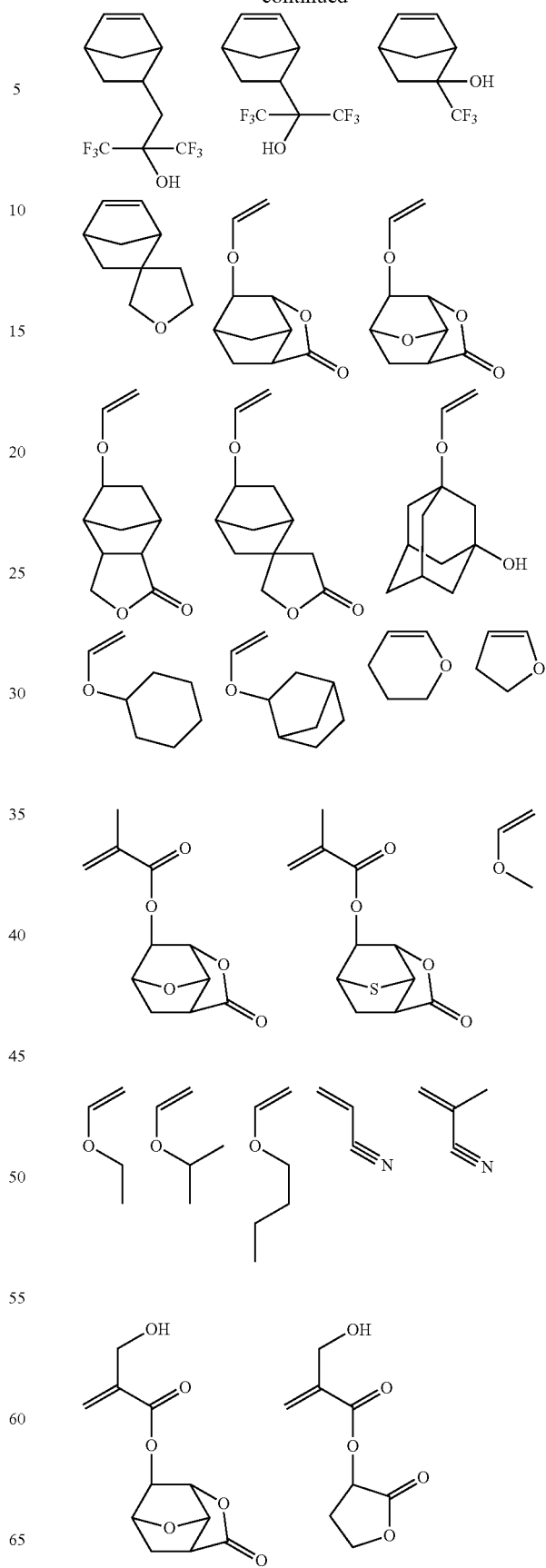

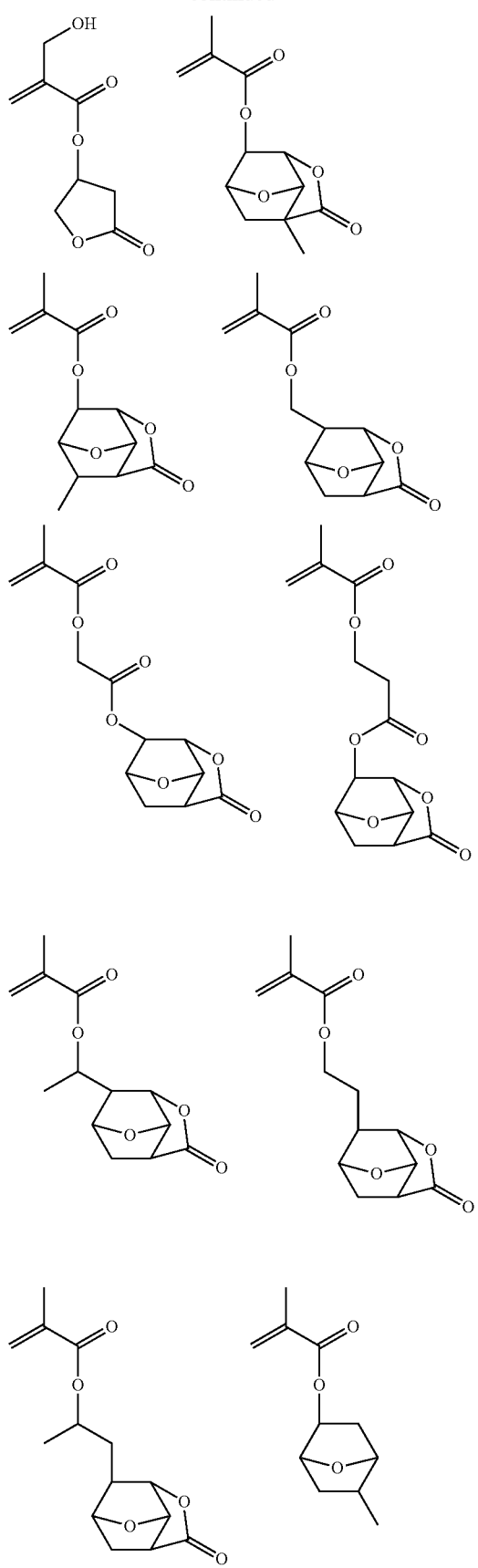

131
-continued
132
-continued
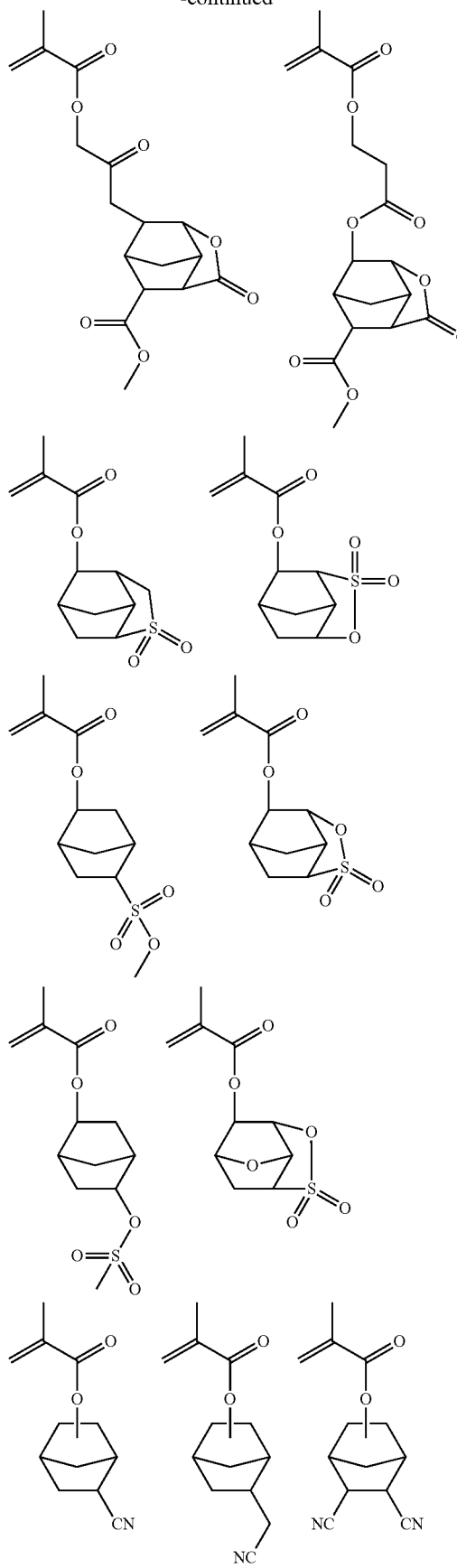
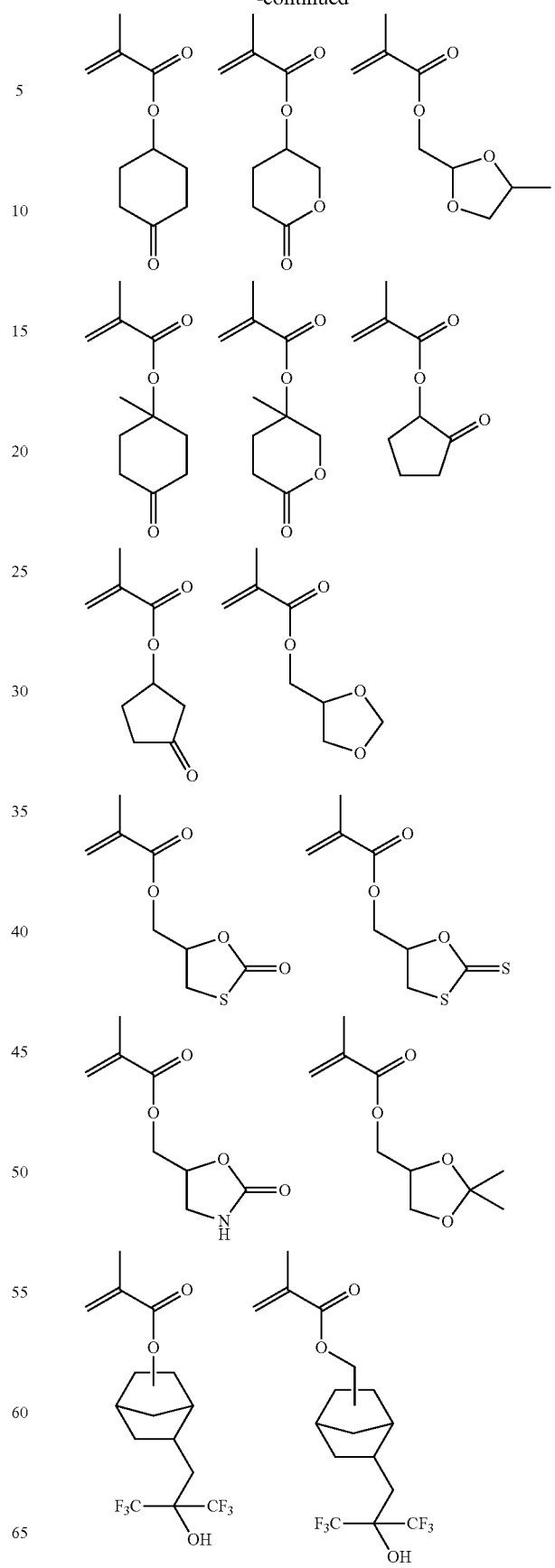

-continued
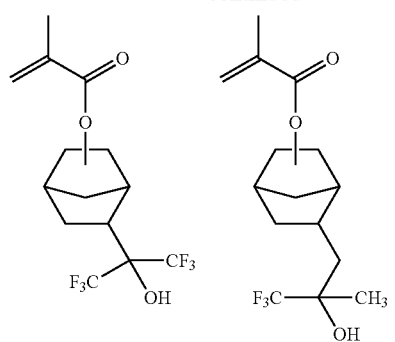
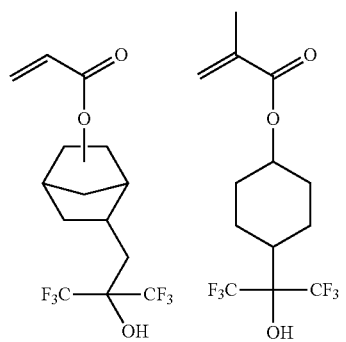
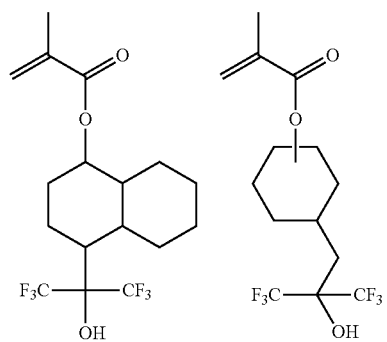
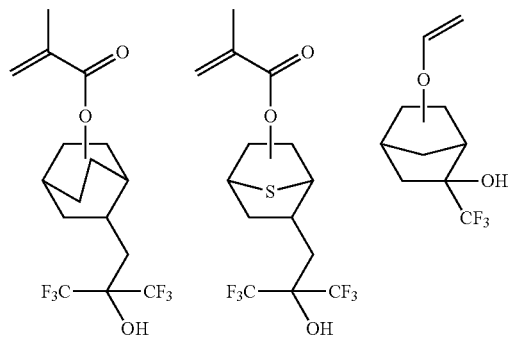
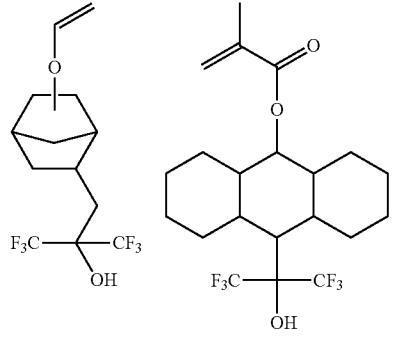
-continued
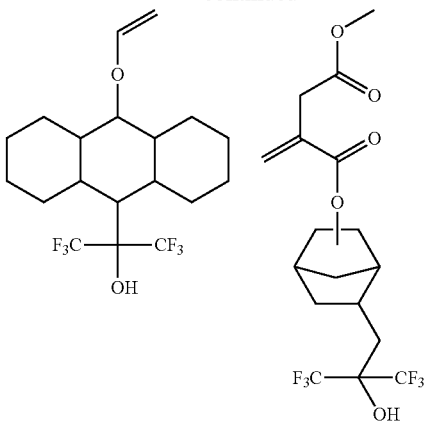
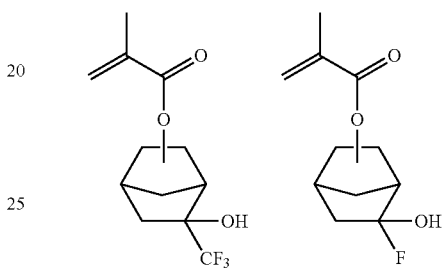
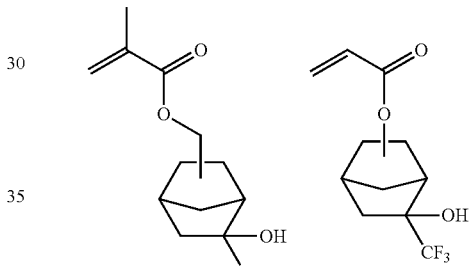
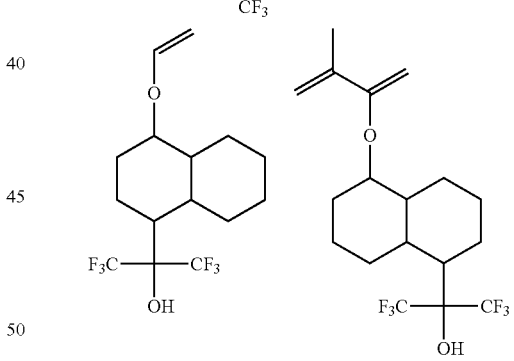
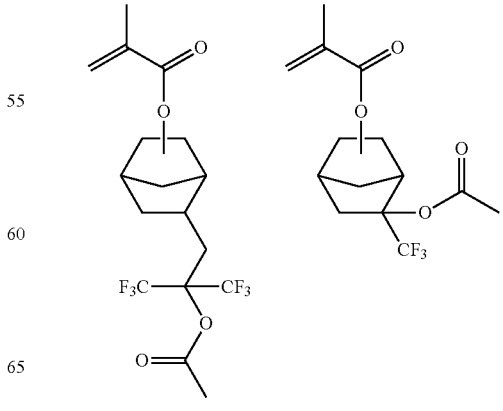

-continued
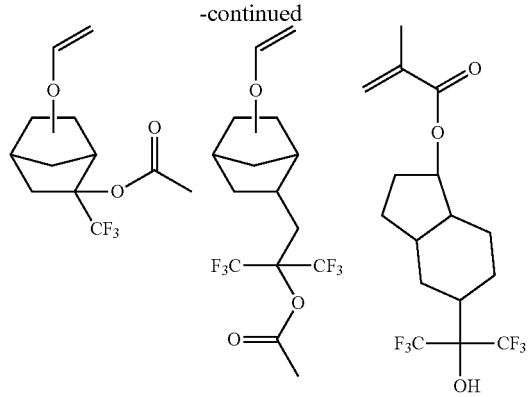
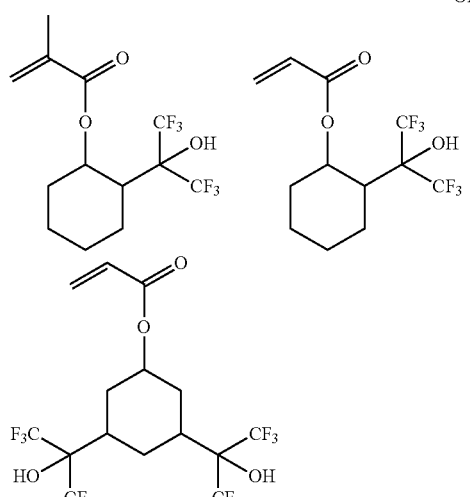
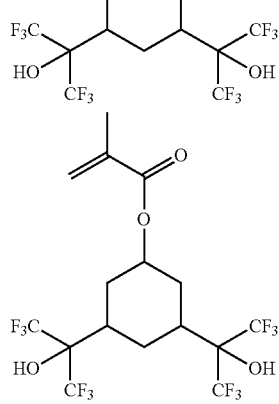
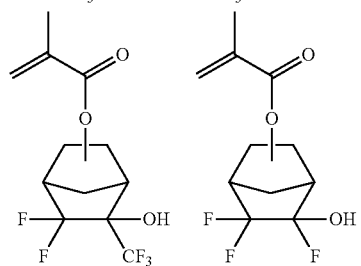
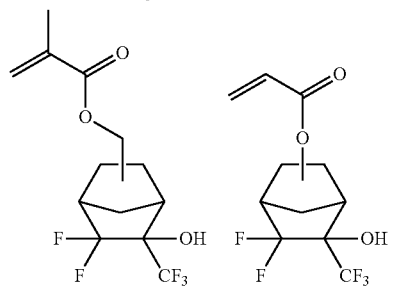
-continued
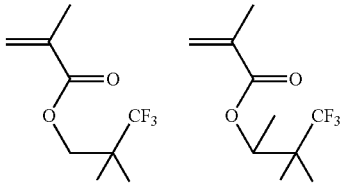
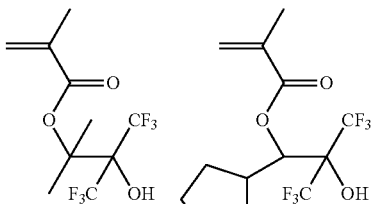
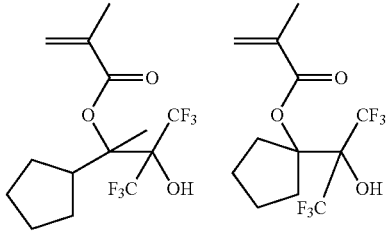
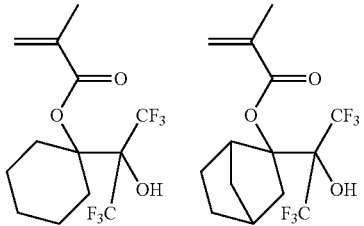
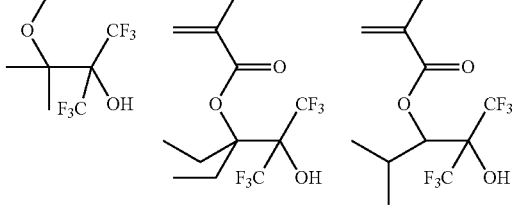
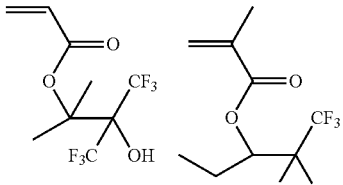
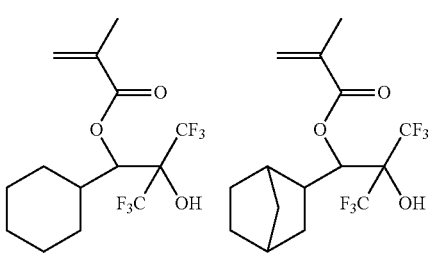

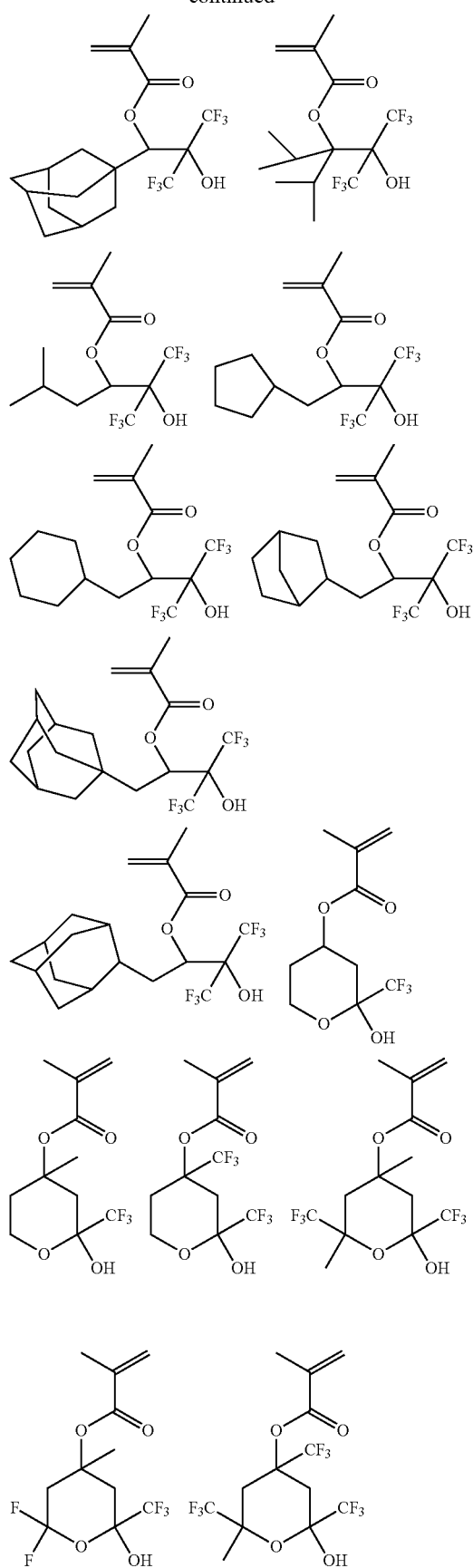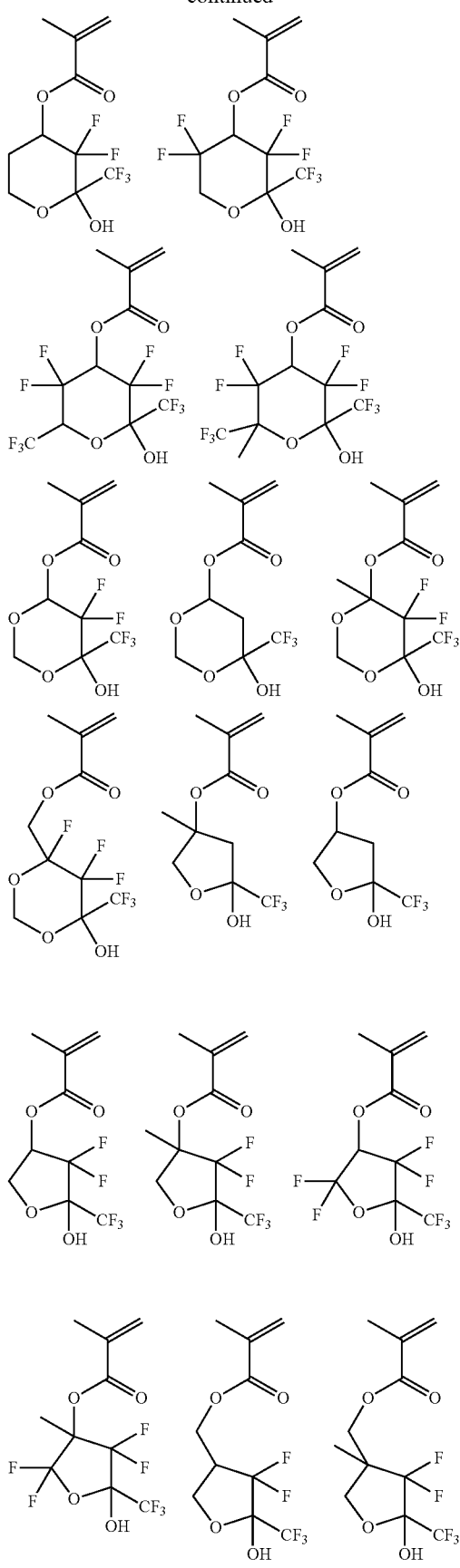

139
-continued
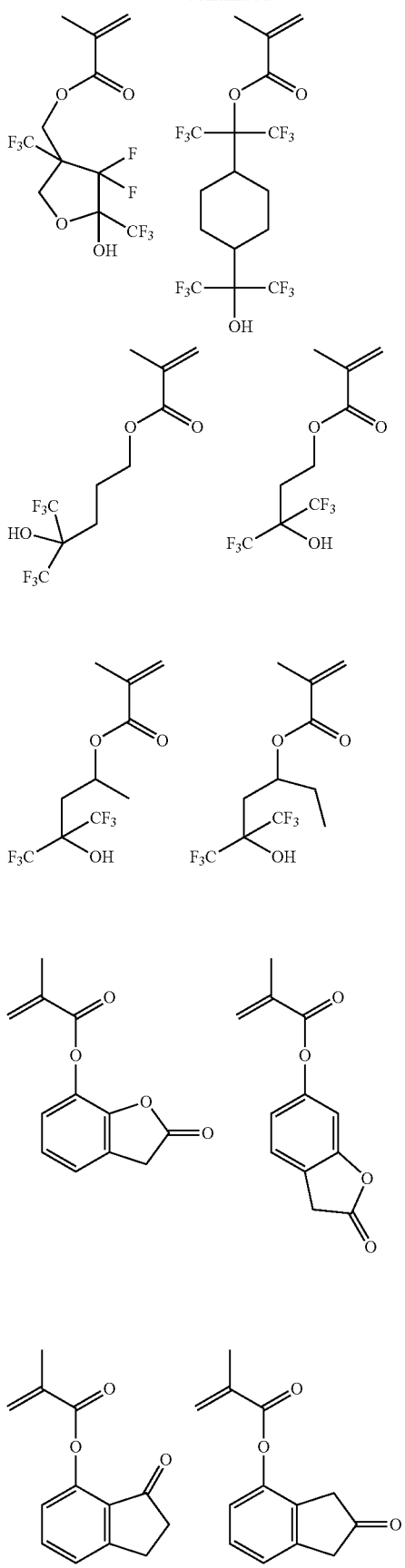
140
-continued
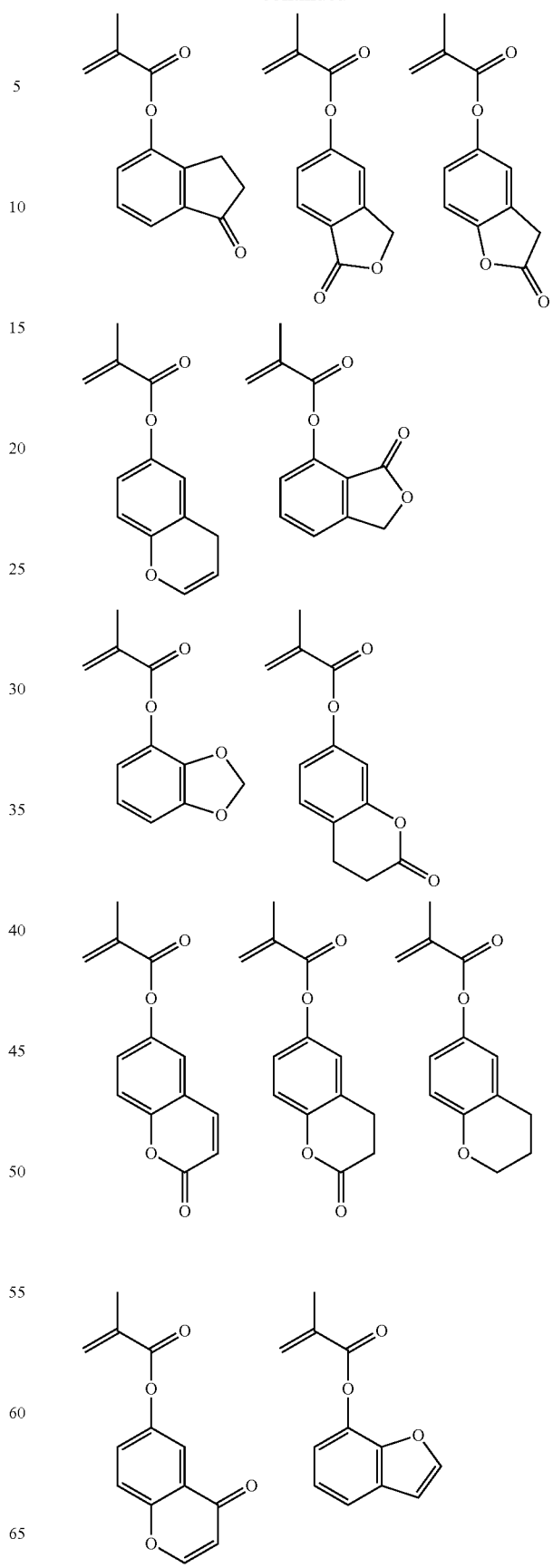

141
-continued
142
-continued
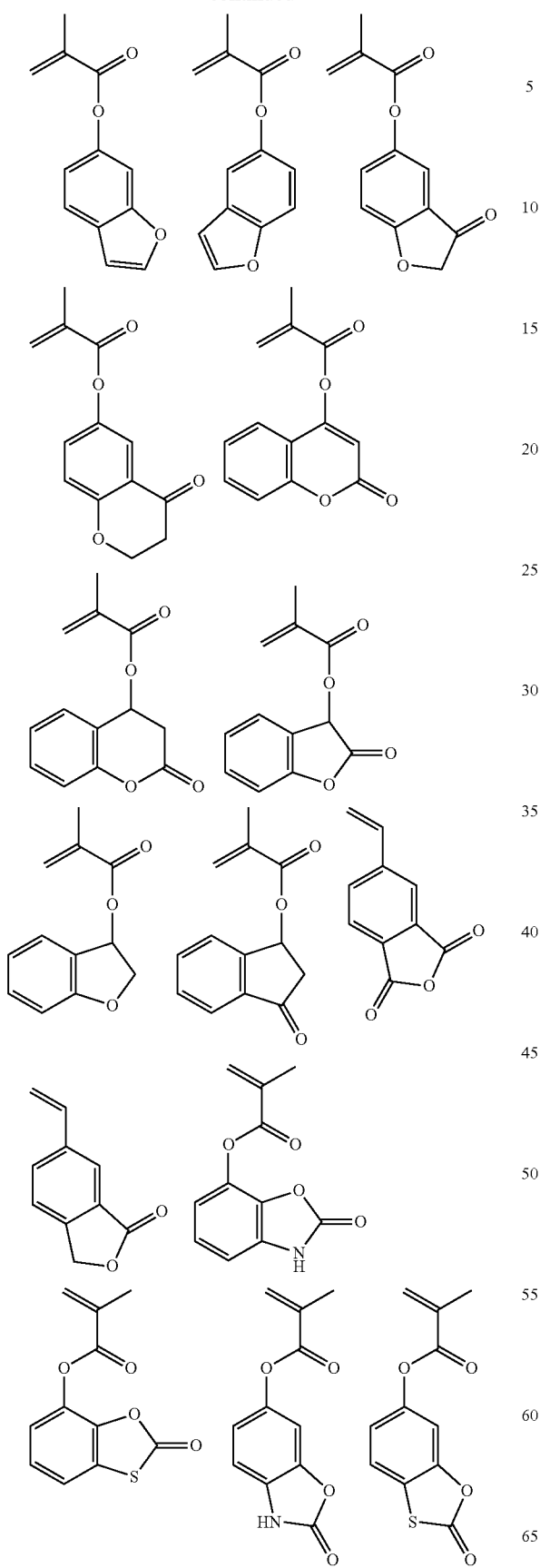
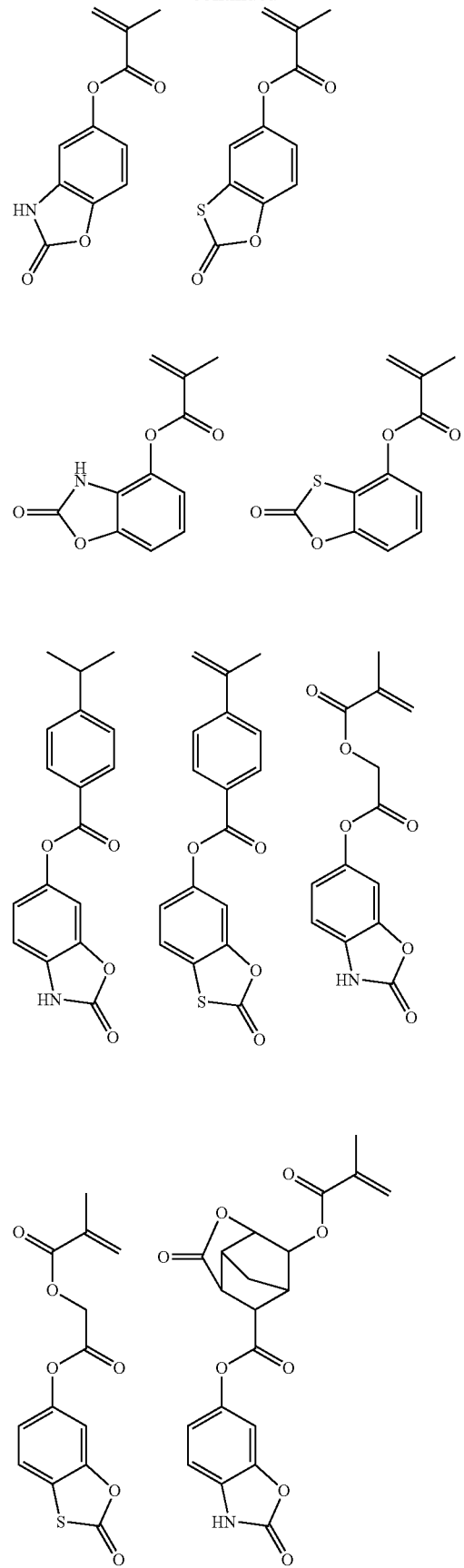

-continued

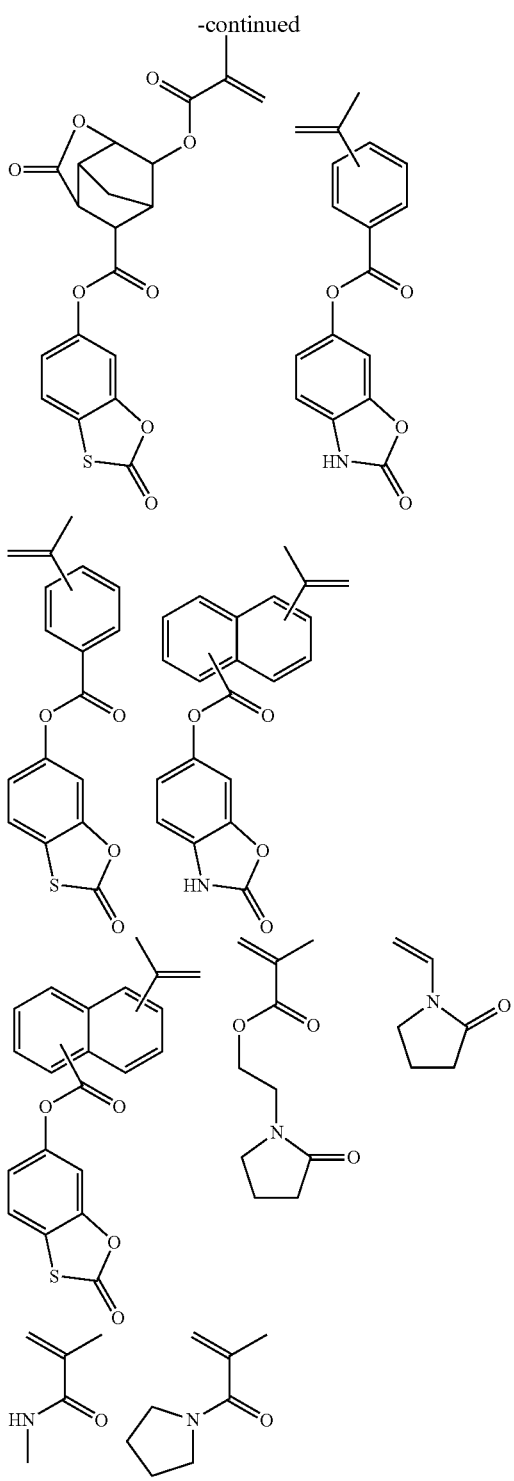

In the case of a monomer having a hydroxyl group, the hydroxyl group may be replaced by an acetal group susceptible to deprotection with acid, typically ethoxyethoxy, prior to polymerization, and the polymerization be followed by deprotection with weak acid and water. Alternatively, the hydroxyl group may be replaced by an acetyl, formyl, pivaloyl or similar group prior to polymerization, and the polymerization be followed by alkaline hydrolysis.

In the polymer, any of indene, benzofuran, benzothiophene, acenaphthylene, chromone, coumarin, norbornadiene and derivatives thereof may be copolymerized as recurring unit (e). Illustrative examples of these compounds are shown below.

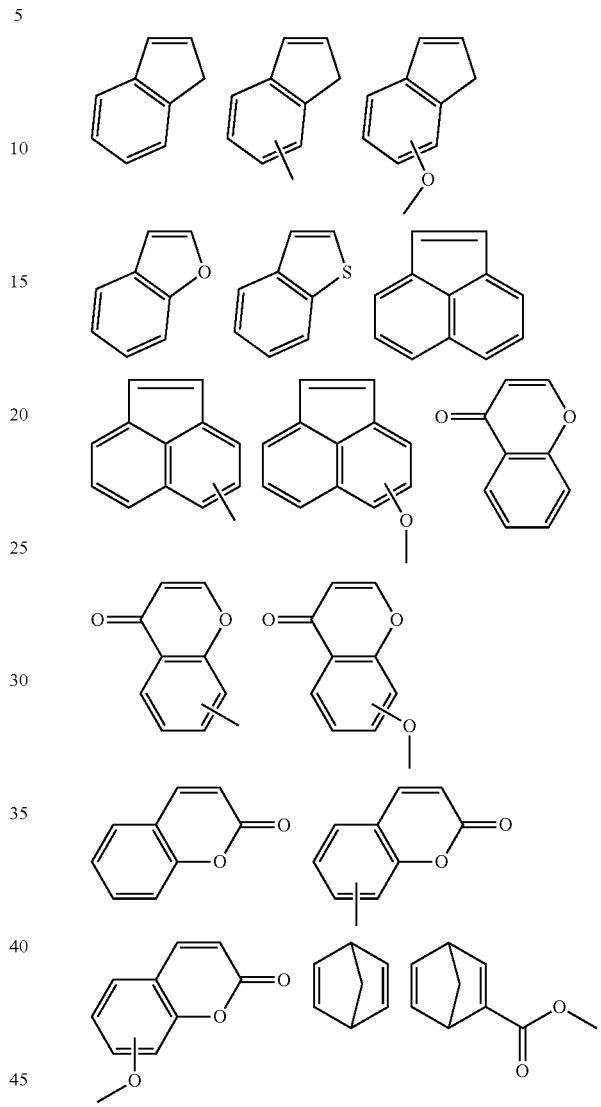

Furthermore, any of styrene, vinylnaphthalene, vinylanthracene, vinylpyrene, and methyleneindane may be copolymerized as recurring unit (f).

In the resist polymer, recurring units (a1), (a2), (b1), (b2), (b3), (c), (d), (e) and (f) may be incorporated in the following molar fraction:

$0 \leq a1 < 1.0$, $0 \leq a2 < 1.0$, $0 < a1+a2 < 1.0$,
$0 \leq b1 \leq 0.3$, $0 \leq b2 \leq 0.3$, $0 \, b3 \leq 0.3$, $0 \leq b1+b2+b3 \leq 0.3$,
$0 \leq c < 1.0$, $0 \leq d < 1.0$, $0 < c+d < 1.0$, $0 \leq e < 1.0$, $0 \leq f < 1.0$, and
$0.7 \leq a1+a2+b1+b2+b3+c+d \leq 1.0$;

preferably $0 \leq a1 \leq 0.8$, $0 \leq a2 \leq 0.8$, $0.1 \leq a1+a2 \leq 0.8$,
$0 \leq b1 \leq 0.3$, $0 \leq b2 \leq 0.3$, $0 \leq b3 \leq 0.3$, $0 b1+b2+b3 \leq 0.3$,
$0 \leq c \leq 0.8$, $0 \leq d \leq 0.8$, $0.2 \leq c+d \leq 0.9$, $0 \leq e \leq 0.5$, $0 \leq f \leq 0.5$, and
$0.8 \leq a1+a2+b1+b2+b3+c+d \leq 1.0$;

more preferably $0 \leq a1 \leq 0.7$, $0 \leq a2 \leq 0.7$, $0.1 \leq a1+a2 \leq 0.7$,
$0 \leq b1 \leq 0.3$, $0 \leq b2 \leq 0.3$, $0 \leq b3 \leq 0.3$, $0.02 \leq b1+b2+b3 \leq 0.3$,
$0 \leq c \leq 0.7$, $0 \leq d \leq 0.7$, $0.28 \leq c+d \leq 0.88$, $0 \leq e \leq 0.4$, $0 \leq f \leq 0.4$, and
$0.85 \leq a1+a2+b1+b2+b3+c+d \leq 1.0$;

provided that $a1+a2+b1+b2+b3+c+d+e+f=1.0$.

The polymer may be synthesized by any desired methods, for example, by dissolving suitable monomers corresponding to recurring units (a1) and/or (a2) and optionally recurring units (b1), (b2), (b3), (c), (d), (e) and (f) in an organic solvent, adding a radical polymerization initiator thereto, and effecting heat polymerization. Examples of the organic solvent which can be used for polymerization include toluene, benzene, tetrahydrofuran, diethyl ether, and dioxane. Examples of the polymerization initiator used herein include 2,2'-azobisisobutyronitrile (AIBN), 2,2'-azobis(2,4-dimethyl-valeronitrile), dimethyl 2,2-azobis(2-methylpropionate), benzoyl peroxide, and lauroyl peroxide. Preferably the system is heated at 50 to 80° C. for polymerization to take place. The reaction time is 2 to 100 hours, preferably 5 to 20 hours.

When hydroxystyrene or hydroxyvinylnaphthalene is copolymerized, an alternative method is possible. Specifically, acetoxystyrene or acetoxyvinylnaphthalene is used instead of hydroxystyrene or hydroxyvinylnaphthalene, and after polymerization, the acetoxy group is deprotected by alkaline hydrolysis as mentioned above, for thereby converting the polymer product to polyhydroxystyrene or hydroxypolyvinylnaphthalene. For alkaline hydrolysis, a base such as aqueous ammonia or triethylamine may be used. The reaction temperature is −20° C. to 100° C., preferably 0° C. to 60° C., and the reaction time is 0.2 to 100 hours, preferably 0.5 to 20 hours.

The polymer serving as the base resin in the resist composition should desirably have a weight average molecular weight (Mw) in the range of 1,000 to 500,000, and more desirably 2,000 to 30,000, as measured by GPC versus polystyrene standards. With a Mw of 1,000 or higher, the resist composition becomes heat resistant. A polymer with a Mw of 500,000 or lower does not lose alkaline solubility or give rise to a footing phenomenon after pattern formation.

If a multi-component polymer has a wide molecular weight distribution or dispersity (Mw/Mn), which indicates the presence of lower and higher molecular weight polymer fractions, there is a possibility that foreign matter is left on the pattern or the pattern profile is degraded. The influences of molecular weight and dispersity become stronger as the pattern rule becomes finer. Therefore, the multi-component copolymer should preferably have a narrow dispersity (Mw/Mn) of 1.0 to 2.0, especially 1.0 to 1.5, in order to provide a resist composition suitable for micropatterning to a small feature size.

The polymer is advantageously used as a base resin in a positive resist composition, typically chemically amplified positive resist composition. Specifically, the polymer is used as a base resin and combined with any desired components including an organic solvent, acid generator, dissolution regulator, basic compound, surfactant, and acetylene alcohol to formulate a positive resist composition. This positive resist composition has a very high sensitivity in that the dissolution rate in developer of the polymer in exposed areas is accelerated by catalytic reaction. In addition, the resist film has a high dissolution contrast, resolution, exposure latitude, and process adaptability, and provides a good pattern profile after exposure, yet better etching resistance, and minimal proximity bias because of restrained acid diffusion. By virtue of these advantages, the composition is fully useful in commercial application and suited as a pattern-forming material for the fabrication of VLSIs or photomasks.

Particularly when an acid generator is added to formulate a chemically amplified positive resist composition capable of utilizing acid catalyzed reaction, the composition has a higher sensitivity and is further improved in the properties described above. Typical of the acid generator used herein is a photoacid generator (PAG) capable of generating an acid in response to actinic light or radiation. It is any compound capable of generating an acid upon exposure to high-energy radiation. Suitable PAGs include sulfonium salts, iodonium salts, sulfonyldiazomethane, N-sulfonyloxyimide, and oxime-O-sulfonate acid generators. The acid generators may be used alone or in admixture of two or more. Exemplary acid generators are described in U.S. Pat. No. 7,537,880 (JP-A 2008-111103, paragraphs [0122] to [0142]). Understandably, the acid generator may be omitted when a polymer having recurring units (b1) to (b3) copolymerized therein is used as the base resin.

Examples of the organic solvent used herein are described in JP-A 2008-111103, paragraphs [0144] to [0145] (U.S. Pat. No. 7,537,880). Specifically, exemplary solvents include ketones such as cyclohexanone, cyclopentanone and methyl-2-n-amyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γy-butyrolactone, and mixtures thereof.

Exemplary basic compounds are described in JP-A 2008-111103, paragraphs [0146] to [0164], for example, primary, secondary and tertiary amine compounds, specifically amine compounds having a hydroxyl, ether, ester, lactone, cyano or sulfonate group. Exemplary surfactants are described in JP-A 2008-111103, paragraphs [0165] to [0166]. Exemplary dissolution regulators are described in JP-A 2008-122932 (US 2008090172), paragraphs [0155] to [0178], and exemplary acetylene alcohols in paragraphs [0179] to [0182]. Also useful are quenchers of polymer type as described in JP-A 2008-239918. The polymeric quencher segregates at the resist surface after coating and thus enhances the rectangularity of resist pattern. When a protective film is applied as is often the case in the immersion lithography, the polymeric quencher is also effective for preventing any film thickness loss of resist pattern or rounding of pattern top.

An appropriate amount of the acid generator used is 0.01 to 100 parts, and preferably 0.1 to 80 parts. An appropriate amount of the organic solvent used is 50 to 10,000 parts, especially 100 to 5,000 parts. The dissolution regulator may be blended in an amount of 0 to 50 parts, preferably 0 to 40 parts, the basic compound in an amount of 0 to 100 parts, preferably 0.001 to 50 parts, and the surfactant in an amount of 0 to 10 parts, preferably 0.0001 to 5 parts. All amounts are expressed in parts by weight relative to 100 parts by weight of the base resin.

Process

The positive resist composition, typically chemically amplified positive resist composition comprising an acid labile group-containing polymer having formula (2), an acid generator, and a basic compound in an organic solvent is used in the fabrication of various integrated circuits. Pattern formation using the resist composition may be performed by well-known lithography processes. The process generally involves coating, prebake, exposure, bake (PEB), and development. If necessary, any additional steps may be added.

The resist composition is first applied onto a substrate on which an integrated circuit is to be formed (e.g., Si, $SiO_2$, SiN, SiON, TiN, WSi, BPSG, SOG, or organic antireflective coating) or a substrate on which a mask circuit is to be formed (e.g., Cr, CrO, CrON, MoSi, or $SiO_2$) by a suitable coating technique such as spin coating, roll coating, flow coating, dip coating, spray coating or doctor coating. The coating is prebaked on a hot plate at a temperature of 60 to 150° C. for 10 seconds to 30 minutes, preferably 80 to 120° C. for 30 seconds to 20 minutes. The resulting resist film is generally 0.1 to 2.0 μm thick.

The resist film is then exposed to a desired pattern of high-energy radiation such as UV, deep-UV, EB, x-ray, excimer laser light, γ-ray, synchrotron radiation or EUV (soft x-ray), directly or through a mask. The exposure dose is preferably about 1 to 200 $mJ/cm^2$, more preferably about 10 to 100 $mJ/cm^2$, or 0.1 to 100 $\mu C/cm^2$, more preferably 0.5 to 50 $\mu C/cm^2$. The resist film is further baked (PEB) on a hot plate at 60 to 150° C. for 10 seconds to 30 minutes, preferably 80 to 120° C. for 30 seconds to 20 minutes.

Thereafter the resist film is developed in an aqueous solution of a benzyltrialkylammonium hydroxide according to the invention for a time of 1 to 300 seconds, preferably 3 to 100 seconds at a temperature of 0 to 30° C., preferably 5 to 25° C., to form a resist pattern.

After the development, the resist film may be rinsed, typically with pure water and dried, typically spin dried. Rinsing with surfactant-containing water is acceptable because it is effective for reducing the stress applied to the pattern during spin drying, thus mitigating pattern collapse. Pure water may be replaced by supercritical carbon dioxide because carbon dioxide can be vaporized from the solid state without passing the liquid state. This means that drying takes place under essentially no surface tension. Then pattern collapse is substantially eliminated. However, a special chamber is necessary for creating the high-pressure supercritical state, leading to an outstanding drop of throughput.

EXAMPLE

Examples and Comparative Examples are given below for further illustrating the invention, but they should not be construed as limiting the invention thereto. All parts (pbw) are by weight.

Examples and Comparative Examples

Preparation of Developer

Developers #1 to #7 were prepared according to the formulation shown in Table 1.

TABLE 1

| Developer | Benzyltrialkylammonium hydroxide (pbw) | Surfactant (pbw) | Water (pbw) |
|---|---|---|---|
| #1 | benzyltrimethylammonium hydroxide (4.37) | — | (96) |
| #2 | benzyltrimethylammonium hydroxide (4.37) | Acetylene Alcohol 1 (0.1) | (96) |
| #3 | benzyltriethylammonium hydroxide (5.47) | — | (95) |
| #4 | benzyltributylammonium hydroxide (7.66) | — | (93) |
| #5 | benzyltriethylammonium hydroxide (4.20) | — | (96) |
| #6 | benzyltriethylammonium hydroxide (3.36) | — | (97) |
| #7 | benzyltributylammonium hydroxide (8.33) | — | (92) |

Preparation of Resist Composition

A positive resist composition in solution form was prepared by dissolving a resist polymer synthesized by the standard radical polymerization process (shown below) in a solvent in accordance with the formulation of Table 2 and filtering through a filter with a pore size of 0.2 μm.

EUV Lithography Patterning Test

On a silicon substrate having a diameter of 4 inches, a silicon-containing SOG film of SHB-A940 (Shin-Etsu Chemical Co., Ltd.) was formed to a thickness of 35 nm. The positive resist composition was coated on the SOG film and prebaked on a hot plate at 110° C. for 60 seconds to form a resist film of 35 nm thick. The resist film was exposed to EUV through a pseudo phase-shift-mask (PSM) in an exposure tool (NA 0.3), baked (PEB) at the temperature shown in Table 3, developed in the developer shown in Table 3 for 20 seconds, rinsed with pure water or Extreme 10 (AZ Electronic Materials), and spin dried, forming a resist pattern. Sensitivity is the dose at which a 20-nm line-and-space pattern was formed. Maximum resolution is the minimum size which was resolved at that dose. The pattern was measured for edge roughness (LWR) under SEM. The results are shown in Table 3. It is noted that the maximum resolution is determined by pattern collapse, meaning that as the maximum resolution becomes higher, pattern collapse is unlikely to occur.

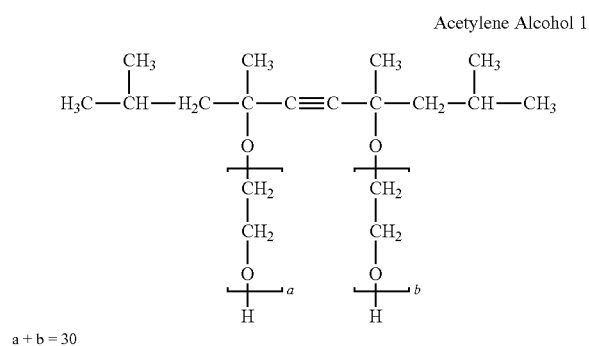

Acetylene Alcohol 1

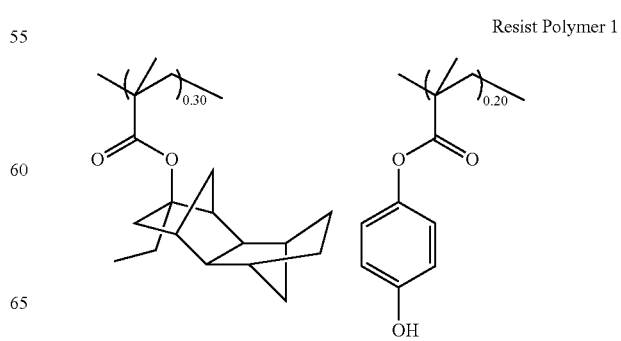

Resist Polymer 1

-continued
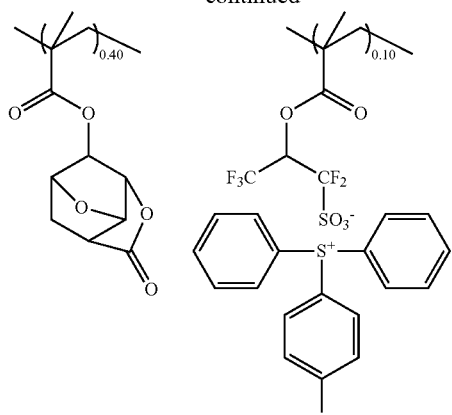
Mw = 6,700
Mw/Mn = 1.58
Resist Polymer 2
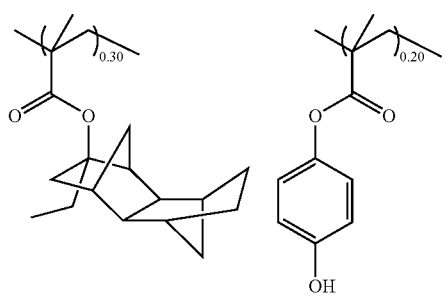
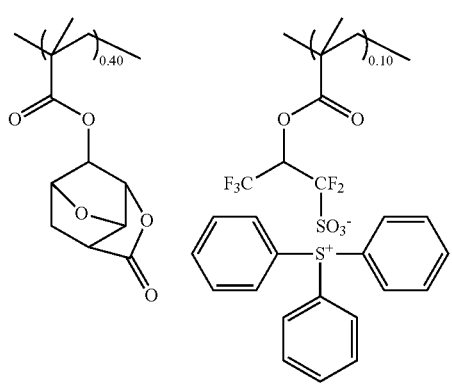
Mw = 6,900
Mw/Mn = 1.68
Resist Polymer 3
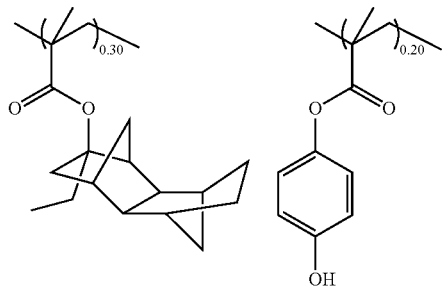
-continued
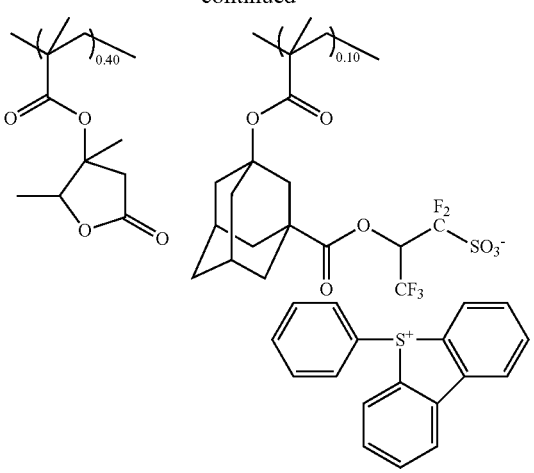
Mw = 6,200
Mw/Mn = 1.81
Resist Polymer 4
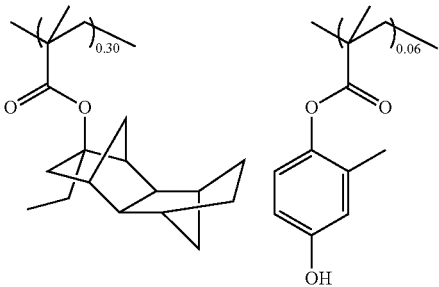
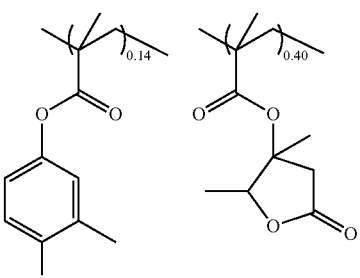
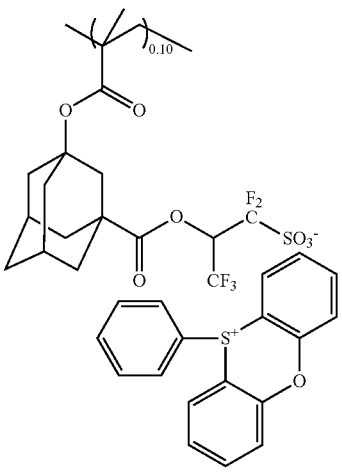
Mw = 7,200
Mw/Mn = 1.51

Resist Polymer 5

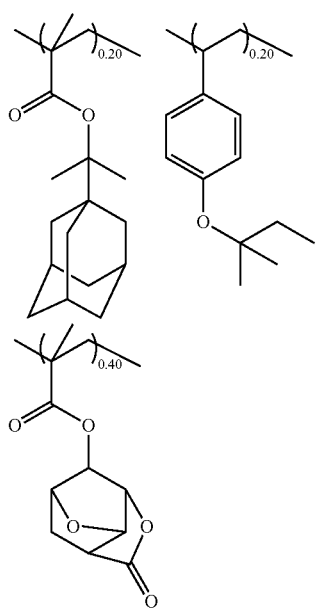

Mw = 5,200
Mw/Mn = 1.61

Quencher 1

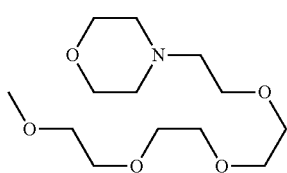

Quencher 2

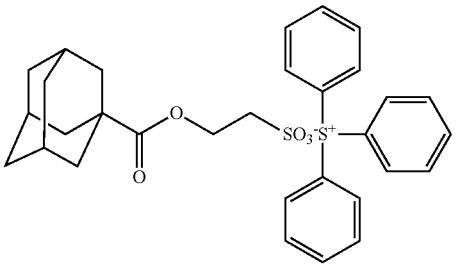

PAG 1

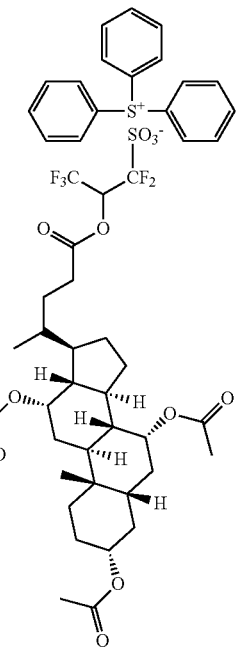

TABLE 2

| Resist material | Polymer (pbw) | PAG (pbw) | Quencher (pbw) | Surfactant (pbw) | Solvent (pbw) |
|---|---|---|---|---|---|
| 1 | Resist Polymer 1 (100) | — | Quencher 1 (1.123) | FC-4430 (0.001) | PGMEA(2,000) PGME(1,000) cyclohexanone(3,000) |
| 2 | Resist Polymer 2 (100) | — | Quencher 1 (1.123) | FC-4430 (0.001) | PGMEA(2,000) PGME(1,000) cyclohexanone(3,000) |
| 3 | Resist Polymer 3 (100) | — | Quencher 1 (1.123) | FC-4430 (0.001) | PGMEA(2,000) PGME(1,000) cyclohexanone(3,000) |
| 4 | Resist Polymer 4 (100) | — | Quencher 1 (1.123) | FC-4430 (0.001) | PGMEA(2,000) PGME(1,000) cyclohexanone(3,000) |
| 5 | Resist Polymer 5 (100) | PAG1 (25) | Quencher 2 (5.00) | FC-4430 (0.001) | PGMEA(4,000) cyclohexanone(2,000) |

PGMEA: propylene glycol monomethyl ether acetate
PGME: propylene glycol monomethyl ether
FC-4430: fluorochemical surfactant by 3M-Sumitomo Co., Ltd.

TABLE 3

| | Resist | PEB temp. (° C.) | Developer | Rinse liquid | Sensitivity (mJ/cm²) | Maximum resolution (nm) | LWR (nm) |
|---|---|---|---|---|---|---|---|
| Example 1 | Resist material 1 | 90 | Developer #1 | pure water | 14 | 18 | 4.2 |
| 2 | Resist material 2 | 85 | Developer #1 | Extreme 10 | 15 | 16 | 4.3 |
| 3 | Resist material 3 | 85 | Developer #1 | Extreme 10 | 15 | 16 | 4.3 |
| 4 | Resist material 4 | 85 | Developer #1 | Extreme 10 | 16 | 16 | 4.3 |
| 5 | Resist material 5 | 85 | Developer #1 | Extreme 10 | 17 | 15 | 5.1 |
| 6 | Resist material 4 | 85 | Developer #2 | Extreme 10 | 18 | 16 | 4.5 |
| 7 | Resist material 4 | 85 | Developer #3 | Extreme 10 | 18 | 16 | 4.4 |
| 8 | Resist material 4 | 85 | Developer #4 | Extreme 10 | 18 | 16 | 4.0 |
| 9 | Resist material 4 | 85 | Developer #5 | Extreme 10 | 21 | 15 | 3.6 |
| 10 | Resist material 4 | 85 | Developer #6 | Extreme 10 | 25 | 16 | 4.0 |
| 11 | Resist material 4 | 85 | Developer #7 | Extreme 10 | 22 | 18 | 4.5 |
| Comparative Example 1 | Resist material 4 | 85 | 2.38 wt % TMAH aqueous solution | pure water | 20 | 20 | 5.6 |
| 2 | Resist material 4 | 85 | 2.38 wt % TMAH aqueous solution | Extreme 10 | 20 | 19 | 5.2 |
| 3 | Resist material 4 | 85 | 6.77 wt % TBAH aqueous solution | Extreme 10 | 21 | 18 | 5.9 |

TMAH: tetramethylammonium hydroxide
TBAH: tetrabutylammonium hydroxide

Japanese Patent Application No. 2013-081848 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A developer for photosensitive resist materials comprising an aqueous solution containing 0.1 to 20% by weight of a substituted or unsubstituted benzyltrialkylammonium hydroxide and 0.0001 to 5% by weight of an acetylene alcohol having the general formula (AA-1):

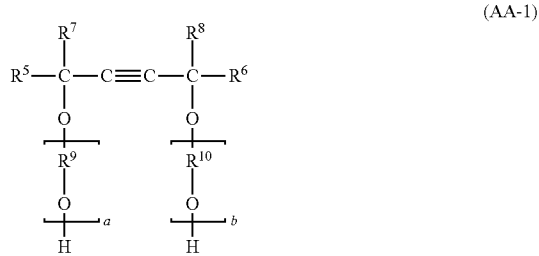

(AA-1)

wherein $R^5$ to $R^8$ are each independently $C_1$-$C_{20}$ alkyl, $R^9$ and $R^{10}$ are each independently $C_1$-$C_{10}$ alkylene, a and b are such integers that the sum a+b is 0 to 60.

2. The developer of claim 1 wherein the benzyltrialkylammonium hydroxide has the general formula (1):

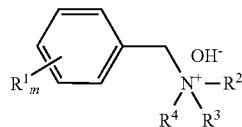

(1)

wherein $R^1$ is hydrogen, hydroxyl, a straight, branched or cyclic $C_1$-$C_6$ alkyl, alkoxy, acyl, acyloxy or alkoxycarbonyl group, a $C_2$-$C_8$ alkenyl or alkynyl group, phenyl or halogen, $R^2$ to $R^4$ are each independently a straight or branched $C_1$-$C_6$ alkyl group, and m is an integer of 1 to 5.

3. The developer of claim 1 wherein the benzyltrialkylammonium hydroxide is benzyltrimethylammonium hydroxide, benzyltriethylammonium hydroxide, benzyltripropylammonium hydroxide, or benzyltributylammonium hydroxide.

4. A pattern forming process comprising the steps of providing a chemically amplified positive resist composition adapted to increase an alkali dissolution rate under the action of acid, and developing the resist composition in an aqueous solution containing a substituted or unsubstituted benzyltrialkylammonium hydroxide according to claim 1.

5. The pattern forming process of claim 4 wherein the chemically amplified positive resist composition comprises a polymer comprising recurring units having an acid labile group and recurring units having a hydroxyl and/or lactone ring adhesive group as a base resin.

6. The pattern forming process of claim 5 wherein the polymer has a weight average molecular weight of 1,000 to 500,000, and the recurring units having an acid labile group are recurring units of at least one type selected from recurring units (a1) and (a2) having a carboxyl and/or phenolic hydroxyl group substituted with an acid labile group, as represented by the general formula (2):

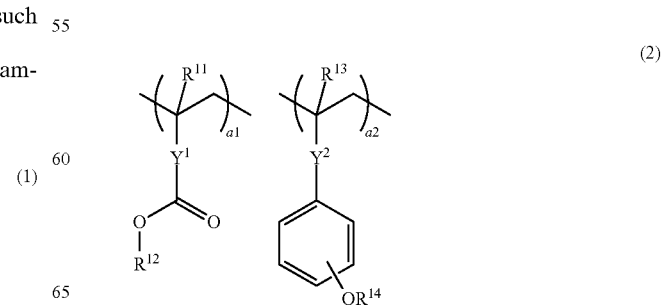

(2)

wherein $R^{11}$ and $R^{13}$ are each independently hydrogen or methyl, $R^{12}$ and $R^{14}$ each are an acid labile group, $Y^1$ is a single bond, a divalent $C_1$-$C_{12}$ linking group having at least one of ester, lactone ring, phenylene and naphthylene, a phenylene group or a naphthylene group, $Y^2$ is a single bond, ester group or amide group, subscripts a1 and a2 are numbers in the range: $0 \leq a1 \leq 0.9$, $0 \leq a2 \leq 0.9$, and $0 < a1+a2 < 1.0$.

7. The pattern forming process of claim 6 wherein the polymer further comprises recurring units of at least one type selected from sulfonium salt units (b1) to (b3), as represented by the general formula (3):

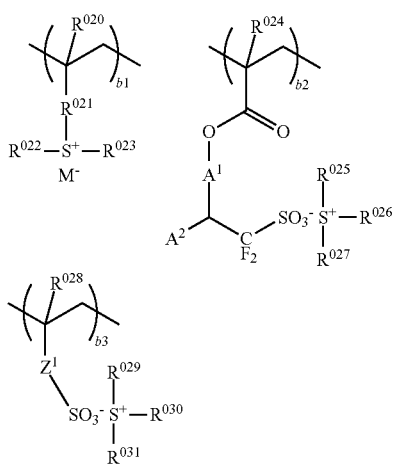
(3)

wherein $R^{020}$, $R^{024}$, and $R^{028}$ each are hydrogen or methyl, $R^{021}$ is a single bond, phenylene, —O—$R^{033}$—, or —C(=O)—Y—$R^{033}$—, Y is oxygen or NH, $R^{033}$ is a straight, branched or cyclic $C_1$-$C_6$ alkylene group, alkenylene group or phenylene group, which may contain a carbonyl (—CO—), ester (—COO—), ether (—O—), or hydroxyl moiety, $R^{022}$, $R^{023}$, $R^{025}$, $R^{026}$, $R^{027}$, $R^{029}$, $R^{030}$, and $R^{031}$ are each independently a straight, branched or cyclic $C_1$-$C_{12}$ alkyl group which may contain a carbonyl, ester or ether moiety, a $C_6$-$C_{12}$ aryl group, a $C_7$-$C_{20}$ aralkyl group, or a thiophenyl group, $A^1$ is a single bond, -$A^0$-C(=O)—O—, -$A^0$-O— or -$A^0$-O—C(=O)—, $A^0$ is a straight, branched or cyclic $C_1$-$C_{12}$ alkylene group which may contain a carbonyl, ester or ether moiety, $A^2$ is hydrogen, $CF_3$ or carbonyl, $Z^1$ is a single bond, methylene, ethylene, phenylene, fluorinated phenylene, —O—$R^{032}$—, or —C(=O)—$Z^2$—$R^{032}$—, $Z^2$ is oxygen or NH, $R^{032}$ is a straight, branched or cyclic $C_1$-$C_6$ alkylene, phenylene, fluorinated phenylene, trifluoromethyl-substituted phenylene or alkenylene group, which may contain a carbonyl, ester, ether or hydroxyl moiety, $M^-$ is a non-nucleophilic counter ion, subscripts b1, b2 and b3 are numbers in the range: $0 \leq b1 \leq 0.3$, $0 \leq b2 \leq 0.3$, $0 \leq b3 \leq 0.3$, and $0 < b1+b2+b3 \leq 0.3$.

8. The pattern forming process of claim 4, wherein the resist composition further comprises at least one of an organic solvent, basic compound, dissolution regulator, and surfactant.

9. The pattern forming process of claim 4, comprising the steps of applying the resist composition onto a substrate to form a coating, baking, exposing the coating to high-energy radiation, and developing the exposed coating in the developer of.

10. The pattern forming process of claim 9 wherein the high-energy radiation is KrF excimer laser of wavelength 248 nm, ArF excimer laser of wavelength 193 nm, electron beam or soft x-ray of wavelength 3 to 15 nm.

* * * * *